(12) United States Patent
Tanitsu et al.

(10) Patent No.: US 10,691,026 B2
(45) Date of Patent: Jun. 23, 2020

(54) ILLUMINATION OPTICAL SYSTEM, EXPOSURE APPARATUS, DEVICE PRODUCTION METHOD, AND LIGHT POLARIZATION UNIT

(71) Applicant: NIKON CORPORATION, Tokyo (JP)

(72) Inventors: Osamu Tanitsu, Kumagaya (JP); Hirohisa Tanaka, Kumagaya (JP); Kinya Kato, Tokyo (JP); Takashi Mori, Fujisawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/238,121

(22) Filed: Jan. 2, 2019

(65) Prior Publication Data

US 2019/0137887 A1 May 9, 2019

Related U.S. Application Data

(62) Division of application No. 15/424,085, filed on Feb. 3, 2017, now Pat. No. 10,175,583, which is a division
(Continued)

(51) Int. Cl.
*G03B 27/72* (2006.01)
*G03F 7/20* (2006.01)
(Continued)

(52) U.S. Cl.
CPC ..... *G03F 7/70191* (2013.01); *G02B 26/0816* (2013.01); *G02B 26/0833* (2013.01);
(Continued)

(58) Field of Classification Search
CPC ............... G03F 7/0007; G03F 7/70116; G03F 7/70191; G03F 7/70566; G02B 26/0816; G02B 26/0833; G02B 27/286
See application file for complete search history.

(56) References Cited

U.S. PATENT DOCUMENTS 5,312,513 A 5/1994 Florence et al.
5,867,302 A 2/1999 Fleming
(Continued)

FOREIGN PATENT DOCUMENTS

EP 0 779 530 A1 6/1997
JP H06-124873 A 5/1994
(Continued)

OTHER PUBLICATIONS

Bass et al., Handbook of Optics, vol. II, Devices, Measurements, and Properties, 1995, pp. 22.8-22.22.
(Continued)

*Primary Examiner* — Peter B Kim
(74) *Attorney, Agent, or Firm* — Oliff PLC

(57) ABSTRACT

An illumination optical system which illuminates an illumination objective surface with a light from a light source. The illumination optical system includes a spatial light modulator which includes a plurality of optical elements arranged within a predetermined plane and controlled individually, and which forms a light intensity distribution in an illumination pupil of the illumination optical system; and a polarization unit which is arranged in a position optically conjugate with the predetermined plane, and which polarizes an incident light beam having a first and second partial light beams, coming into the polarization unit such that the first and second partial light beams have polarization states different from each other, and emits the polarized incident light beam as an outgoing light beam, wherein the polarization unit changes, in a cross section of the outgoing light beam, a ratio between a cross sectional areas of the first and second partial light beams.

21 Claims, 37 Drawing Sheets

Related U.S. Application Data of application No. 14/124,034, filed as application No. PCT/JP2011/077200 on Nov. 25, 2011, now Pat. No. 9,599,905.

(60) Provisional application No. 61/494,102, filed on Jun. 7, 2011.

(51) Int. Cl.
*G02B 26/08* (2006.01)
*G02B 27/28* (2006.01)
*G03F 7/00* (2006.01)

(52) U.S. Cl.
CPC ........ *G02B 27/286* (2013.01); *G03F 7/70116* (2013.01); *G03F 7/70566* (2013.01); *G03F 7/0007* (2013.01)

(56) References Cited

U.S. PATENT DOCUMENTS

| | | | |
|---|---|---|---|
| 6,118,516 | A | 9/2000 | Irie et al. |
| 6,480,320 | B2 | 11/2002 | Nasiri |
| 6,600,591 | B2 | 7/2003 | Anderson et al. |
| 6,611,316 | B2 | 8/2003 | Sewell |
| 6,733,144 | B2 | 5/2004 | Kwon |
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,913,373 | B2 | 7/2005 | Tanaka et al. |
| 7,023,610 | B2 | 4/2006 | Ohtsuki et al. |
| 7,095,546 | B2 | 8/2006 | Mala et al. |
| 7,295,726 | B1 | 11/2007 | Milanovic et al. |
| 7,423,731 | B2 | 9/2008 | Tanitsu et al. |
| 7,424,330 | B2 | 9/2008 | Duerr et al. |
| 7,567,375 | B2 | 7/2009 | Enoksson et al. |
| 10,175,583 | B2 * | 1/2019 | Tanitsu ............... G03F 7/70116 |
| 2003/0197838 | A1 | 10/2003 | Kohno |
| 2005/0095749 | A1 | 5/2005 | Krellmann et al. |
| 2007/0019179 | A1 * | 1/2007 | Fiolka .................... G03B 27/72 355/71 |
| 2007/0296936 | A1 | 12/2007 | Kato et al. |
| 2008/0030707 | A1 | 2/2008 | Tanaka et al. |
| 2008/0309901 | A1 | 12/2008 | Rene Soemers et al. |
| 2009/0002673 | A1 | 1/2009 | Shinoda |
| 2010/0020302 | A1 | 1/2010 | Freimann |
| 2013/0077077 | A1 | 3/2013 | Saenger et al. |
| 2017/0090297 | A1 | 3/2017 | Miyake et al. |

FOREIGN PATENT DOCUMENTS

| | | |
|---|---|---|
| JP | H10-303114 A | 11/1998 |
| JP | 3246615 B2 | 1/2002 |
| JP | 2006-113437 A | 4/2006 |
| JP | 2009-111223 A | 5/2009 |
| JP | 2010-087389 A | 4/2010 |
| WO | 99/49504 A1 | 9/1999 |
| WO | 01/35168 A1 | 5/2001 |
| WO | 2010/037476 A2 | 4/2010 |
| WO | 2010/040506 A1 | 4/2010 |

OTHER PUBLICATIONS

Feb. 21, 2012 Search Report issued in International Patent Application No. PCT/JP2011/077200.
Dec. 10, 2013 International Preliminary Report on Patentability issued in International Patent Application No. PCT/JP2011/077200.
Jul. 28, 2015 Office Action issued in Japanese Application No. 2013-519343.
Sep. 6, 2016 Office Action issued in Japanese Application No. 2016-016864.
Jan. 4, 2016 Restriction/Election of Species Requirement issued in U.S. Appl. No. 14/124,034.
May 19, 2016 Office Action issued in U.S. Appl. No. 14/124,034.
Nov. 4, 2016 Notice of Allowance issued in U.S. Appl. No. 14/124,034.
Jul. 3, 2017 Office Action issued in Japanese Application No. 2016-192649.
Jul. 3, 2017 Office Action issued in Japanese Application No. 2016-192650.
Apr. 26, 2018 Notice of Allowance issued in U.S. Appl. No. 15/424,085.
Sep. 12, 2018 Notice of Allowance issued in U.S. Appl. No. 15/424,085.

* cited by examiner

FIG. 13A
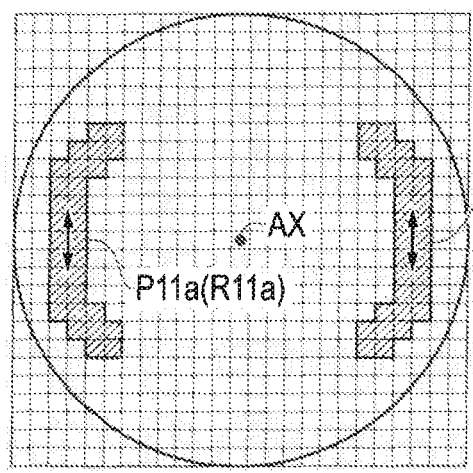
FIG. 13B
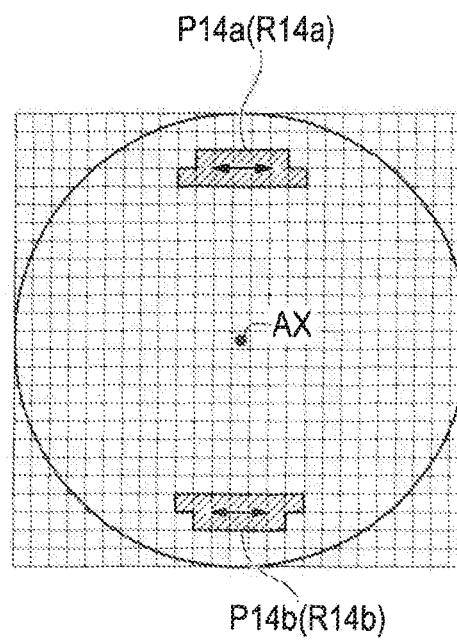
FIG. 13C
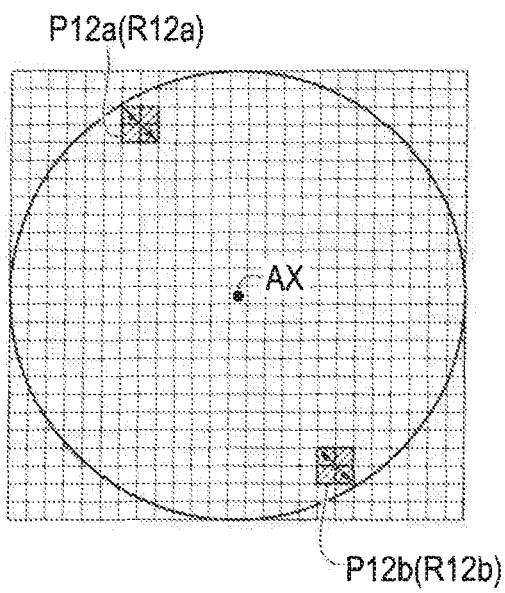
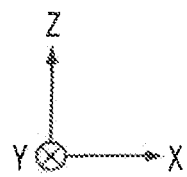
FIG. 13D
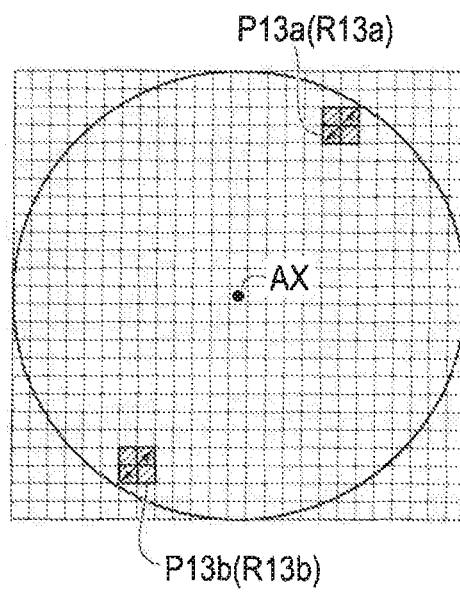

Fig. 22
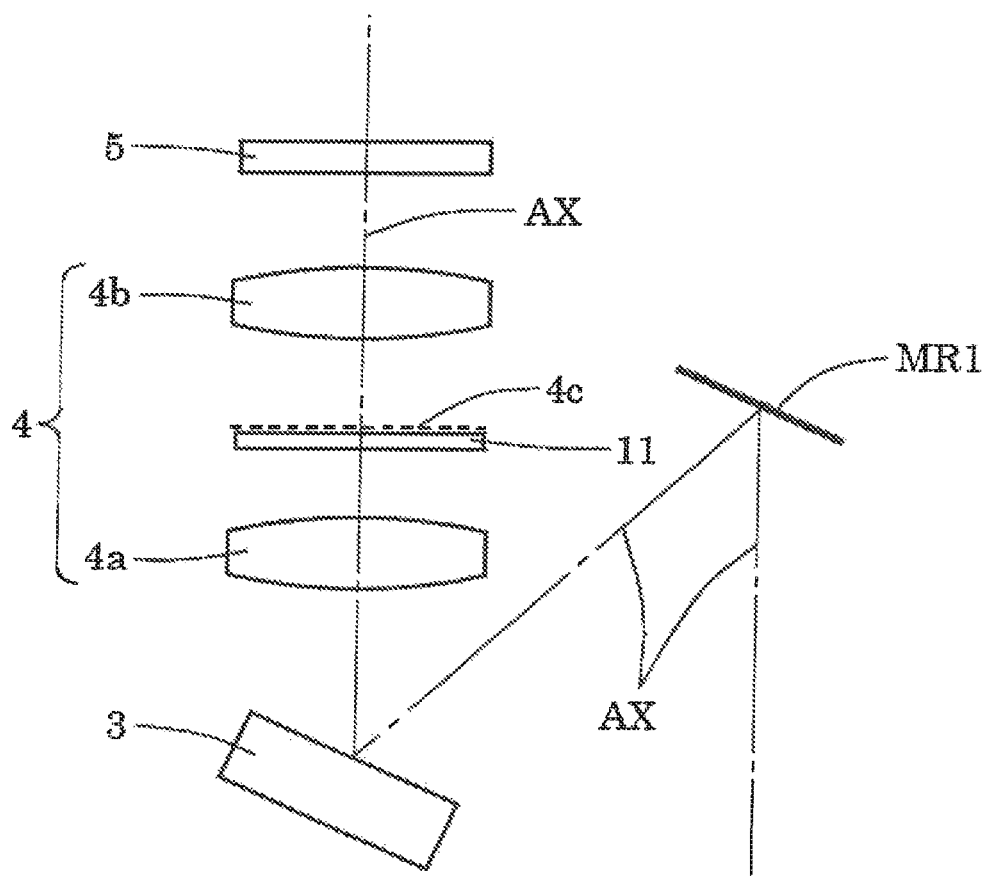
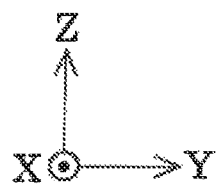

ILLUMINATION OPTICAL SYSTEM, EXPOSURE APPARATUS, DEVICE PRODUCTION METHOD, AND LIGHT POLARIZATION UNIT

This is a divisional of U.S. patent application Ser. No. 15/424,085 filed Feb. 3, 2017 (now U.S. Pat. No. 10,175, 583), which in turn is a divisional of U.S. patent application Ser. No. 14/124,034 filed Apr. 22, 2014 (now U.S. Pat. No. 9,599,905), which in turn is a U.S. national stage of International Application No. PCT/JP2011/077200 filed Nov. 25, 2011 claiming the conventional priority of U.S. Provisional Patent Application No. 61/494,102, filed on Jun. 7, 2011. The disclosure of each of the prior applications is incorporated herein by reference in its entirety.

TECHNICAL FIELD

The present teaching relates to an illumination optical system, an exposure apparatus, a device production method, and a polarization unit.

BACKGROUND ART

In a typical exposure apparatus of this type, the light, which is radiated from a light source, forms, via a fly's eye lens as an optical integrator, a secondary light source as a substantial surface light source composed of a large number of light sources (in general, a predetermined light intensity distribution on an illumination pupil). In the following description, the light intensity distribution, which is provided on the illumination pupil, is referred to as "pupil intensity distribution". Further, the illumination pupil is defined as the position which makes the illumination objective surface or illumination objective plane (mask or wafer in the case of the exposure apparatus) the Fourier transform plane of the illumination pupil by the aid of the action of the optical system disposed between the illumination pupil and the illumination objective surface (plane).

The light, which comes from the secondary light source, is collected by a condenser optical system, and then illuminates a mask, on which a predetermined pattern is formed, in a superimposed (overlaid) manner. The light, which is transmitted through the mask, forms an image on a wafer via a projection optical system, and the mask pattern is projected and exposed (transferred) onto the wafer. The pattern, which is formed on the mask, is fine and minute. In order to correctly transfer the fine pattern onto the wafer, it is indispensable to obtain a uniform illuminance distribution on the wafer.

Conventionally, it has been suggested a technique in which an annular (circular zonal) or multi-pole-shaped secondary light source (pupil intensity distribution) is formed on an illumination pupil defined on a back focal plane of a fly's eye lens or in the vicinity thereof by the action of an aperture diaphragm which is equipped with a wave plate (a wavelength plate) and which is arranged just downstream from the fly's eye lens, and the setting is made such that the light beam (luminous flux), which passes through the secondary light source, is in a linear polarization state in which the circumferential direction is the polarization direction (hereinafter abbreviated and referred to as "circumferential direction (azimuthal direction) polarization state") (see, for example, Japanese Patent Publication No. 3246615).

SUMMARY

In order to realize the illumination condition suitable to faithfully transfer fine patterns having various forms, it is desired to improve the degree of freedom in the change of the shape (broad concept including the size) of the pupil intensity distribution and the change of the polarization state. However, in the case of the conventional technique described in Patent Document 1, it has been impossible to change the shape of the pupil intensity distribution and the polarization state except if the aperture diaphragm equipped with the wave plate is exchanged.

The present teaching has been made taking the foregoing problem into consideration, an object of which is to provide an illumination optical system having a high degree of freedom in the change of the polarization state. Another object of the present teaching is to provide an exposure apparatus and a method for producing a device which make it possible to correctly transfer a fine pattern to a photosensitive substrate under an adequate illumination condition by using the illumination optical system having the high degree of freedom in the change of the polarization state.

A first aspect of the present teaching provides an illumination optical system which illuminates an illumination objective surface with a light from a light source, the illumination optical system including a spatial light modulator which includes a plurality of optical elements arranged within a predetermined plane and controlled individually, and which forms a light intensity distribution in a variable manner in an illumination pupil of the illumination optical system; and a polarization unit which is arranged in a conjugate position optically conjugate with the predetermined plane in an optical path of the illumination optical system, and which polarizes an incident light beam having a first partial light beam and a second partial light beam different from the first partial light beam, coming into the polarization unit such that the first partial light beam and the second partial light beam have polarization states different from each other, and emits the polarized incident light beam as an outgoing light beam, wherein the polarization unit changes, in a cross section of the outgoing light beam, a ratio between a cross sectional area of the first partial light beam and a cross sectional area of the second partial light beam.

A second aspect of the present teaching provides an exposure apparatus including the illumination optical system of the first aspect for illuminating a predetermined pattern, the exposure apparatus exposing a photosensitive substrate with the predetermined pattern.

A third aspect of the present teaching provides a device production method including the steps of: exposing the photosensitive substrate with the predetermined pattern by using the exposure apparatus of the second aspect; developing the photosensitive substrate to which the predetermined pattern is transferred and forming a mask layer having a shape corresponding to the predetermined pattern on a surface of the photosensitive substrate; and processing the surface of the photosensitive substrate via the mask layer.

A fourth aspect of the present teaching provides a polarization unit which changes a polarization state of a part of an incident light beam having a rectangular cross section and then emits the incident light beam as an outgoing light beam, the polarization unit including: a first optical element which is arranged on a first plane along the cross section of the incident light beam and which changes a polarization state of a second partial light beam in the incident light beam, without exerting any effect on a first partial light beam in the incident light beam; and a second optical element which is arranged on a second plane along the cross section of the incident light beam and which changes a polarization state of a third partial light beam which is at least a part of the second partial light beam passed through the first optical element, and a polarization state of a fourth partial light beam which is at least a part of the first partial light beam which coming into the second optical element without passing through the first optical element, wherein the first optical element has a first edge extending in a third direction obliquely intersecting one pair of sides of the rectangular cross section of the incident light beam, and a second edge extending in a fourth direction different from the third direction.

BRIEF DESCRIPTION OF THE DRAWINGS

FIGS. 13A to 13D are second diagrams for explaining the example of operation of the control system;

FIG. 22 shows an example of a configuration in which it is provided a phase difference imparting member on an optical Fourier transformation plane of the arrangement plane of the spatial light modulator;

FIG. 37 is a flowchart showing steps of producing a liquid crystal device such as a liquid crystal display element or the like.

DESCRIPTION OF THE EMBODIMENTS

Figure 1:
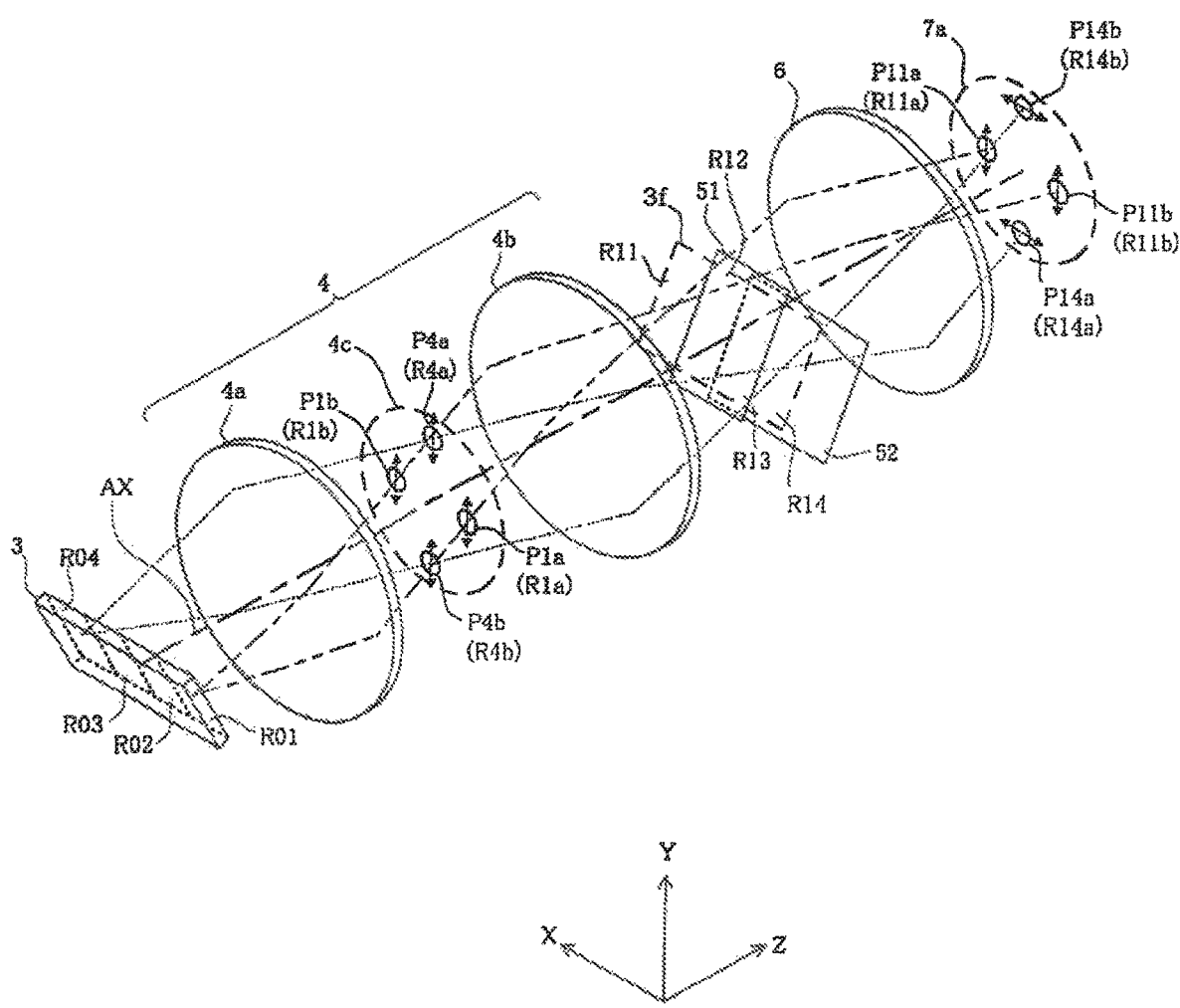
FIG. 1 schematically shows a configuration of a main part of an illumination optical system according to an embodiment of the present teaching.

Hereinbelow, based on the accompanying drawings, an embodiment of the present teaching will be explained. FIG. 1 is a diagram schematically showing a configuration of a main part of an illumination optical system according to the embodiment. In FIG. 1, an X-Y-Z coordinate system is defined such that the Z-axis represents a direction along an optical axis AX of the illumination optical system.

In FIG. 1, light from an unshown light source reaches a spatial light modulator 3 including a plurality of mirror elements (not shown) which are arranged within a predetermined plane and controlled individually. The light reflected by the plurality of mirror elements of the spatial light modulator 3 comes into a pupil plane 4c of a relay optical system 4 via a front-side lens group 4a of the relay optical system 4. Further, a detailed explanation of the configuration and function of the spatial light modulator 3 will be given later with reference to FIGS. 3 and 4. Assuming that, in FIG. 1, an effective reflection region (area) on an arrangement plane (a predetermined plane) of the spatial light modulator 3 is divided into four partial regions R01, R02, R03, and R04, only the light from the partial regions R01 and R04 will be explained hereinbelow in order to simplify the explanation.

The light from the plurality of mirror elements positioned in the partial region R01 of the spatial light modulator 3 is guided to a pair of pupil regions R1a and R1b on the pupil plane 4c via the front-side lens group 4a, to respectively form light intensity distributions P1a and P1b within the pupil regions R1a and R1b. Further, the light from the plurality of mirror elements positioned in the partial region R04 of the spatial light modulator 3 is guided to a pair of pupil regions R4a and R4b on the pupil plane 4c via the front-side lens group 4a, to respectively form light intensity distributions P4a and P4b within the pupil regions R4a and R4b.

The light from the pupil plane 4c reaches a region 3f within a plane optically conjugate with the arrangement plane of the spatial light modulator 3 with respect to the relay optical system 4, via a rear-side lens group 4b of the relay optical system 4. On this conjugate plane, there are arranged an optical rotation member 51 to rotate the polarization direction of a linearly polarized incident light by 45 degrees, and an optical rotation member 52 to rotate the polarization direction of a linearly polarized incident light by 90 degrees. In FIG. 1, the region 3f is divided into four partial regions R11 to R14 optically conjugate with the partial regions R01 to R04 of the spatial light modulator 3 respectively, and the optical rotation member 51 is positioned in the partial regions R12 and R13 while the optical rotation member 52 is positioned in the partial regions R13 and R14.

Here, among the light from the pupil plane 4c, the light from the pair of pupil regions R4a and R4b reaches the partial region R14 within the region 3f, and its polarization direction is rotated by 90 degrees by passing through the optical rotation member 52. On this occasion, because the light from the spatial light modulator 3 is a Y-direction linearly polarized light having the polarization direction in the Y direction, the light from the pair of pupil regions R4a and R4b passed the optical rotation member 52 becomes a X-direction linearly polarized light having the polarization direction in the X direction. Then, the lights from the pair of pupil regions R4a and R4b each of which is the linearly polarized light of X direction, are guided, via a relay optical system 6, to a pair of pupil regions R14a and R14b on a pupil plane 7a optically conjugate with the pupil plane 4c, to respectively form light intensity distributions P14a and P14b within the pupil regions R14a and R14b.

Further, among the lights from the pupil plane 4c, the lights from the pair of pupil regions R1a and R1b reaches the partial region R11 within the region 3f. Because the optical rotation members 51 and 52 are not positioned in this partial region, and the light from the spatial light modulator 3 is a Y-direction linearly polarized light having a polarization direction in the Y direction, the lights from the pair of pupil regions R1a and R1b having passed the partial region R11 remain the Y-direction linearly polarized light. Then, the light from the pair of pupil regions R1a and R1b having passed the partial region R11 is guided, via the relay optical system 6, to a pair of pupil regions R11a and R11b on the pupil plane 7a, to respectively form light intensity distributions P11a and P11b of the Y-direction linearly polarized light within the pupil regions R11a and R11b.

Figure 2:
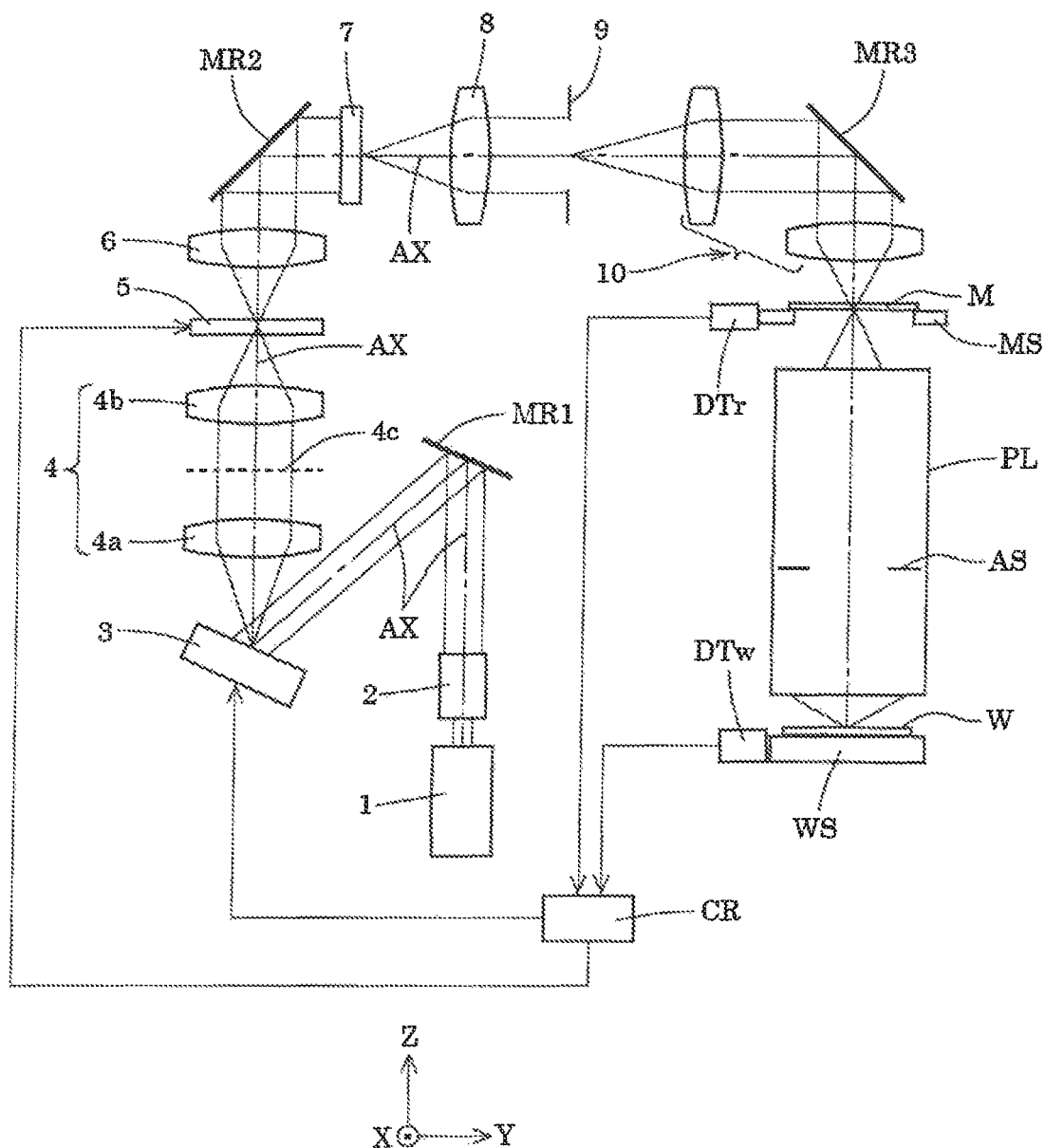
FIG. 2 schematically shows a configuration of an exposure apparatus according to the embodiment.

The light from the light intensity distributions P11a, P11b, P14a and P14b of the pupil plane 7a is condensed via an unshown condenser optical system to illuminate an illumination objective plane. Here, if the optical rotation members 51 and 52 on the region 3f within the plane optically conjugate with the arrangement plane of the spatial light modulator 3 is moved on this region 3f, then it is possible to change the polarization state of the light intensity distributions of the pupil plane 7a into any polarization state. Referring to FIG. 2, this aspect will be explained below in detail.

FIG. 2 is a diagram schematically showing a configuration of an exposure apparatus according to the embodiment. In FIG. 2, the members having identical or similar functions to those of the members in the embodiment shown in FIG. 1 are denoted by the reference numerals same as those of the members in FIG. 1. The Z-axis is defined along the normal direction of a transfer surface (exposure surface) of a wafer W which is a photosensitive substrate, the Y-axis is defined as in a direction parallel to the page of FIG. 2 within the transfer surface of the wafer W, and the X-axis is defined as in a direction perpendicular to the page of FIG. 2 within the transfer surface of the wafer W, respectively.

Referring to FIG. 2, in the exposure apparatus of this embodiment, exposure light (illumination light) is supplied from a light source 1. As the light source 1, it is possible to use, for example, an ArF excimer laser light source supplying light of a wavelength of 193 nm, a KrF excimer laser light source supplying light of a wavelength of 248 nm, etc. The exposure light (illumination light) emitted from the light source 1 is in a polarization state in which a linearly polarized light is the main component. Here, the polarization state in which a linearly polarized light is the main component can be defined as a condition in which the intensity of the linearly polarized light is 80% or more of the entire intensity of the exposure light (illumination light). The light emitted from the light source 1 in the +Z direction enters the spatial light modulator 3 after passing through a beam sending unit 2, and being reflected by an optical path bending mirror MR1. The light emitted in the +Z direction via the spatial light modulator 3 enters the relay optical system 4.

The beam sending unit 2 has a function of guiding the incident light beam (light flux) from the light source 1 to the spatial light modulator 3 while converting the incident light beam into a light beam having a cross section of a suitable size and shape and, meanwhile actively correcting the positional variation and angular variation of the light beam to enter the spatial light modulator 3. Further, the beam sending unit 2 may also be configured not to convert the incident light beam from the light source 1 into a light beam having a cross section of a suitable size and shape. As will be described later, the spatial light modulator 3 has a plurality of mirror elements arranged within a predetermined plane and controlled individually, and a drive unit individually controlling and driving the attitudes of the plurality of mirror elements based on a control signal from a control system CR. The configuration and function or effect of the spatial light modulator 3 will be described later.

The light emitted from the spatial light modulator 3 comes into the pupil plane 4c of the relay optical system 4 via the front-side lens group 4a of the relay optical system 4. The front-side lens group 4a is set such that its front focal position is substantially consistent with the position of the arrangement plane of the spatial light modulator 3 for the plurality of mirror elements (to be referred to as "the arrangement plane of the spatial light modulator", below), while its back focal position is substantially consistent with the position of the pupil plane 4c. As will be described later, the light having passed the spatial light modulator 3 variably forms, on the pupil plane 4c, a light intensity distribution according to the attitudes of the plurality of mirror elements.

The light which formed the light intensity distribution on the pupil plane 4c enters a polarization unit 5 via the rear-side lens group 4b of the relay optical system 4. The polarization unit 5 is arranged in a position optically conjugate with the arrangement plane of the spatial light modulator 3, to change the polarization state of part of the incident light beam and emit the light beam. The configuration and function or effect of the polarization unit 5 will be described later.

The light having passed through the polarization unit 5 is reflected in the +Y direction by an optical path bending mirror MR2 after passing through the relay optical system 6, to enter a micro fly's eye lens (or fly's eye lens) 7. The rear-side lens group 4b and the relay optical system 6 set the pupil plane 4c and the incidence plane of the micro fly's eye lens 7 to be optically conjugate with each other. Therefore, on the incidence plane of the micro fly's eye lens 7 arranged at a position optically conjugate with the pupil plane 4c, the light having passed the spatial light modulator 3 forms a light intensity distribution corresponding to the light intensity distribution formed on the pupil plane 4c.

The micro fly's eye lens 7 is the optical element which is composed of, for example, a large number of micro lenses having the positive refractive power arranged densely in the longitudinal and lateral directions. The micro fly's eye lens 7 is constructed by forming a micro lens group by applying the etching treatment to a plane-parallel plate. In the micro fly's eye lens, a large number of micro lenses (micro refracting surfaces) are formed integrally without being isolated from each other, unlike any fly's eye lens composed of mutually isolated lens elements. However, the micro fly's eye lens is the optical integrator of the wavefront division type like the fly's eye lens in that the lens elements are arranged longitudinally and laterally.

The rectangular micro refracting surface, which serves as the unit wavefront dividing surface of the micro fly's eye lens 7, has the rectangular shape which is similar to the shape of the illumination field to be formed on the mask M (consequently the shape of the exposure area to be formed on the wafer W). For example, a cylindrical micro fly's eye lens can be also used as the micro fly's eye lens 7. The construction and the function of the cylindrical micro fly's eye lens is disclosed, for example, in U.S. Pat. No. 6,913,373.

The light beam, which is allowed to come into the micro fly's eye lens 7, is divided two-dimensionally by a large number of micro lenses, and a secondary light source (substantial surface light source composed of a large number of small light sources: pupil intensity distribution), which has approximately the same light intensity distribution as the light intensity distribution formed on the incident surface, is formed on the back focal plane or the illumination pupil defined in the vicinity thereof. The light beam, which comes from the secondary light source formed on the illumination pupil defined just downstream from the micro fly's eye lens 7, illuminates a mask blind 9 in a superimposed manner via a condenser optical system 8.

Thus, an illumination field which has a rectangular shape depending on the focal distance and the shape of the rectangular micro refracting surface of the micro fly's eye lens 7, is formed on the mask blind 9 as the illumination field diaphragm. An illumination aperture diaphragm, which has an aperture (light transmitting portion) having a shape corresponding to the secondary light source, may be arranged on the back focal plane of the micro fly's eye lens 7 or in the vicinity thereof, i.e., at the position approximately optically conjugate with the entrance pupil plane of the projection optical system PL described later on.

The light beam, which passes through the rectangular aperture (light transmitting portion) of the mask blind 9, undergoes the light collecting action of an imaging optical system 10, and the light beam is reflected in the −Z direction by a mirror MR3 arranged in the optical path of the imaging optical system 10. After that, the light beam illuminates the mask M on which a predetermined pattern is formed, in a superimposed manner. That is, the imaging optical system 10 forms, on the mask M, the image of the rectangular aperture of the mask blind 9.

The light beam, which passes through the mask M held on a mask stage MS, forms an image of the mask pattern on the wafer (photosensitive substrate) W held on a wafer stage WS, via the projection optical system PL. In this way, the respective exposure areas of the wafer W are successively exposed with the pattern of the mask M by performing the full field exposure or the scanning exposure while two-dimensionally controlling and driving the wafer stage WS in the plane (XY plane) orthogonal to the optical axis AX of the projection optical system PL, and consequently two-dimensionally controlling and driving the wafer W. If the scanning exposure is carried out, then it is possible to set the Y direction in FIG. 2 as the scanning direction.

The exposure apparatus of this embodiment is provided with a first pupil intensity distribution measuring unit DTr which measures the pupil intensity distribution on the exit pupil plane of the illumination optical system on the basis of the light allowed to pass through the illumination optical system (2 to 10), a second pupil intensity distribution measuring unit DTw which measures the pupil intensity distribution on the pupil plane of the projection optical system PL (exit pupil plane of the projection optical system PL) on the basis of the light allowed to pass through the projection optical system PL, and a control system CR which controls the spatial light modulator 3 and which controls the operation of the exposure apparatus as a whole on the basis of the measurement result of at least one of the first and second pupil intensity distribution measuring units DTr, DTw.

The first pupil intensity distribution measuring unit DTr is provided with an image pickup unit which has a photoelectric conversion surface (plane) arranged, for example, at a position optically conjugate with the exit pupil position of the illumination optical system, and the first pupil intensity distribution measuring unit DTr monitors the pupil intensity distribution in relation to the respective points on the illumination objective surface to be illuminated by the illumination optical system (pupil intensity distribution formed at the exit pupil position of the illumination optical system by the light allowed to come into each of the points). Further, the second pupil intensity distribution measuring unit DTw is provided with an image pickup unit which has a photoelectric conversion surface (plane) arranged, for example, at a position optically conjugate with the pupil position of the projection optical system PL, and the second pupil intensity distribution measuring unit DTw monitors the pupil intensity distribution in relation to the respective points on the image plane of the projection optical system PL (pupil intensity distribution formed at the pupil position of the projection optical system PL by the light allowed to come into each of the points).

Reference can be made, for example, to United States Patent Application Publication No. 2008/0030707 about detailed constructions and functions of the first and second pupil intensity distribution measuring units DTr, DTw. Reference can be also made to the disclosure of United States Patent Application Publication No. 2010/0020302 in relation to the pupil intensity distribution measuring unit.

In this embodiment, the mask M arranged on the illumination objective surface of the illumination optical system (consequently the wafer W) is subjected to the Koehler illumination by using the light source of the secondary light source formed by the micro fly's eye lens 7. Therefore, the position, at which the secondary light source is formed, is optically conjugate with the position of the aperture diaphragm AS of the projection optical system PL. The plane or surface, on which the secondary light source is formed, can be referred to as the illumination pupil plane of the illumination optical system. Further, the image of the plane (surface) on which the secondary light source is formed can be referred to as the exit pupil plane of the illumination optical system. Typically, the illumination objective surface (surface or plane on which the mask M is arranged, or the surface or plane on which the wafer W is arranged when the illumination optical system is regarded as including the projection optical system PL) is the optical Fourier transform plane (surface) with respect to the illumination pupil plane. The pupil intensity distribution is the light intensity distribution (luminance distribution) on the illumination pupil plane of the illumination optical system or the plane (surface) optically conjugate with the illumination pupil plane.

When the number of wavefront division by the micro fly's eye lens 7 is relatively large, the macroscopic (broader basis) light intensity distribution, which is formed on the incident surface of the micro fly's eye lens 7, exhibits the high correlation with respect to the macroscopic (broader basis) light intensity distribution (pupil intensity distribution) of the entire secondary light source. Therefore, the light intensity distribution, which is provided on the incident surface of the micro fly's eye lens 7 or the surface or plane optically conjugate with the incident surface concerned, can be also referred to as the pupil intensity distribution. In the construction shown in FIG. 2, the relay optical systems 4, 6 and the micro fly's eye lens 7 constitute a distribution formation optical system for forming the pupil intensity distribution on the illumination pupil defined just downstream from the micro fly's eye lens 7 on the basis of the light beam allowed to pass through the spatial light modulator 3.

Figure 3:
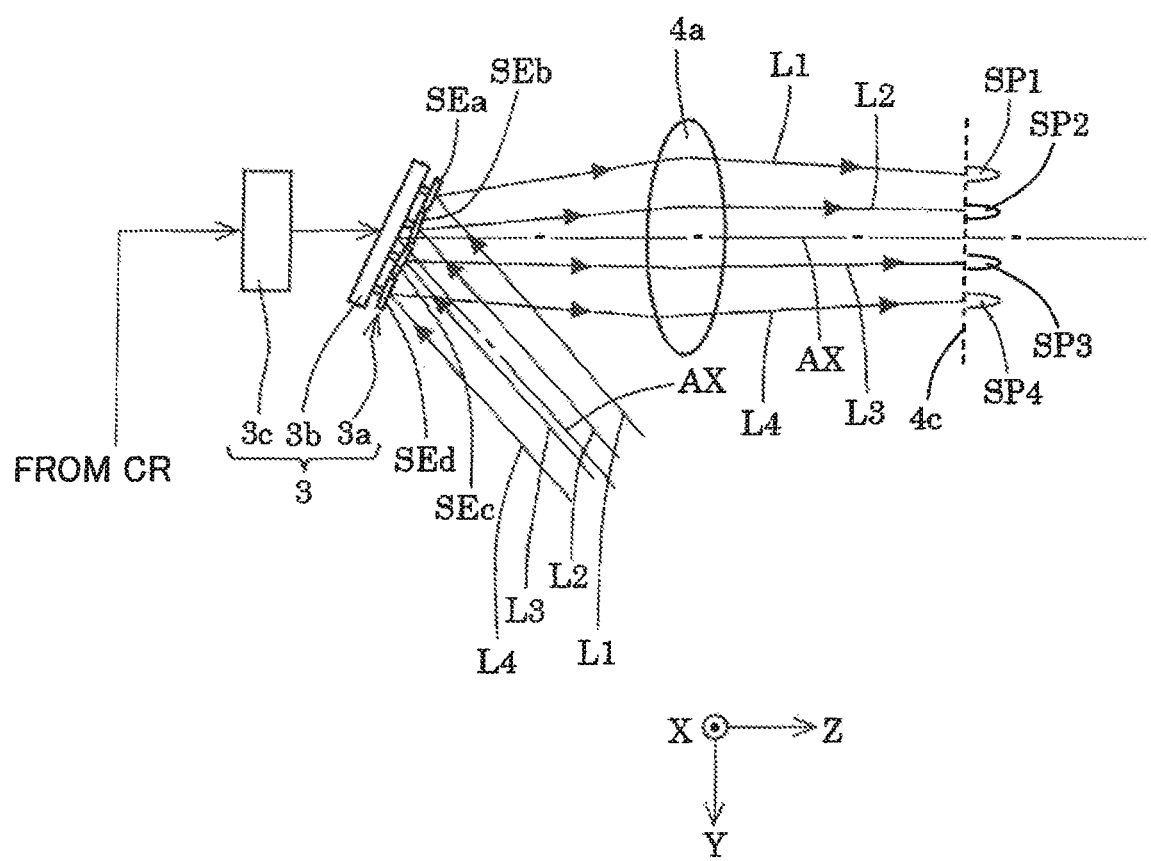
FIG. 3 is a diagram for explaining a configuration and function or effect of a spatial light modulator.

Next, the configuration and function or effect of the spatial light modulator 3 will be explained specifically. As shown in FIG. 3, the spatial light modulator 3 includes a plurality of mirror elements 3a arranged within a predetermined plane, a base 3b holding the plurality of mirror elements 3a, and a drive portion 3c individually controlling and driving the attitudes of the plurality of mirror elements 3a via a cable (not shown) connected to the base 3b. In the spatial light modulator 3, by the function of the drive portion 3c operating based on commands from the control system CR, the attitudes of the plurality of mirror elements 3a change respectively, and each of the plurality of mirror elements 3a is set respectively in a predetermined direction.

Figure 4:
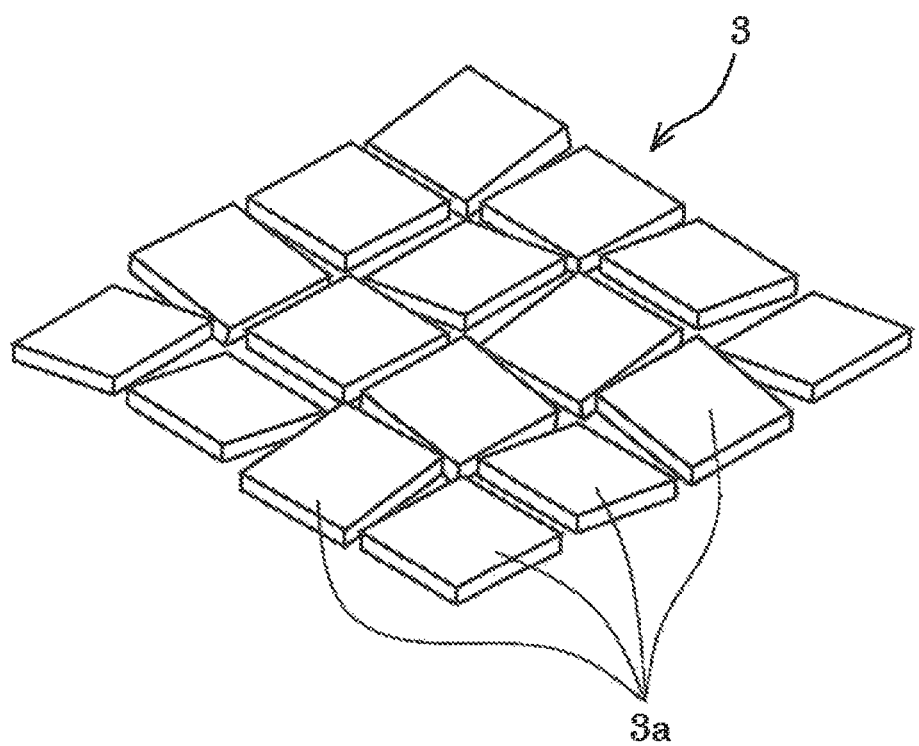
FIG. 4 is a partial perspective view of a main part of the spatial light modulator.

As shown in FIG. 4, the spatial light modulator 3 is provided with a plurality of micro mirror elements 3a which are aligned (arranged) two-dimensionally, and the spatial light modulator 3 variably gives the spatial modulation to the incident light, the spatial modulation depending on the incident position of the incident light, and then emit the modulated light. In order to simplify the explanation and the illustration, FIGS. 3 and 4 show an exemplary construction in which the spatial light modulator 3 is provided with 4×4=16 pieces of the mirror elements 3a. However, actually, the spatial light modulator 3 is provided with a large number of mirror elements 3a, the number being much larger than sixteen.

With reference to FIG. 3, as for those of the light beam group allowed to come into the spatial light modulator 3, the light beam L1 comes into the mirror element SEa of the plurality of mirror elements 3a, and the light beam L2 comes into the mirror element SEb different from the mirror element SEa. Similarly, the light beam L3 comes into the mirror element SEc different from the mirror elements SEa, SEb, and the light beam LA comes into the mirror element SEd different from the mirror elements SEa to SEc. The mirror elements SEa to SEd give the spatial modulations set depending on the positions thereof, to the light beams L1 to L4.

The spatial light modulator 3 is configured such that in a reference state in which all reflecting surfaces of the mirror elements 3a is set along one plane, the incident light beam along a direction parallel to the optical axis AX of the optical path between the mirror MR1 and the spatial light modulator 3 are reflected by the spatial light modulator 3 and, thereafter, propagates in a direction parallel to the optical axis AX of the optical path between the spatial light modulator 3 and the relay optical system 4. Further, as described above, the arrangement plane of the spatial light modulator 3 for the plurality of mirror elements 3a is positioned at the front focal position of the front side lens group 4a of the relay optical system 4, or in its vicinity.

Therefore, the light beams, which are reflected by the plurality of mirror elements SEa to SEd of the spatial light modulator 3 and to which predetermined angle distributions are given, form predetermined light intensity distributions SP1 to SP4 on the pupil plane 4c of the relay optical system 4, and the light beams consequently form light intensity distribution corresponding to the light intensity distributions SP1 to SP4 on the incident surface of the micro fly's eye lens 7. That is, the angles, which are given by the plurality of mirror elements SEa to SEd of the spatial light modulator 3 to the outgoing light, are converted by the front side lens group 4a into the positions on the pupil plane 4c which is the far field of the spatial light modulator 3 (Fraunhofer diffraction area). Thus, the light intensity distribution (pupil intensity distribution) of the secondary light source formed by the micro fly's eye lens 7 is the distribution corresponding to the light intensity distribution formed on the incident surface of the micro fly's eye lens 7 by the spatial light modulator 3 and the relay optical systems 4, 6.

As shown in FIG. 4, the spatial light modulator 3 is the movable multi-mirror including the mirror elements 3a which are the large number of micro reflecting elements arranged or aligned regularly and two-dimensionally along one flat surface or plane in the state in which the planar reflecting surfaces are the upper surfaces. The respective mirror elements 3a are movable. The inclinations of the reflecting surfaces thereof, i.e., the angles of inclination and the directions of inclination of the reflecting surfaces are independently controlled by the action of the driving unit 3c operated on the basis of the control signal fed from the control system CR. Each of the mirror elements 3a can be rotated continuously or discretely by a desired angle of rotation about the rotation axes in the two directions parallel to the reflecting surface thereof, the two directions being perpendicular to one another. That is, the inclination of the reflecting surface of each of the mirror elements 3a can be controlled two-dimensionally.

When the reflecting surface of each of the mirror elements 3a is rotated discretely, it is appropriate to control the angle of rotation such that the angle is switched among a plurality of states (for example, . . . , −2.5 degrees, −2.0 degrees, . . . , 0 degree, +0.5 degree, . . . , +2.5 degrees, . . . ). FIG. 4 shows the mirror elements 3a having square contours. However, the contour shape of the mirror element 3a is not limited to the square. However, in view of the light utilization efficiency, it is possible to adopt a shape (shape capable of close packing) in which the mirror elements 3a can be arranged so that the gap between the mirror elements 3a is decreased. Further, in view of the light utilization efficiency, the spacing distance between the two adjoining mirror elements 3a can be suppressed to be minimum requirement.

In this embodiment, for example, the spatial light modulator, in which the directions of the plurality of mirror elements 3a arranged two-dimensionally are changed continuously respectively, is used as the spatial light modulator 3. As for the spatial light modulator as described above, it is possible to use any spatial light modulator disclosed, for example, in European Patent Application Publication No. 779530, U.S. Pat. Nos. 5,867,302, 6,480,320, 6,600,591, 6,733,144, 6,900,915, 7,095,546, 7,295,726, 7,424,330, and 7,567,375, United States Patent Application Publication No. 2008/0309901, International Patent Application Publication Nos. WO2010/037476 and WO2010/040506, and Japanese Patent Application Laid-open No. 2006-113437. The directions of the plurality of mirror elements 3a arranged two-dimensionally may be controlled discretely and in multi-stage manner.

In the spatial light modulator 3, the attitudes of the plurality of mirror elements 3a are changed respectively by the action of the driving unit 3c operated in response to the control signal supplied from the control system CR, and the respective mirror elements 3a are set in the predetermined directions. The light beams, which are reflected at the predetermined angles respectively by the plurality of mirror elements 3a of the spatial light modulator 3, form the desired pupil intensity distribution on the illumination pupil defined just downstream from the micro fly's eye lens 7. Further, the desired pupil intensity distribution is also formed at positions of other illumination pupils optically conjugate with the illumination pupil defined just downstream from the micro fly's eye lens 7, i.e., at the pupil position of the imaging optical system 10 and the pupil position of the projection optical system PL (position at which the aperture diaphragm AS is arranged). In other words, the spatial light modulator 3 variably forms the pupil intensity distribution in the illumination pupil just downstream from the micro fly's eye lens 7.

As described above, the polarization unit 5 is arranged in a position optically conjugate with the arrangement plane of the spatial light modulator 3. Therefore, the property of the light beam coming into the polarization unit 5 corresponds to the property of the light beam coming into the spatial light modulator 3. Hereinbelow, in order to facilitate comprehension of the explanation, a parallel light beam of a linearly polarized light, which has a rectangular cross section elongate in the X direction and is polarized in the Y direction (to be referred to as "the Y direction linearly polarized light", below), is supposed to come into the polarization unit 5. Hence, the parallel light beam of the linearly polarized light, which has a rectangular cross section elongate in the X direction and is polarized in a direction parallel to the page of FIG. 1, comes into the spatial light modulator 3.

Figure 5:
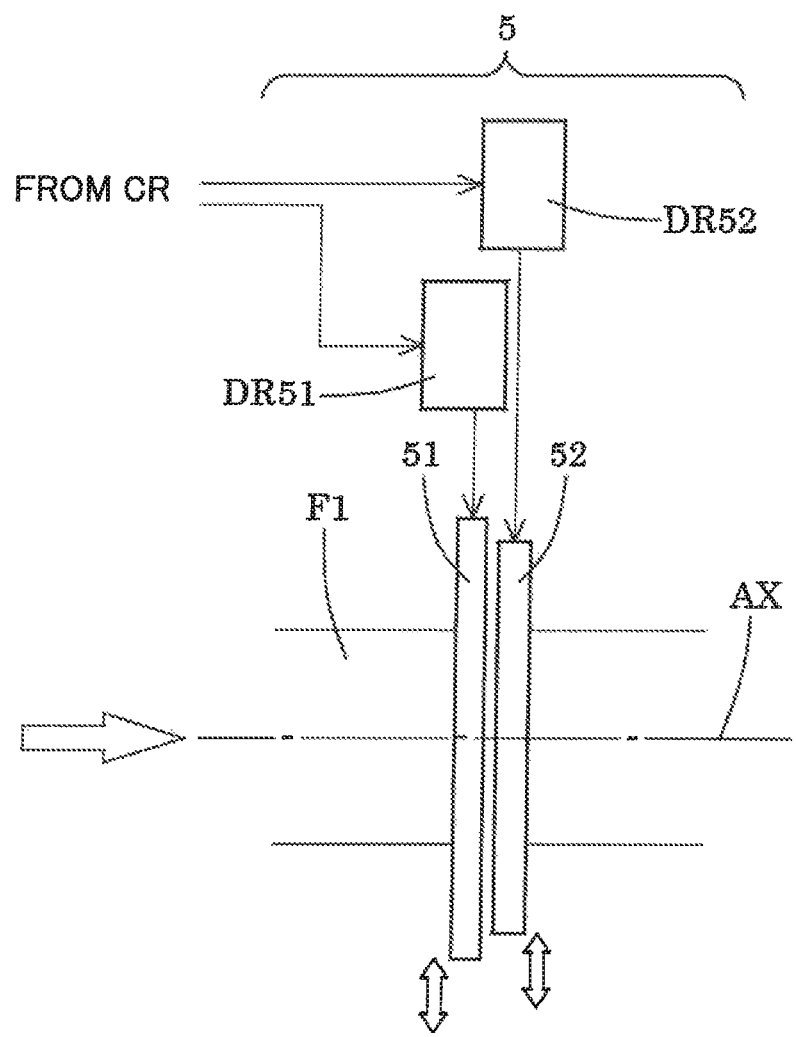
FIG. 5 schematically shows a configuration of a polarization unit according to the embodiment.

As shown in FIG. 5, the polarization unit 5 includes the pair of optical rotation members 51 and 52 arranged to be adjacent to each other along the optical axis AX and movable respectively along the X direction which is a direction along the cross section of the incident light, and drive portions DR51 and DR52 provided to move the pair of optical rotation members 51 and 52 in the X direction. The optical rotation members 51 and 52 are formed of a crystalline material which is an optical material having a form of plane parallel plate and having optical rotation property, for example, crystal. The incident surfaces (and, consequently, the emission surfaces) of the optical rotation members 51 and 52 are orthogonal to the optical axis AX, and their crystalline optic axes are substantially consistent with the direction of the optical axis AX (i.e., substantially consistent with the Z direction which is the propagation direction of the incident light). Further, the drive portions DR51 and DR52 include actuators for moving the optical rotation members 51 and 52, and encoders for detecting the movement amounts of the optical rotation members 51 and 52, so as to move the optical rotation members 51 and 52 based on the control signals from the control system CR.

Figure 6:
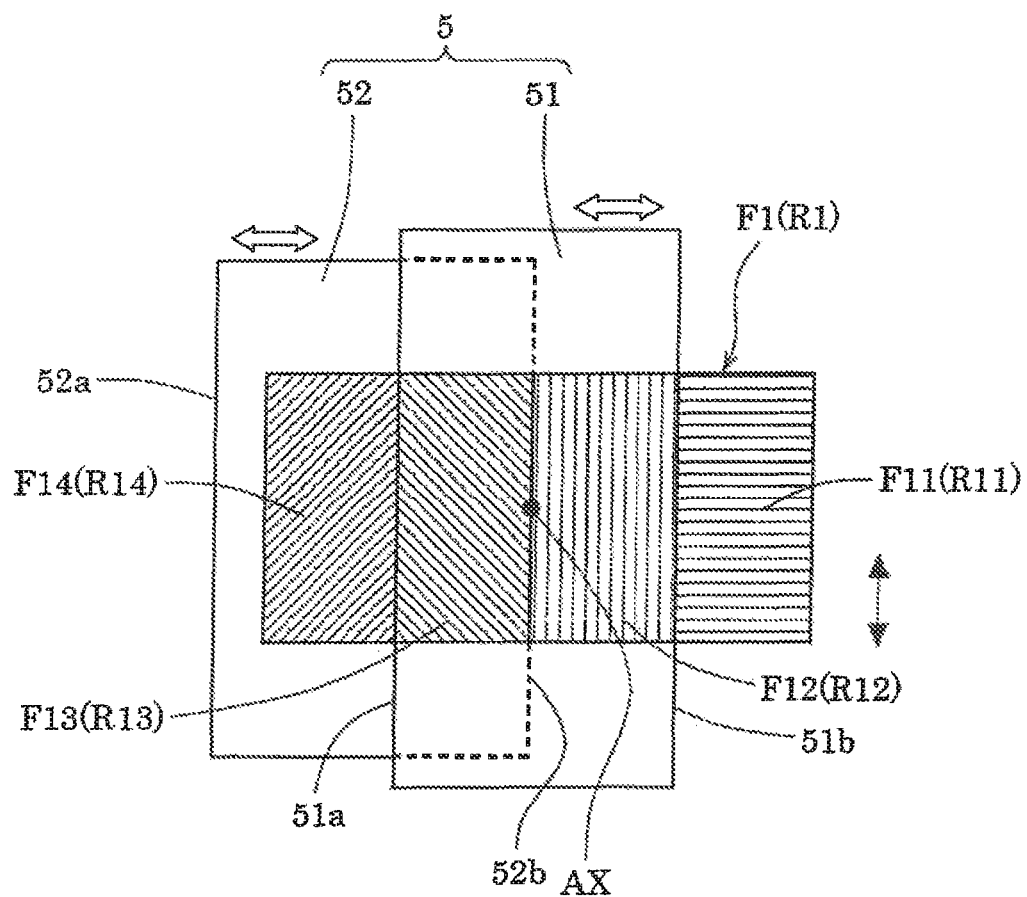
FIG. 6 shows an aspect (a look) of a light beam coming into the polarization unit of FIG. 5.

As shown in FIG. 6, the optical rotation members 51 and 52 each have a rectangular outer shape (contour) with one pair of sides along the X direction and the other pair of sides along the Y direction. In other words, the optical rotation members 51 and 52 have a pair of edges 51a and 51b and a pair of edges 52a and 52b along the Y direction, respectively. The optical rotation members 51 and 52 are different in thickness from each other and, consequently, different in polarization transformation property (polarization conversion property) from each other.

In particular, the optical rotation member 51 is set at such a thickness as to emit a linearly polarized light having the polarization direction in a +45 degree oblique direction obtained by rotating the Y direction by +45 degrees (45 degrees clockwise on the page of FIG. 6), on the incidence of a Y direction linearly polarized light having the polarization direction in the Y direction. On the other hand, the optical rotation member 52 arranged adjacent to the optical rotation member 51 on the emission side is set at such a thickness as to emit a X direction linearly polarized light having the polarization direction in the X direction, which is the direction obtained by rotating the Y direction by +90 degrees, on the incidence of a Y direction linearly polarized light.

As shown in FIG. 6, a parallel light beam F1 of the Y direction linearly polarized light having a rectangular cross section elongated in the X direction with the optical axis AX as the center coming into the polarization unit 5. In this case, among the incident light beam F1, a first partial light beam F11 having a rectangular cross section, i.e., the light beam on the +X direction side of the +X direction side edge 51b of the optical rotation member 51 propagates toward the relay optical system 6 without passing through the optical rotation members 51 or 52. A second partial light beam F12 having a rectangular cross section adjacent to the first partial light beam F11, i.e., the light beam defined by the +X direction side edge 51b of the optical rotation member 51 and the +X direction side edge 52b of the optical rotation member 52 propagates toward the relay optical system 6 via only the optical rotation member 51 without passing through the optical rotation member 52.

A third partial light beam F13 having a rectangular cross section adjacent to the second partial light beam F12, i.e., the light beam defined by the −X direction side edge 51a of the optical rotation member 51 and the +X direction side edge 52b of the optical rotation member 52 propagates toward the relay optical system 6 via the optical rotation members 51 and 52. A fourth partial light beam F14 having a rectangular cross section adjacent to the third partial light beam F13, i.e., the light beam on the −X direction side of the −X direction side edge 51a of the optical rotation member 51 propagates toward the relay optical system 6 via only the optical rotation member 52 without passing through the optical rotation member 51.

Figure 7:
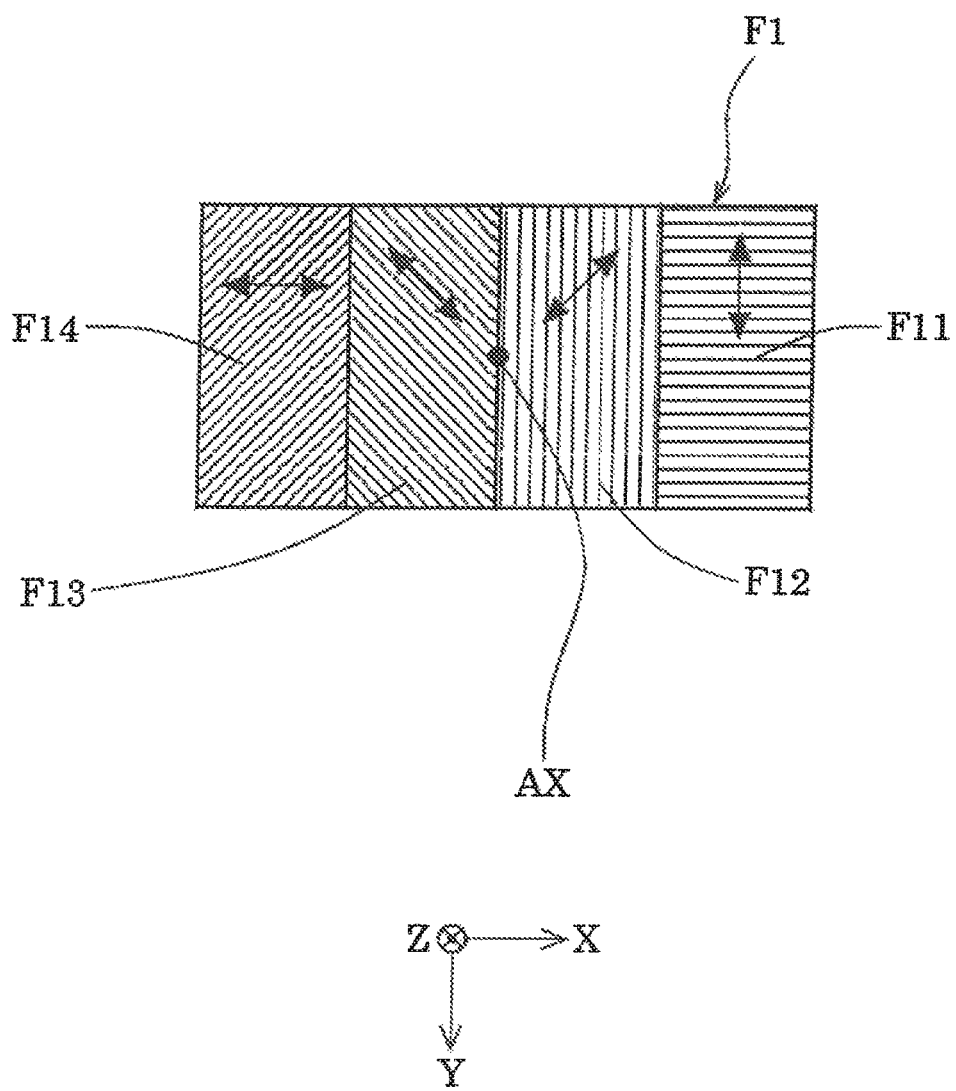
FIG. 7 shows a polarization state of the light beam at a position just downstream of the polarization unit.

As a result, the light beam F1 at a position just downstream from the polarization unit 5 has such a polarization state as shown in FIG. 7. That is, because the first partial light beam F11 does not receive the optical rotation effects of the optical rotation members 51 and 52, it remains the Y direction linearly polarized light as it is. Because the second partial light beam F12 receives only the optical rotation effect of the optical rotation member 51, it becomes a linearly polarized light of +45 degree oblique direction having the polarization direction in a direction obtained by rotating the Y direction by +45 degrees.

Because the fourth partial light beam F14 receives only the optical rotation effect of the optical rotation member 52, it becomes a X direction linearly polarized light having the polarization direction in the X direction obtained by rotating the Y direction by +90 degrees. The third partial light beam F13 successively receives the optical rotation effect of the optical rotation member 51 and the optical rotation effect of the optical rotation member 52. Therefore, the third partial light beam F13 becomes a linearly polarized light of −45 degree oblique direction having the polarization direction in a direction obtained by rotating the Y direction by −45 degrees, i.e., a direction obtained by rotating the Y direction by +45 degrees, and further rotating by +90 degrees.

Figure 8:
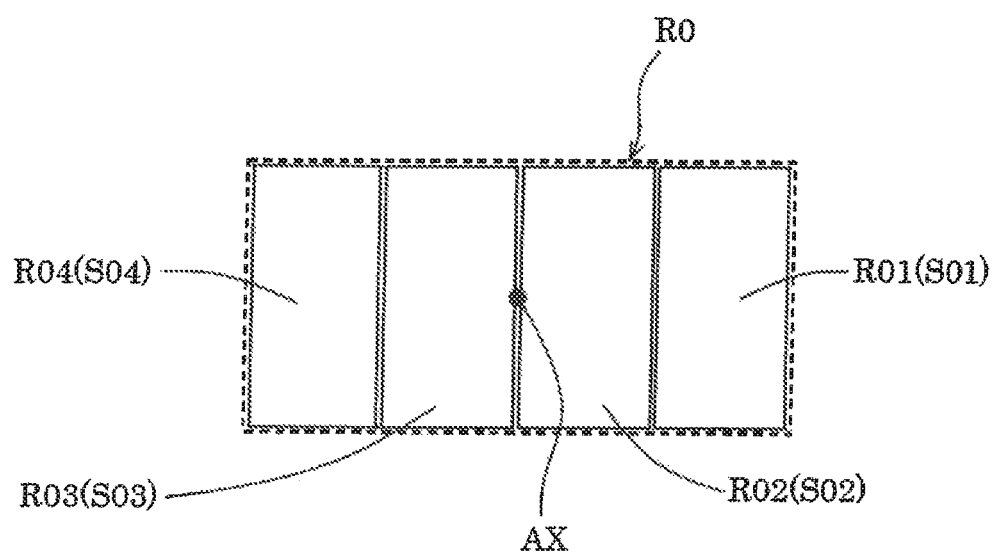
FIG. 8 shows partial areas on an arrangement plane of the spatial light modulator.

As shown in FIG. 8, a partial region R11 occupied by the first partial light beam F1 in the polarization unit 5 corresponds to the rectangular partial region R01 in an effective refection region on the arrangement plane of the spatial light modulator 3. Likewise, partial regions R12, R13 and R14 occupied by the partial light beams F12, F13 and F14 correspond to the rectangular partial regions R02, R03 and R04, respectively. A rectangular region R0 circumscribing the partial regions R01 to R04 on the arrangement plane of the spatial light modulator 3 corresponds to the region R1 occupied by the incident light beam F1 in the polarization unit 5.

Figure 9A:
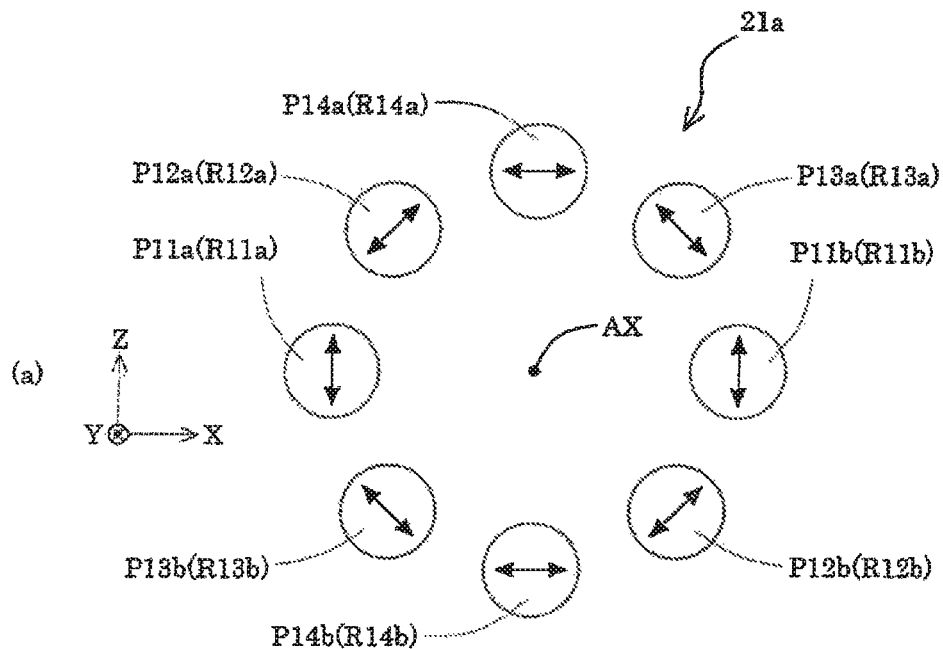
FIGS. 9A and 9B show eight pole-shaped pupil intensity distributions in a circumferential direction polarization states.

In this embodiment, the drive portion 3c controls the respective attitudes of the plurality of mirror elements 3a belonging to a first mirror element group S01 positioned in the first partial region R01, among the plurality of mirror elements 3a of the spatial light modulator 3, to guide the light via the first mirror element group S01 to the pair of pupil regions R11a and R11b on the illumination pupil plane just downstream from the micro fly's eye lens 7, as shown in FIG. 9A. As described above, the illumination pupil plane just downstream from the micro fly's eye lens 7 is a plane optically conjugate with the pupil plane 4c of the relay optical system 4 and, furthermore, an optical Fourier transform plane of the arrangement plane of the spatial light modulator 3. The pair of pupil regions R11a and R11b are, for example, regions spaced in the X direction with the optical axis AX intervening therebetween.

The drive portion 3c controls the respective attitudes of the plurality of mirror elements 3a belonging to a fourth mirror element group S04 positioned in the fourth partial region R04, to guide the light via the fourth mirror element group S04 to the pair of pupil regions R14a and R14b on the illumination pupil plane. The pair of pupil regions R14a and R14b are, for example, regions spaced in the Z direction with the optical axis AX intervening therebetween. The drive portion 3c controls the respective attitudes of the plurality of mirror elements 3a belonging to a second mirror element group S02 positioned in the second partial region R02, and controls the respective attitudes of the plurality of mirror elements 3a belonging to a third mirror element group S03 positioned in the third partial region R03, to guide the light via the third and fourth mirror element groups S03 and S04 to the pair of pupil regions R12a and R12b and the pair of pupil regions R13a and R13b on the illumination pupil plane, respectively.

The pair of pupil regions R12a and R12b are, for example, regions spaced in a direction at an angle of 45 degrees to the −X direction as well as to the +Z direction with the optical axis AX intervening therebetween. The pair of pupil regions R13a and R13b are, for example, regions spaced in a direction at an angle of 45 degrees to the +X direction as well as to the +Z direction with the optical axis AX intervening therebetween. In this manner, based on the parallel light beam having a rectangular cross section, the spatial light modulator 3 forms, for example, an eight pole-shaped pupil intensity distribution 21a which is composed of eight circular substantive surface light sources P11a and P11b, P12a and P12b, P13a and P13b, and P14a and P14b, in the illumination pupil just downstream from the micro fly's eye lens 7.

That is, the light via the first mirror element group S01 of the spatial light modulator 3 forms the surface light sources P11a and P11b occupying the pupil regions R11a and R11b without passing through the optical rotation members 51 and 52 of the polarization unit 5. Because the light forming the pair of surface light sources P11a and P11b does not pass through the optical rotation members 51 and 52, it is a Z direction linearly polarized light (corresponding to the Y direction linearly polarized light in FIG. 7). The light via the fourth mirror element group S04 forms the surface light sources P14a and P14b occupying the pupil regions R14a and R14b only via the optical rotation member 52 without passing through the optical rotation member 51. Because the light forming the pair of surface light sources P14a and P14b only passes through the optical rotation member 52, it is a X direction linearly polarized light (corresponding to the X direction linearly polarized light in FIG. 7).

The light via the second mirror element group S02 forms the surface light sources P12a and P12b occupying the pupil regions R12a and R12b only via the optical rotation member 51 without passing through the optical rotation member 52. Because the light forming the pair of surface light sources P12a and P12b only passes through the optical rotation member 51, it is a linearly polarized light of +45 degree oblique direction having the polarization direction in a direction obtained by rotating the Z direction clockwise by +45 degrees on the page of FIG. 9A (corresponding to the linearly polarized light of +45 degree oblique direction in FIG. 7).

The light via the third mirror element group S03 forms the surface light sources P13a and P13b occupying the pupil regions R13a and R13b via the optical rotation member 51 and the optical rotation member 52. Because the light forming the pair of surface light sources P13a and P13b passes through both of the optical rotation members 51 and 52, it is a linearly polarized light of −45 degree oblique direction having the polarization direction in a direction obtained by rotating the Z direction clockwise by −45 degrees on the page of FIG. 9A (corresponding to the linearly polarized light of −45 degree oblique direction in FIG. 7).

In this manner, by the collaboration of the spatial light modulator 3 and the polarization unit 5, the eight pole-shaped pupil intensity distribution 21a in a circumferential direction polarization state is formed in the illumination pupil just downstream from the micro fly's eye lens 7. Further, an eight pole-shaped pupil intensity distribution in a circumferential direction polarization state corresponding to the pupil intensity distribution 21a is also formed at a position of another illumination pupil optically conjugate with the illumination pupil just downstream from the micro fly's eye lens 7, i.e., at the pupil position of the image formation optical system 10, and at the pupil position of the projection optical system PL (the position at which the aperture stop AS is arranged).

In general, in the case of the circumferential direction polarized illumination based on the annular or multi-pole-shaped (for example, two pole-shaped, four pole-shaped or eight pole-shaped) pupil intensity distribution in the circumferential direction polarization state, the light, which is radiated onto the wafer W as the final illumination objective surface, is in the polarization state in which the s-polarized light is the main component. In this case, the s-polarized light is the linearly polarized light having the polarization direction in the direction perpendicular to the plane of incidence (polarized light having the electric vector vibrating in the direction perpendicular to the plane of incidence). The plane of incidence is defined as the plane which includes the light incident direction and the normal line of the boundary surface at the point provided when the light arrives at the boundary surface of the mediums (illumination objective surface (plane): surface of the wafer W). As a result, in the case of the circumferential direction polarized illumination, it is possible to improve the optical performance (for example, the depth of focus) of the projection optical system, and it is possible to obtain the mask pattern image having the high contrast on the wafer (photosensitive substrate).

Figure 9B:
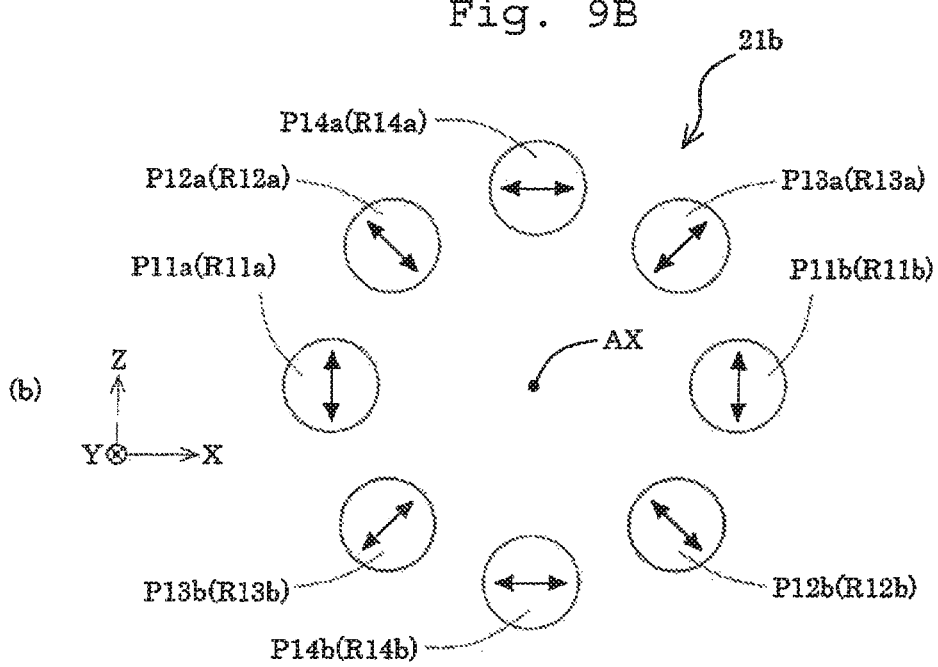

Now, in this embodiment, as shown in FIG. 9B for example, it is possible to form an eight pole-shaped pupil intensity distribution 21b having a polarization distribution different from that of the eight pole-shaped pupil intensity distribution 21a. This eight pole-shaped pupil intensity distribution 21b is composed, for example, of eight circular substantive surface light sources P11a and P11b, P12a and P12b, P13a and P13b, and P14a and P14b, and has a polarization distribution obtained by rotating the polarization directions of the surface light sources P12a and P12b, and P13a and P13b in the pupil intensity distribution 21a by 90 degrees.

In order to form the pupil intensity distribution 21b shown in FIG. 9B, it is possible to set, for example, the respective attitudes of the plurality of mirror elements 3a belonging to the second mirror element group S02 positioned in the second partial region R02 such that the light via the second mirror element group S02 may be guided to the pair of pupil regions R13a and R13b on the illumination pupil plane, and set the respective attitudes of the plurality of mirror elements 3a belonging to the third mirror element group S03 positioned in the third partial region R03 such that the light via the third mirror element group S03 may be guided to the pair of pupil regions R12a and R12b on the illumination pupil plane.

Further, it is also possible to form the pupil intensity distribution 21b shown in FIG. 9B by positioning the optical rotation member 52 to cover the partial regions R11 and R12 occupied by the first and second partial light beams F11 and F12, and letting the X direction linearly polarized light enter the polarization unit 5 (or the spatial light modulator 3). Further, for the technique of controlling the polarization direction or degree of polarization of the light coming into the polarization unit 5 (or the spatial light modulator 3), reference can be made to a polarized state switching portion disclosed in U.S. Pat. No. 7,423,731.

In this embodiment, because of use of the spatial light modulator 3 having the large number of mirror elements 3a whose attitudes are controlled individually, there is a high degree of freedom in changing the shape (broad concept including the size) of the pupil intensity distribution. As an example, by only controlling the spatial light modulator 3 according to a command from the control system CR, as shown in FIG. 10, it is possible to form an annular pupil intensity distribution 22 in a circumferential direction polarization state in the illumination pupil just downstream from the micro fly's eye lens 7.

Figure 10:
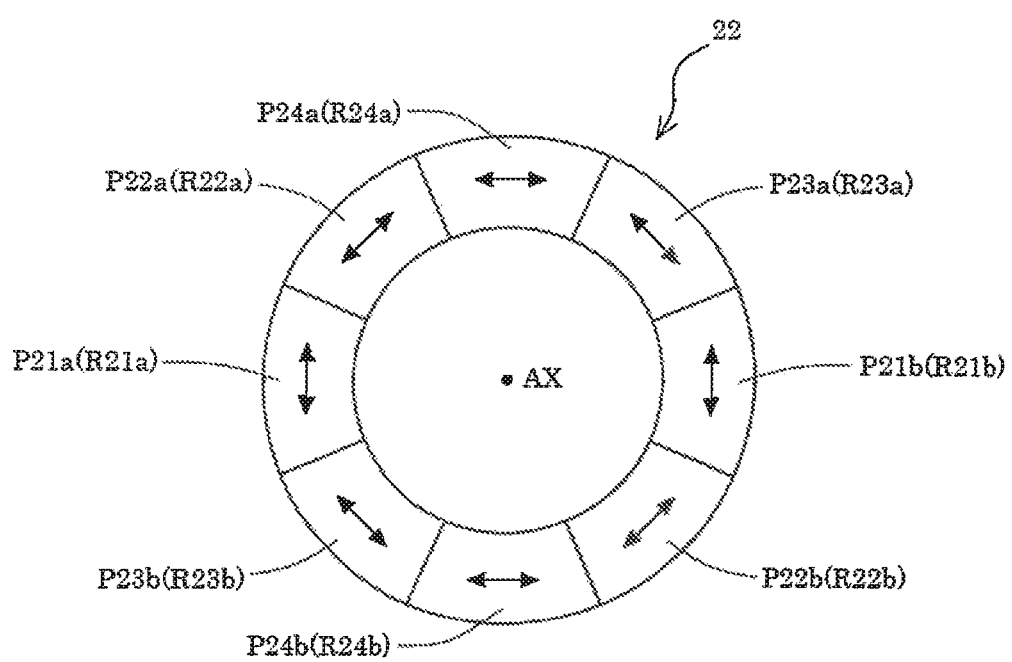
FIG. 10 shows an annular pupil intensity distribution in a circumferential direction polarization state.

In the example shown in FIG. 10, the light via the first mirror element group S01 is guided to a pair of arc-like pupil regions R21a and R21b spaced in the X direction across the optical axis AX on the illumination pupil plane, to form substantial surface light sources P21a and P21b. The light via the fourth mirror element group S04 is guided to a pair of arc-like pupil regions R24a and R24b spaced in the Z direction across the optical axis AX, to form substantial surface light sources P24a and P24b. The light via the second mirror element group S02 is guided to a pair of arc-like pupil regions R22a and R22b spaced in a direction at an angle of 45 degrees to the −X direction as well as to the +Z direction across the optical axis AX, to form substantial surface light sources P22a and P22b.

The light via the third mirror element group S03 is guided to a pair of arc-like pupil regions R23a and R23b spaced in a direction at an angle of 45 degrees to the +X direction as well as to the +Z direction across the optical axis AX, to form substantial surface light sources P23a and P23b. The pupil regions R21a and R21b, R22a and R22b, R23a and R23b, and R24a and R24b are arc-like regions obtained by dividing the annular region around the optical axis AX into eight parts along the circumferential direction. In this manner, the annular pupil intensity distribution 22 in a circumferential direction polarization state is formed from, for example, eight arc-like substantive surface light sources P21a and P21b, P22a and P22b, P23a and P23b, and P24a and P24b.

Further, in this embodiment, because of use of the spatial light modulator 3 having the large number of mirror elements 3a whose attitudes are controlled individually, there is a high degree of freedom in changing the polarization state of the pupil intensity distribution. As an example, by only controlling the spatial light modulator 3 according to a command from the control system CR, as shown in FIG. 11, it is possible to form an eight pole-shaped pupil intensity distribution 23 in a radial direction polarization state in the illumination pupil just downstream from the micro fly's eye lens 7.

Figure 11:
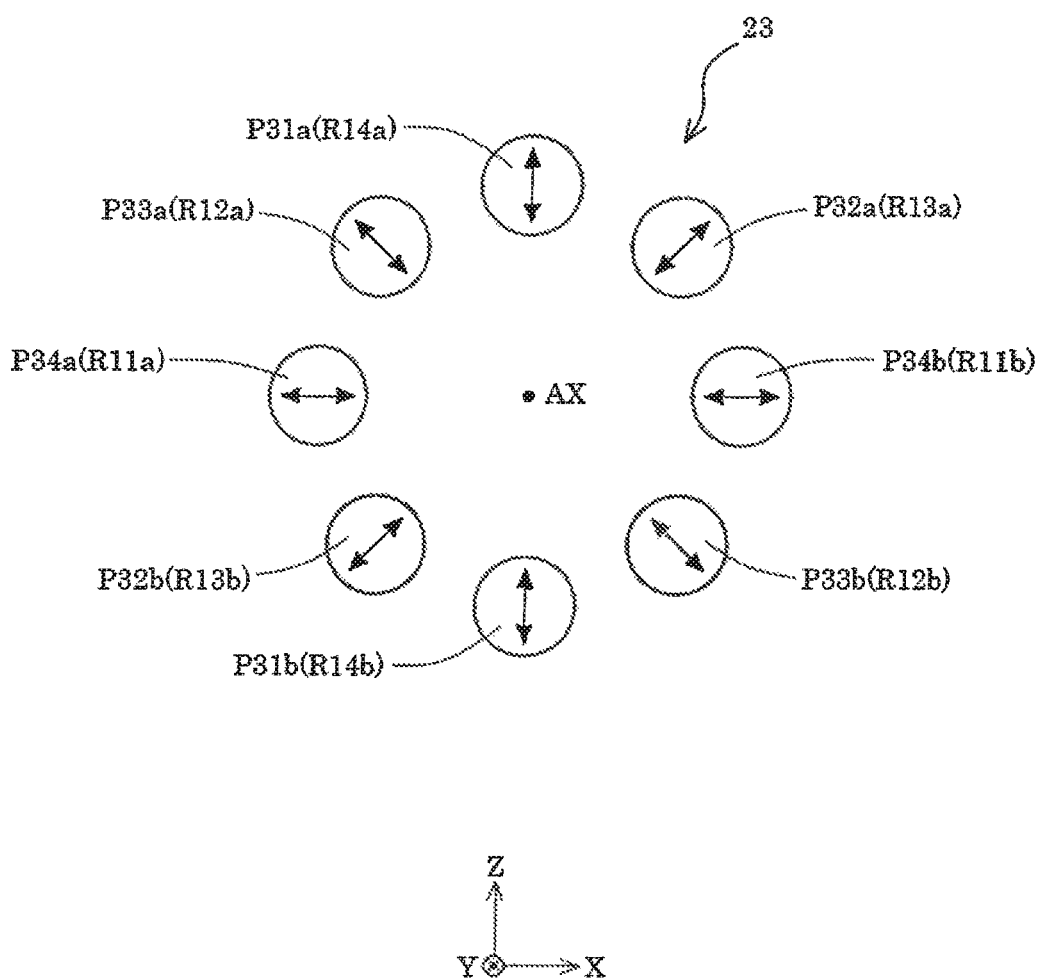
FIG. 11 shows an eight pole-shaped pupil intensity distribution in a radial direction polarization state.

In the example shown in FIG. 11, the light via the first mirror element group S01 forms surface light sources P31a and P31b occupying the pupil regions R14a and R14b on the illumination pupil plane without passing through the optical rotation members 51 and 52. Because the light forming the pair of surface light sources P31a and P31b does not pass through the optical rotation members 51 and 52, it is a Z direction linearly polarized light. The light via the fourth mirror element group S04 forms surface light sources P34a and P34b occupying the pupil regions R11a and R11b via only the optical rotation member 52 without passing through the optical rotation member 51. Because the light forming the pair of surface light sources P34a and P34b only passes through the optical rotation member 52, it is a X direction linearly polarized light.

The light via the second mirror element group S02 forms surface light sources P32a and P32b occupying the pupil regions R13a and R13b via only the optical rotation member 51 without passing through the optical rotation member 52. Because the light forming the pair of surface light sources P32a and P32b only passes through the optical rotation member 51, it is a linearly polarized light of +45 degree oblique direction having the polarization direction in a direction obtained by rotating the Z direction clockwise by +45 degrees on the page of FIG. 11.

The light via the third mirror element group S03 forms surface light sources P33a and P33b occupying the pupil regions R12a and R12b via the optical rotation member 51 and the optical rotation member 52. Because the light forming the pair of surface light sources P33a and P33b passes through both of the optical rotation members 51 and 52, it is a linearly polarized light of −45 degree oblique direction having the polarization direction in a direction obtained by rotating the Z direction clockwise by −45 degrees on the page of FIG. 11.

In this manner, the eight pole-shaped pupil intensity distribution 23 in a radial direction polarization state is formed from, for example, eight circular substantial surface light sources P31a and P31b, P32a and P32b, P33a and P33b, and P34a and P34b. Although not shown in the drawings, it is also possible to form an annular pupil intensity distribution in a radial direction polarization state in the illumination pupil just downstream from the micro fly's eye lens 7 by only controlling the spatial light modulator 3 according to a command from the control system CR.

In general, in the case of the radial direction polarized illumination based on the annular or multi-pole-shaped pupil intensity distribution in the radial direction polarization state, the light, which is radiated onto the wafer W as the final illumination objective surface, is in the polarization state in which the p-polarized light is the main component. In this case, the p-polarized light is the linearly polarized light having the polarization direction in the direction parallel to the plane of incidence defined as described above (polarized light having the electric vector vibrating in the direction parallel to the plane of incidence). As a result, in the case of the radial direction polarized illumination, the reflectance of the light can be suppressed to be small on the resist with which the wafer W is coated, and it is possible to obtain the satisfactory image of the mask pattern on the wafer (photosensitive substrate).

Further, in this embodiment, by the effect of the spatial light modulator 3, it is possible to relatively change the light intensity between, for example, the respective pairs of surface light sources: P11a and P11b, P12a and P12b, P13a and P13b, and P14a and P14b among the eight surface light sources constituting the eight pole-shaped pupil intensity distribution 21a while maintaining the circumferential direction polarization state. However, it is not possible to relatively change the light intensity between, for example, the surface light source P11a and a light source other than the light source P11b while maintaining the polarization state by the effect of the spatial light modulator 3 alone.

In this embodiment, however, by the collaboration of the spatial light modulator 3 and the polarization unit 5, it is possible to relatively change the light intensity among, for example, the eight surface light sources constituting the eight pole-shaped pupil intensity distribution 21a while maintaining the circumferential direction polarization state. In particular, if only the optical rotation member 51 is moved from the position shown in FIG. 6 toward the +X direction side, then the cross-sectional area of the first partial light beam F11 (the area of the partial region R11) decreases, whereas the cross-sectional area of the second partial light beam F12 (the area of the partial region R12) increases. As a result, it is possible to lower the light intensity of the pair of surface light sources P11a and P11b, and raises the light intensity of the pair of surface light sources P12a and P12b.

If only the optical rotation member 51 is moved from the position shown in FIG. 6 toward the −X direction side, then the cross-sectional area of the second partial light beam F12, and the cross-sectional area of the fourth partial light beam F14 (the area of the partial region R14) decrease, whereas the cross-sectional area of the first partial light beam F11, and the cross-sectional area of the third partial light beam F13 (the area of the partial region R13) increase. As a result, it is possible to lower the light intensity of the pair of surface light sources P12a and P12b and the light intensity of the pair of surface light sources P14a and P14b, and raises the light intensity of the pair of surface light sources P11a and P11b and the light intensity of the pair of surface light sources P13a and P13b.

If only the optical rotation member 52 is moved from the position shown in FIG. 6 toward the +X direction side, then the cross-sectional area of the second partial light beam F12 decreases, whereas the cross-sectional area of the third partial light beam F13 increases. As a result, it is possible to lower the light intensity of the pair of surface light sources P12a and P12b, and raises the light intensity of the pair of surface light sources P13a and P13b. If only the optical rotation member 52 is moved from the position shown in FIG. 6 toward the −X direction side, then the cross-sectional area of the third partial light beam F13 decreases, whereas the cross-sectional area of the second partial light beam F12 increases. As a result, it is possible to lower the light intensity of the pair of surface light sources P13a and P13b, and raises the light intensity of the pair of surface light sources P12a and P12b.

In this manner, by moving at least one of the pair of optical rotation members 51 and 52 in the X direction, it is possible to change the ratio between the cross-sectional area of the first partial light beam F11, the cross-sectional area of the second partial light beam F12, the cross-sectional area of the third partial light beam F13, and the cross-sectional area of the fourth partial light beam F14. Consequently, it is possible to relatively change the light intensities between the eight surface light sources P11a and P11b, P12a and P12b, P13a and P13b, and P14a and P14b which constitute the eight pole-shaped pupil intensity distribution 21a while maintaining the circumferential direction polarization state. Likewise, for the annular pupil intensity distribution 22 and for the eight pole-shaped pupil intensity distribution 23, it is also possible to relatively change the light intensities between the plurality of surface light sources while maintaining the polarization state.

Further, in this embodiment, the polarization state of each surface light source constituting the pupil intensity distribution is set respectively by the polarization unit 5 arranged in a position optically conjugate with the arrangement plane of the spatial light modulator 3. As a result, it is possible to reduce the adverse influence due to defocus at the edges of the polarization members of the polarization unit 5 (the optical rotation members 51 and 52), thereby allowing for a desired polarization state of each surface light source constituting the pupil intensity distribution. For comparison, in a method in which the polarization unit 5 is arranged in a position defocused from the position optically conjugate with the arrangement plane of the spatial light modulator, the light passed through the polarization members (optical rotation members) through which the light toward a specific surface light source should pass is subjected to coexistence with the light passed through another polarization members (optical rotation members) through which the light toward another specific surface light source should pass. Hence, the polarization state of the specific surface light source deviates from the desired polarization state and, consequently, this adversely affects the polarization state of the pupil intensity distribution.

Further, in this embodiment, the polarization state of each surface light source constituting the pupil intensity distribution is set respectively by the polarization unit 5 arranged in the position optically conjugate with the arrangement plane of the spatial light modulator 3 in the optical path defined on the illumination objective surface side of the spatial light modulator 3. As a result, it is possible to reduce the degree of elliptical polarization of the linearly polarized light of an oblique direction (a direction different from the X direction and the Z direction on the pupil plane (X-Z plane) in FIG. 2) due to the retardation (a phenomenon that phase difference occurs between a pair of linearly polarized light components whose polarization directions are orthogonal to each other) caused by a succeeding optical system arranged in the illumination optical path on the downstream side from the spatial light modulator 3 (the illumination objective surface side).

Especially, it is liable to be elliptical polarization that a linearly polarized light (obliquely polarized light) having a polarization direction not along the plane (the Y-Z plane) including the optical axes upstream and downstream of the arrangement plane of the spatial light modulator 3, or the plane (the X-Z plane) orthogonal to that plane (the Y-Z plane) and including the optical axis.

Here, by causing the linearly polarized light of longitudinal direction (Y direction in FIG. 2) or the linearly polarized light of transverse direction (X direction in FIG. 2) which are typically less liable to receive the influence of retardation to pass through the illumination optical path from the light source to the polarization unit 5, elliptical polarization of the linearly polarized light is less likely to occur in this optical path.

In the above manner, in the illumination optical system (2 to 10) of this embodiment, it is possible to realize a high degree of freedom in changing the shape and polarization state of the pupil intensity distribution formed in the illumination pupil just downstream from the micro fly's eye lens 7 without accompanying any replacement of optical members. In the exposure apparatus (2 to WS) of this embodiment, by using the illumination optical system (2 to 10) having a high degree of freedom in changing the shape and polarization state of the pupil intensity distribution, it is possible to correctly transfer the fine pattern to wafer W under a proper illumination condition realized according to the property of the pattern of the mask M to be transferred.

In the embodiment described above, the control system CR can be constructed by using, for example, a so-called work station (or a microcomputer) composed of, for example, CPU (central processing unit), ROM (read only memory), and RAM (random access memory), and the control system CR can control the entire apparatus as a whole. Further, the control system CR may be externally connected with a storage device composed of, for example, a hard disk, an input device including, for example, a keyboard and a pointing device such as a mouse or the like, a display device including, for example a CRT display (or a liquid crystal display), and a drive device for an information storage medium including, for example, CD (compact disc), DVD (digital versatile disc), MO (magneto-optical disc), and FD (flexible disc).

In this embodiment, the storage device may be stored, for example, with the information regarding the pupil intensity distribution (illumination light source shape) by which the imaging state of the projection image projected onto the wafer W by the projection optical system PL is optimized (for example, the aberration or the line width is within the allowable range), and the control information for the illumination optical system, especially the mirror elements of the spatial light modulator 3 corresponding thereto. An information storage medium (referred to as "CD-ROM" for the purpose of convenience in the following explanation), in which the programs or the like for performing a setting of the pupil intensity distribution as described later on are stored, may be set to the drive device. It is also allowable that the programs as described above may be installed to the storage device. The control system CR appropriately reads the programs onto the memory.

Figure 12:
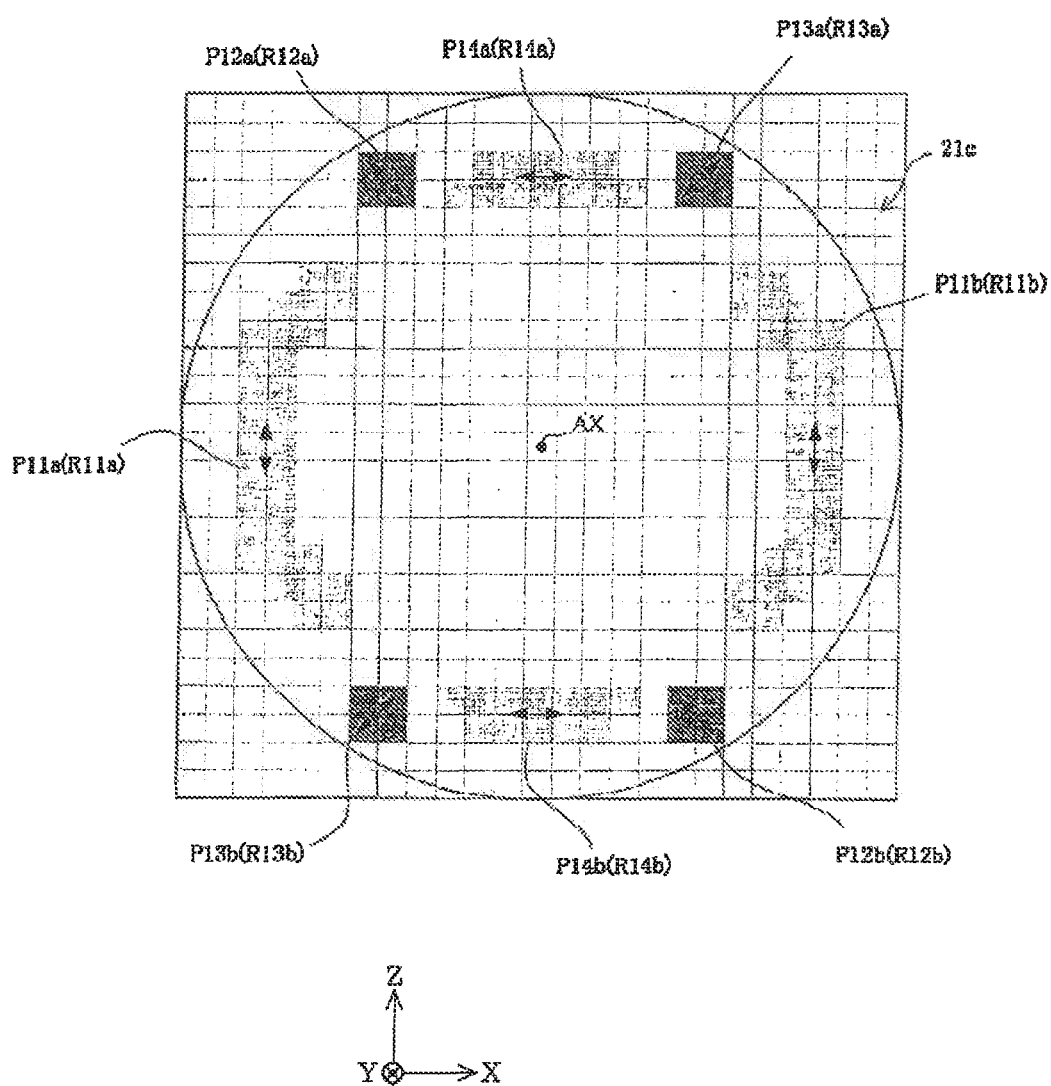
FIG. 12 is a first diagram for explaining an example of operation of a control system.

The control system CR is able to control the spatial light modulator 3 and the polarization unit 5 through, for example, the following procedure. Further, in the following explanation, the exposure apparatus of this embodiment is supposed to form a pupil intensity distribution 21c shown in FIG. 12. The pupil intensity distribution 21c of FIG. 12 is composed of the eight substantial surface light sources P11a and P11b, P12a and P12b, P13a and P13b, and P14a and P14b, where the pair of surface light sources P11a and P11b are Z direction linearly polarized light, the pair of surface light sources P14a and P14b are X direction linearly polarized light, the pair of surface light sources P12a and P12b are linearly polarized light of −45 degree oblique direction, and the pair of surface light sources P13a and P13b are linearly polarized light of +45 degree oblique direction. Further, the surface light sources P12a and P12b, and P13a and P13b have twice the light intensity of the surface light sources P11a and P11b, and P14a and P14b.

The pupil intensity distribution can be expressed, for example, in such a form (bit-map form in a broad sense) that the pupil intensity distribution is expressed as numerical values using (based on) the light intensity and the polarizing state of each compartment, each compartment being obtained by dividing the pupil plane into a plurality of compartments in a lattice form. It is now assumed that the number of mirror elements of the spatial light modulator 3 is N and the number of divided compartments of the pupil intensity distribution is M. On this assumption, the pupil intensity distribution (secondary light source) is formed (set) by appropriately combining N pieces of the light beams reflected by the individual mirror elements so that the light beams are guided to M pieces of the compartments, in other words, by appropriately overlapping (overlaying) N pieces of the light beams on M pieces of bright spots made up by M pieces of the compartments.

First, from the storage device, the control system CR reads out information concerning the target pupil intensity distribution 21c. Next, from the read-out information concerning the pupil intensity distribution 21c, the control system CR calculates how many light beams are needed respectively for forming the intensity distributions according to each polarization state as shown in FIGS. 13A to 13D for example. FIG. 13A shows a pupil intensity distribution of the Z direction linearly polarized light, FIG. 13B shows a pupil intensity distribution of the X direction linearly polarized light, FIG. 13C shows a pupil intensity distribution of the linearly polarized light of −45 degree oblique direction, and FIG. 13D shows a pupil intensity distribution of the linearly polarized light of +45 degree oblique direction.

On this occasion, suppose that the number N of the mirror elements of the spatial light modulator 3 is 64×64=4,096, and the number of the pupil plane sections is 25×25=625. The surface light sources P11a and P11b each occupy 30 sections on the pupil plane, the surface light sources P14a and P14b each occupy 12 sections on the pupil plane, and the surface light sources P12a and P12b, and P13a and P13b each occupy 4 sections on the pupil plane.

Then, because the surface light sources P12a and P12b, and P13a and P13b are supposed to have twice the light intensity of the surface light sources P11a and P11b, and P14a and P14b, the light from 4,096/116=35 mirror elements reaches one section in the surface light sources P11a and P11b, and P14a and P14b. Further, the light from 70 mirror elements reaches one section in the surface light sources P12a and P12b, and P13a and P13b. Further, the light from 36 mirror elements, i.e., the remainder of 4,096/116, is guided to the outside of the effective region of the optical system, and thus does not contribute to the formation of the pupil intensity distribution.

Thus, the number Nz of mirror elements necessary for generating the Z direction linearly polarized light is 35×30×2=2,100; the number Nx of mirror elements necessary for generating the X direction linearly polarized light is 35×12×2=840; the number N-45 of mirror elements necessary for generating the linearly polarized light of −45 degree oblique direction is 70×4×2=560, and the number N+45 of mirror elements necessary for generating the linearly polarized light of +45 degree oblique direction is 70×4×2=560.

Therefore, the control system CR virtually divides the plurality of mirror elements of the spatial light modulator 3 into the first mirror element group S01 composed of 2,100 mirror elements, the second mirror element group S02 composed of 560 mirror elements, the third mirror element group S03 composed of 560 mirror elements, and the fourth mirror element group S04 composed of 840 mirror elements, so as to set the partial regions R01 to R04 in which the mirror element groups S01 to S04 are positioned respectively, and the partial regions R1 to R14 corresponding respectively to the partial regions R01 to R04. Then, the control system CR drives the optical rotation members 51 and 52 of the polarization unit 5 to position the optical rotation member 51 into the partial regions R12 and R13, and position the optical rotation member 52 into the partial regions R13 and R14.

Further, the control system CR drives and sets the mirror elements 3a of the first mirror element group S01 and fourth mirror element group S04 such that the light from the first mirror element group S01 is directed toward the surface light sources P11a and P11b, and the light from the fourth mirror element group S04 is directed toward the surface light sources P14a and P14b. Then, the control system CR drives and sets the mirror elements 3a of the second mirror element group S02 and third mirror element group S03 such that the light from the second mirror element group S02 is directed toward the surface light sources P12a and P12b, and the light from the third mirror element group S03 is directed toward the surface light sources P13a and P13b.

On this occasion, the control system CR sets the mirror elements 3a such that the light from two mirror elements 3a of the second mirror element group S02 is directed toward one section in the surface light sources P12a and P12b, and the light from two mirror elements 3a of the third mirror element group S03 is directed toward one section in the surface light sources P13a and P13b. By causing the control system CR to control the spatial light modulator 3 and polarization unit 5 as above, it is possible to form the pupil intensity distribution 21c of FIG. 12.

Figure 14:
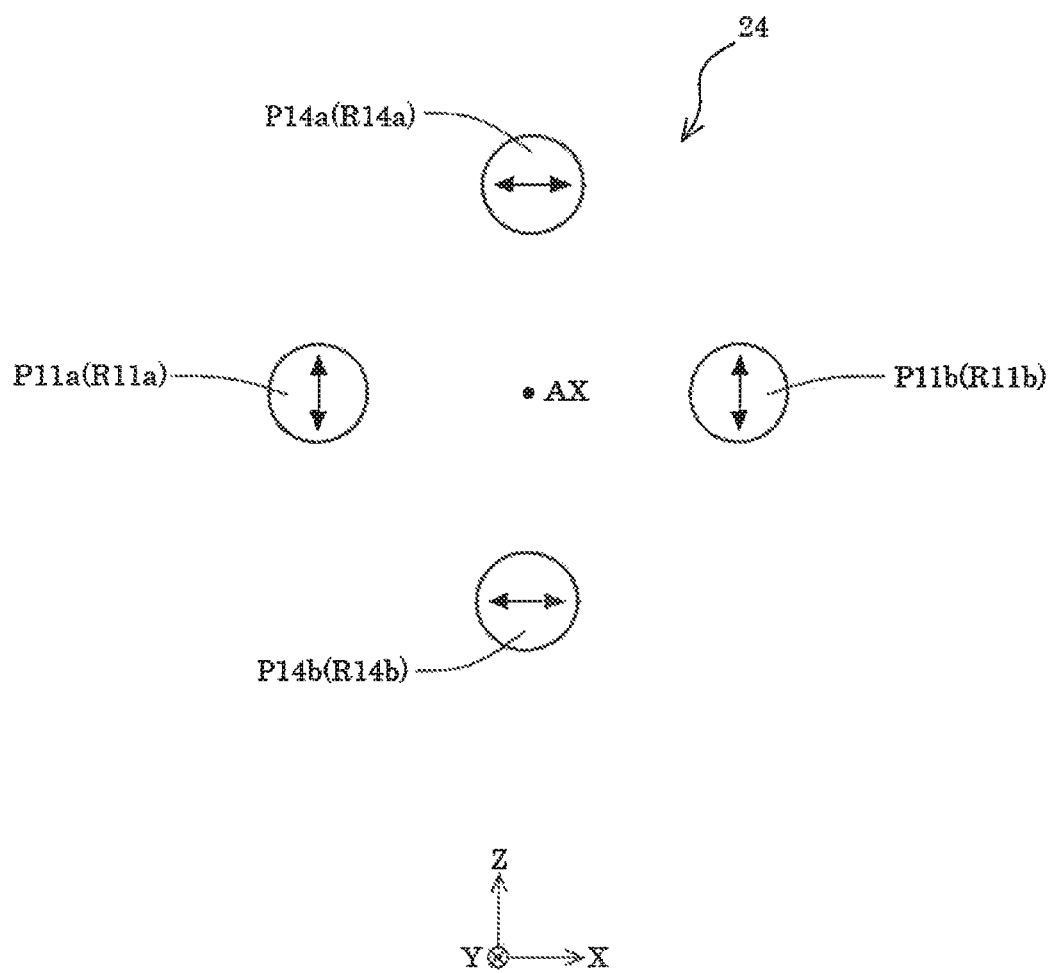
FIG. 14 shows a four pole-shaped pupil intensity distribution in a circumferential direction polarization state.

The above embodiment shows an example of causing the pair of optical rotation members 51 and 52 to affect the incident light beam F1. However, without being limited to this, it is also possible to withdraw, for example, the optical rotation member 51 from the optical path and cause the optical rotation member 52 alone to affect the incident light beam F1. On this occasion, by the edge 52b of the optical rotation member 52, the incident light beam F is divided into two partial light beams. One partial light beam (corresponding to the partial light beams F11+F12 of FIG. 6) is guided to the pupil regions R11a and R11b on the illumination pupil plane, as shown in FIG. 14, without passing through the optical rotation member 52, to form the surface light sources P11a and P11b of the Z direction linearly polarized light.

The other partial light beam (corresponding to the partial light beams F13+F14 of FIG. 6) is guided to the pupil regions R14a and R14b on the illumination pupil plane via the optical rotation member 52, to form the surface light sources P14a and P14b of the X direction linearly polarized light. In this manner, in the illumination pupil just downstream from the micro fly's eye lens 7, there is formed, for example, a four pole-shaped pupil intensity distribution 24 in a circumferential direction polarization state composed of four circular substantial surface light sources P11a and P11b, and P14a and P14b. By moving the optical rotation member 52 in the X direction, it is possible to relatively change the light intensity between the four surface light sources constituting the four pole-shaped pupil intensity distribution 24 while maintaining the circumferential direction polarization state.

Figure 15:
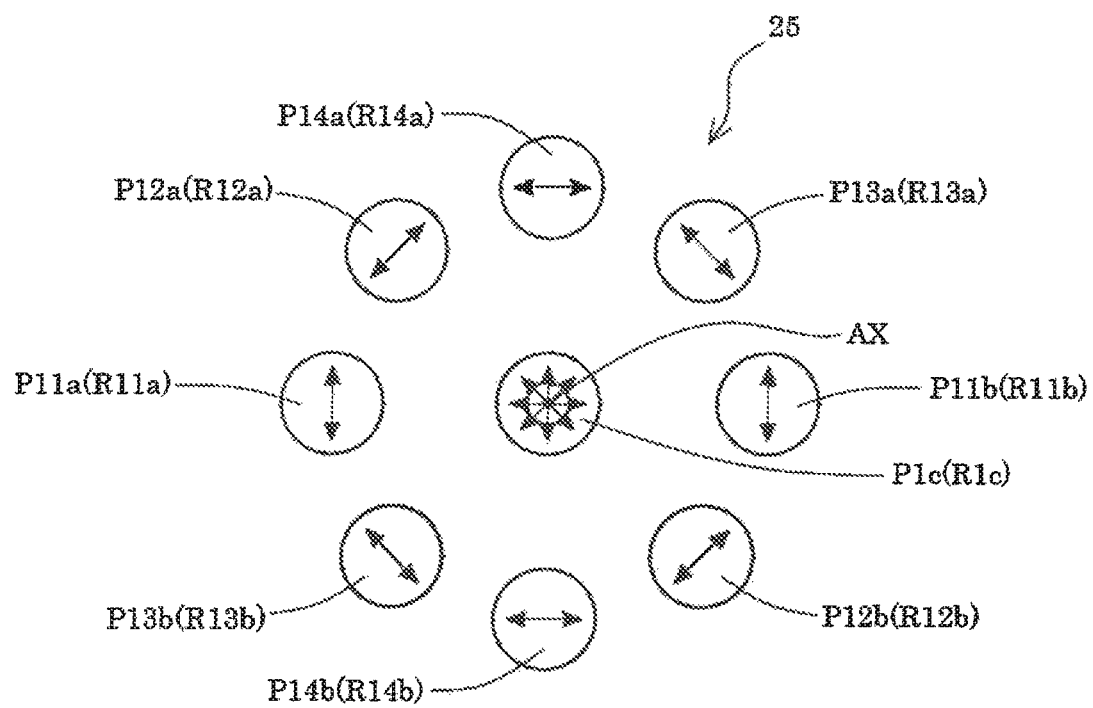
FIG. 15 shows a nine pole-shaped pupil intensity distribution obtained by adding a central pole to the eight pole-shaped pupil intensity distribution in a circumferential direction polarization state.

The above embodiment shows an example of forming the eight pole-shaped pupil intensity distribution 21a in the circumferential direction polarization state. However, without being limited to this, by only controlling the spatial light modulator 3 according to a command from the control system CR, as shown in FIG. 15, it is also possible to form a nine pole-shaped pupil intensity distribution 25 which is obtained by adding a central pole P1c to the eight pole-shaped pupil intensity distribution 21a. In the example shown in FIG. 15, part of the first partial light beam F11, part of the second partial light beam F12, part of the third partial light beam F13, and part of the fourth partial light beam F14 are guided to, for example, a circular pupil region R1c around the optical axis AX on the illumination pupil plane, to form the surface light source P1c in a substantial non-polarization state in which four linear polarization components coexist.

Figure 16:
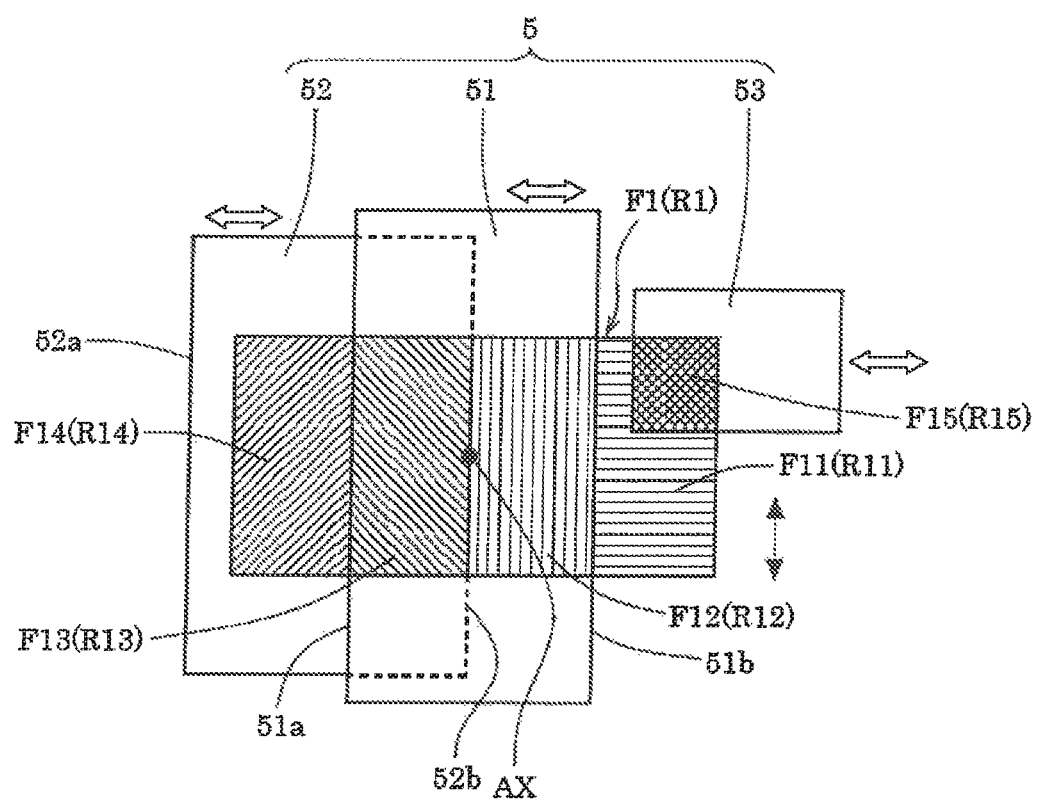
FIG. 16 shows an example of a configuration of a polarization unit provided with a depolarizing element insertable to and removable from an illumination optical path.

Alternatively, as shown in FIG. 16, it is also possible to form the nine pole-shaped pupil intensity distribution 25 by providing the polarization unit 5 additionally with a depolarization element 53 insertable to and removable from the illumination optical path. The depolarization element 53 is insertable and removable in a position optically conjugate with the arrangement plane of the spatial light modulator 3 or in its vicinity. The depolarization element 53 can be constructed of a first deflection prism (wedge-like plate) which is made of a birefringent material such as crystal and whose thickness varies with the passage position of light beam, and a second deflection prism which is made of a non-birefringent material such as silica glass and functions as a correcting plate for restoring the light beams deflected by the deflection effect of the first deflection prism to the original state, arranged in this order from the incident side of the light. Further, reference can also be made to a depolarizer disclosed in U.S. Pat. No. 7,423,731.

In the example of FIG. 16, among the incident light beam F1, the light beam at the +X direction side of the edge 51*b* of the optical rotation member 51 is divided into the first partial light beam F11 travelling toward the relay optical system 6 without passing through the depolarization element 53, and a fifth partial light beam F15 travelling toward the relay optical system 6 via the depolarization element 53.

Figure 17:
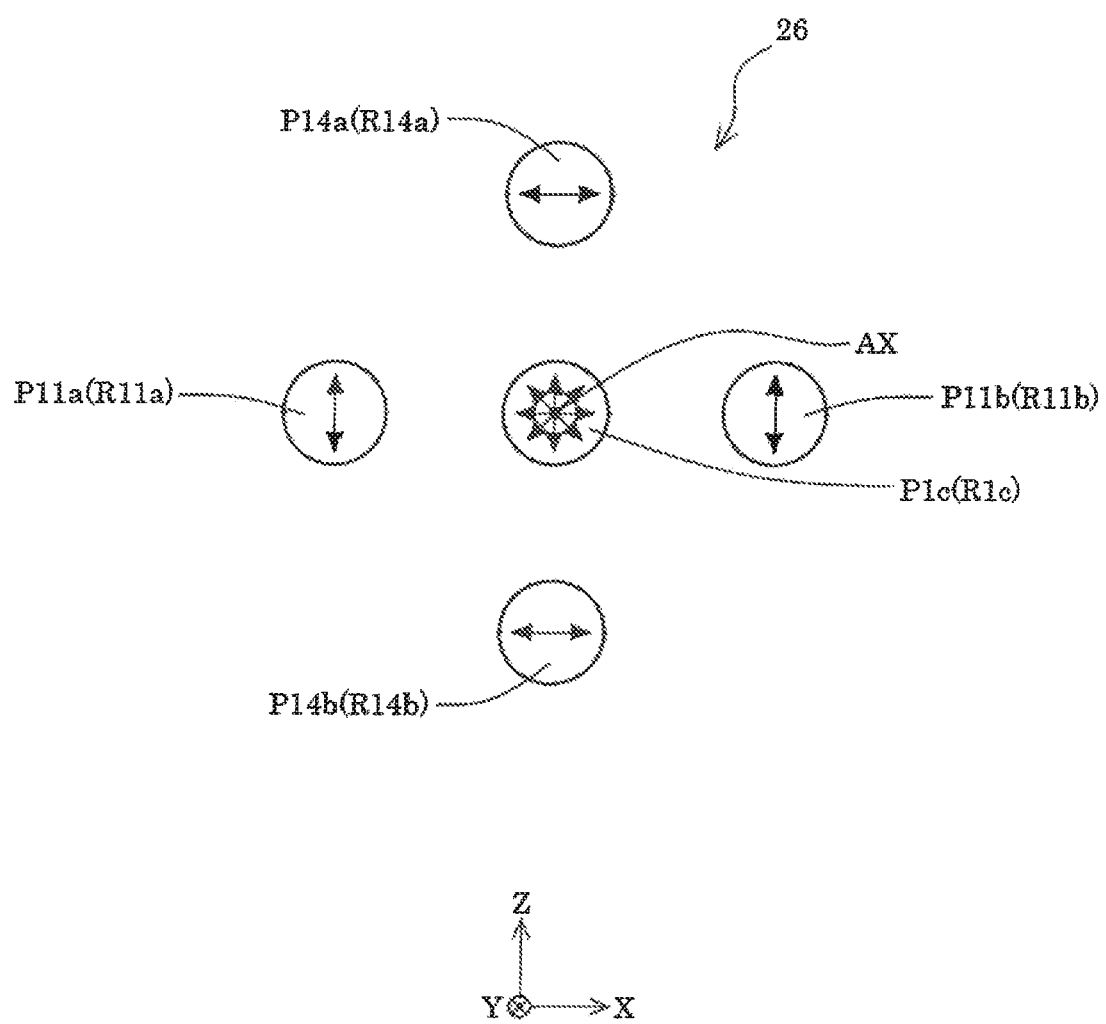
FIG. 17 shows a five pole-shaped pupil intensity distribution obtained by adding a central pole to the four pole-shaped pupil intensity distribution in the circumferential direction polarization state.

The first partial light beam F11 is guided to the pupil regions R11*a* and R11*b* shown in FIG. 15 without passing through the optical rotation members 51 and 52 and depolarization element 53, to form the surface light sources P11*a* and P11*b* of the Z direction linearly polarized light. The fifth partial light beam F115 is guided to the pupil region R1*c* shown in FIG. 15 only via the depolarization element 53 without passing through the optical rotation members 51 and 52, to form the surface light source P1*c* in the non-polarization state. Further, in the example of FIG. 16, by withdrawing the optical rotation member 51 from the optical path and causing the optical rotation member 52 and depolarization element 53 to affect the incident light beam F1, as shown in FIG. 17, it is also possible to form a five pole-shaped pupil intensity distribution 26 obtained by adding the central pole P1*c* in the non-polarization state to the four pole-shaped pupil intensity distribution 24.

Figure 18:
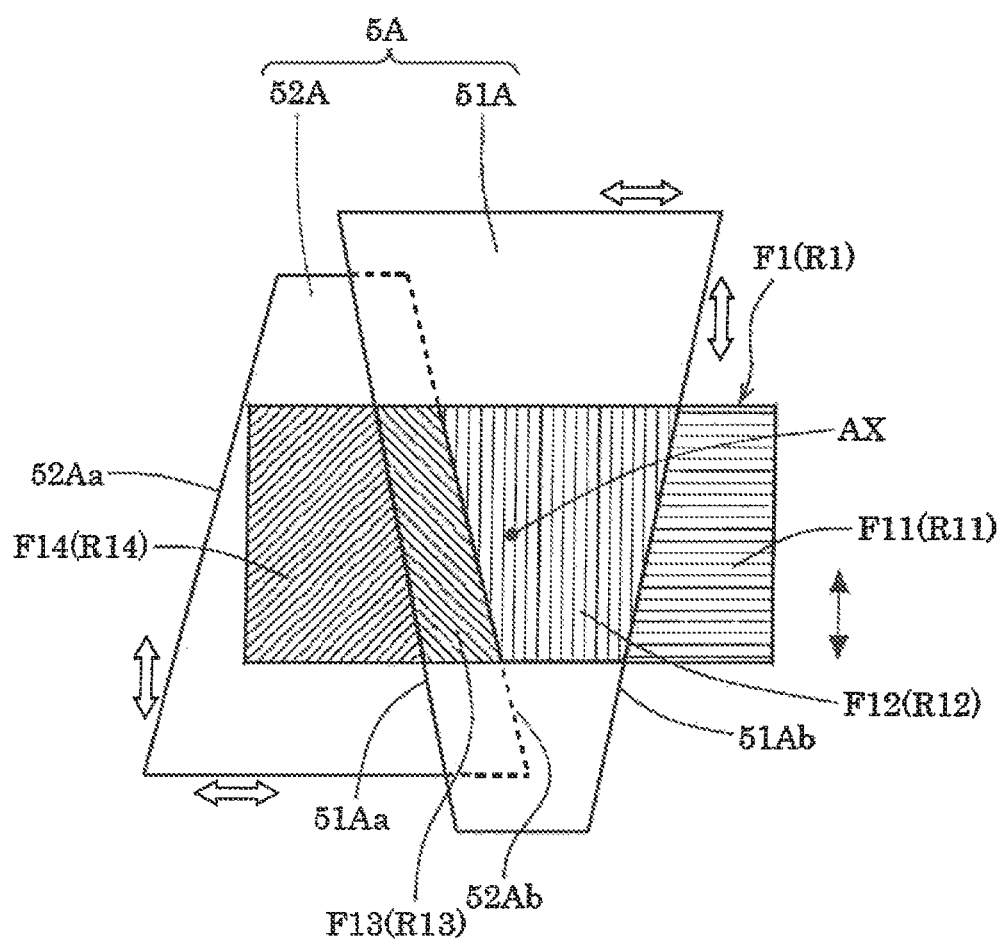
FIG. 18 shows an example of a configuration for controlling the cross-sectional area of each partial light beam in a mutually independent manner by using a polarization unit composed of a pair of optical rotation members having trapezoidal outer shapes.

The above embodiment shows an example of the polarization unit 5 including the optical rotation members 51 and 52 being movable in the X direction and having the pairs of edges 51*a* and 51*b* and edges 52*a* and 52*b* extending in the Y direction. In this case, although it is possible to change the ratio between the cross-sectional area of the first partial light beam F11, the cross-sectional area of the second partial light beam F12, the cross-sectional area of the third partial light beam F13, and the cross-sectional area of the fourth partial light beam F14, it is not possible to control the cross-sectional area of each partial light beam in a mutually independent manner. FIG. 18 shows an example of using a polarization unit 5A constructed from a pair of optical rotation members 51A and 52A having a trapezoidal outer shape (contour) to control the cross-sectional area of each partial light beam in a mutually independent manner.

In the example shown in FIG. 18, the optical rotation member 51A has a first edge 51Aa extending in a direction obliquely intersecting the Y direction along which there extends one pair of sides of the rectangular cross section of the incident light beam F1, and a second edge 51Ab extending in a direction intersecting the Y direction obliquely but differing from the direction along which the first edge 51Aa extends. Likewise, the optical rotation member 52A arranged adjacently on the emission side of the optical rotation member 51A has a first edge 52Aa extending in a direction intersecting the Y direction obliquely, and a second edge 52Ab extending in a direction intersecting the Y direction obliquely but differing from the direction along which the first edge 52Aa extends. The optical rotation members 51A and 52A are movable in the X direction and in the Y directions, and consequently, movable two-dimensionally along a cross section (X-Y plane) of the incident light beam F1.

In the example shown in FIG. 18, the optical rotation members 51A and 52A having the edges 51Aa and 51Ab, and 52Aa and 52Ab extending in the directions obliquely intersecting the Y direction along which there extends the one pair of sides of the cross section of the incident light beam F1, are moved two-dimensionally along the cross section of the incident light beam F1. By doing so, it is possible to control the cross-sectional area of the first partial light beam F11, the cross-sectional area of the second partial light beam F12, the cross-sectional area of the third partial light beam F13, and the cross-sectional area of the fourth partial light beam F14, in a mutually independent manner. As a result, it is possible to further raise the degree of freedom with respect to relative change of the light intensities of respective surface light sources constituting, for example, the eight pole-shaped pupil intensity distribution 21*a*. According to this configuration, even if the light intensity distribution of the incident light beam F1 is not uniform and changes with the passage of time, it is still possible to maintain a desired relative relation between the light intensities of the respective surface light sources constituting, for example, the eight pole-shaped pupil intensity distribution 21*a*.

Figure 19:
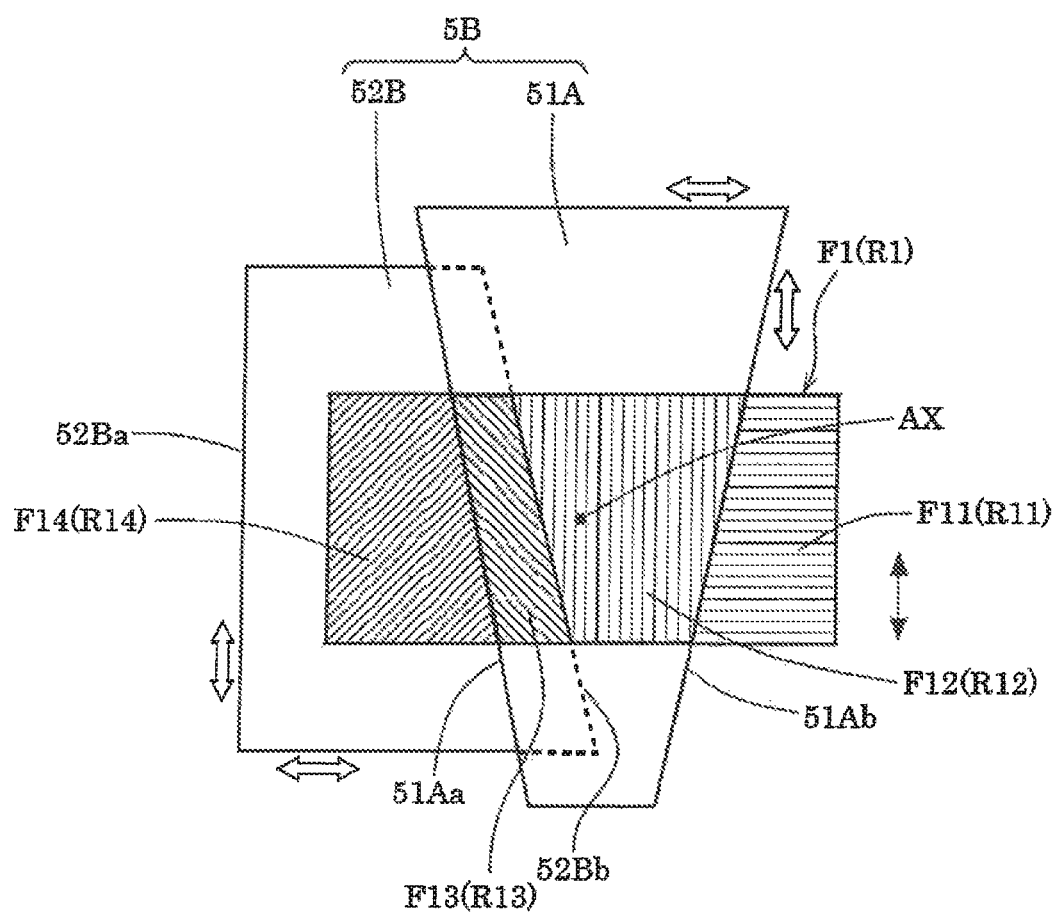
FIG. 19 shows a first modification of FIG. 18.
Figure 20:
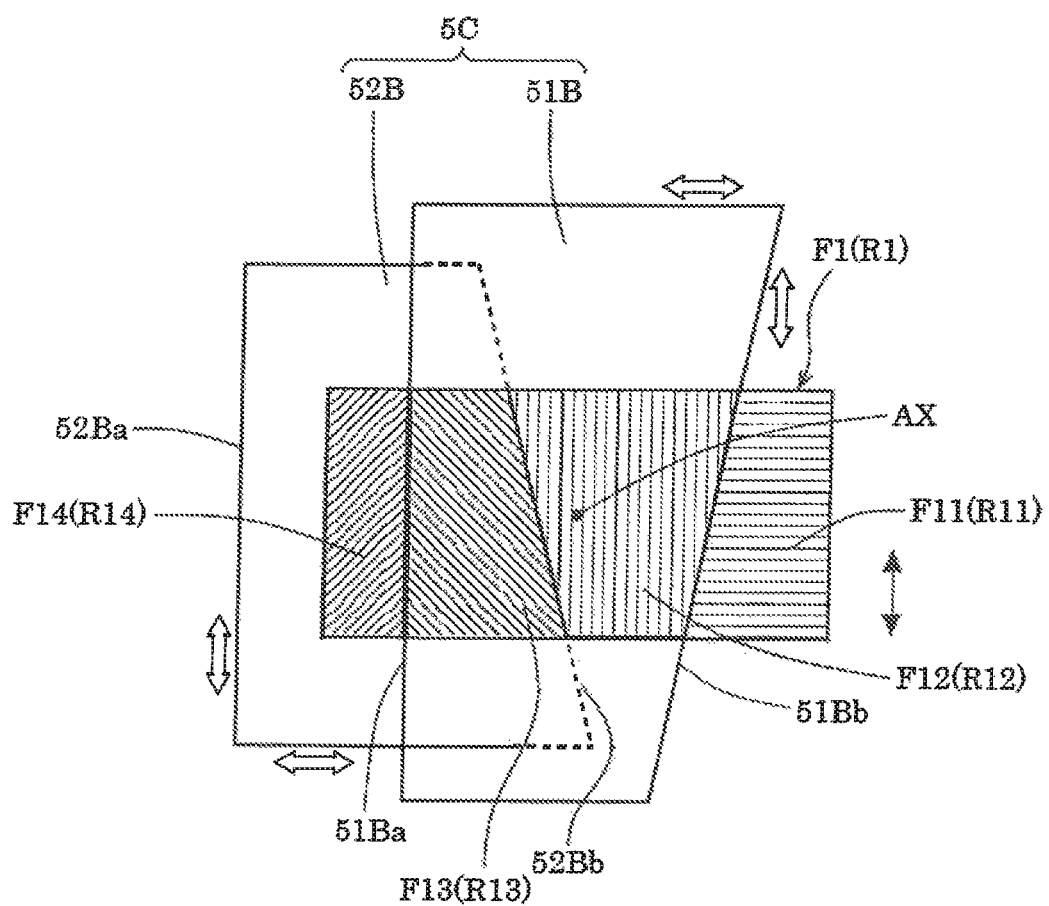
FIG. 20 shows a second modification of FIG. 18.

Further, FIG. 18 shows an example that the pair of optical rotation members 51A and 52A constituting the polarization unit 5A both have a trapezoidal outer shape. However, without being limited to this, it is possible to adopt various forms for the outer shape of the pair of optical rotation members constituting the polarization unit. For example, as shown in FIG. 19, it is also possible to adopt a modification in which it is used a polarization unit 5B including an optical rotation member 52B instead of the optical rotation member 52A of FIG. 18, the optical rotation member 52B having a first edge 52Ba extending in the Y direction, and a second edge 52Bb extending in a direction obliquely intersecting the Y direction. Further, as shown in FIG. 20, it is also possible to adopt another modification in which it is used a polarization unit SC including an optical rotation member 51B instead of the optical rotation member 51A of FIG. 19, the optical rotation member 51B having a first edge 51Ba extending in the Y direction, and a second edge 51Bb extending in a direction obliquely intersecting the Y direction.

Although, in the above embodiment, the parallel light beam along the optical axis AX is supposed to come into the polarization unit 5, there is in reality also some light which comes into the polarization unit 5 obliquely to the optical axis AX (which does not vertically comes into the optical rotation members 51 and 52). In this case, the linearly polarized light vertically coming into the optical rotation member 51 or 52 formed of crystal maintains its linear polarization state while only changing its polarization direction, but the linearly polarized light obliquely coming into the optical rotation member 51 or 52 is elliptically polarized and then emitted therefrom. This is because the light obliquely coming into the optical rotation member 51 or 52 propagates obliquely to the crystalline optic axis of crystal, and therefore is imparted with a phase difference.

Figure 21:
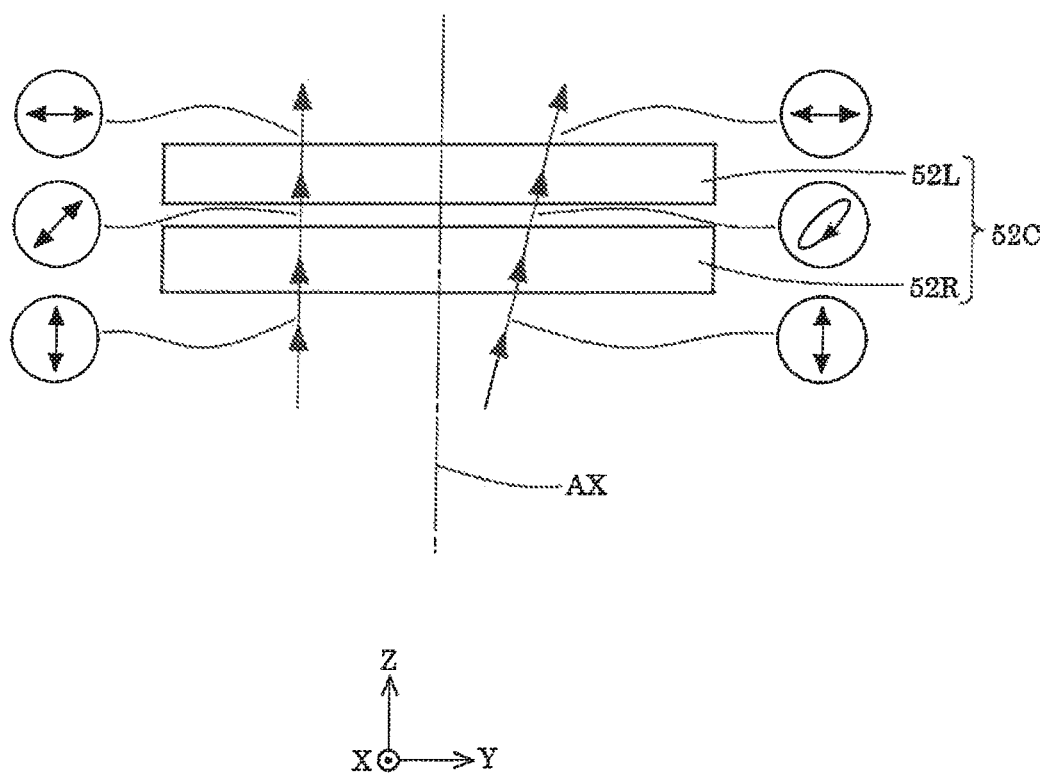
FIG. 21 shows an example of configuration in which it is used an optical rotation member composed of a clockwise optical rotation member and a counterclockwise optical rotation member.

Hence, as shown in FIG. 21, it is also possible to adopt a configurational example of using, for example, an optical rotation member 52C, instead of the optical rotation member 52, which includes a first optical rotation member 52R formed of a clockwise optical rotation member (clockwise-rotation crystal), and a second optical rotation member 52L formed of a counterclockwise optical rotation member (counterclockwise-rotation crystal) and arranged adjacently on the emission side of the first optical rotation member 52R. In the example of FIG. 21, the longitudinally polarized light vertically coming into the first optical rotation member 52R is first transformed into an obliquely polarized light, then transformed by the second optical rotation member 52L into a transversely polarized light, and finally emitted therefrom. The longitudinally polarized light obliquely coming into the first optical rotation member 52R is first transformed into an elliptically polarized light, then transformed by the second optical rotation member 52L into a transversely polarized light, and finally emitted therefrom. That is, the light obliquely coming into the optical rotation member 52C is also emitted from the optical rotation member 52C in the same polarization state as the emission light resulting from the light vertically coming into the optical rotation member 52C.

Further, instead of the configuration of FIG. 21 (or in addition to the configuration of FIG. 21), as shown in FIG. 22, it is also possible to adopt a configuration of arranging a phase difference imparting member 11 at the position of the pupil plane 4c of the relay optical system 4, which is an optical Fourier transform plane of the arrangement plane of the spatial light modulator 3, or in its vicinity, to impart the incident light with phase differences which are different based on the incident position. In the configuration of FIG. 22, an incident position for the phase difference imparting member 11 is converted into an incident angle for the polarization unit 5 by the effect of the back side lens group 4b of the relay optical system 4.

As described above, an amount of elliptical polarization changes according to the incident angle to the optical rotation members 51 and 52. However, in the configuration of FIG. 22, because the phase difference imparting member 11 imparts in advance a phase difference to set off (or compensate) the change of the amount of the elliptical polarization caused at the polarization unit 5 in accordance with the incident angle for the polarization unit 5. Thus, the light obliquely coming into the polarization unit 5 is emitted from the polarization unit 5 in the same polarization state as the emission light resulting from the vertically incident light. Further, it is also possible to adopt a configuration of arranging the phase difference imparting member 11 on an optical Fourier transform plane of the arrangement plane of the spatial light modulator 3 in the optical path on the downstream side of the polarization unit 5.

Figure 23A:
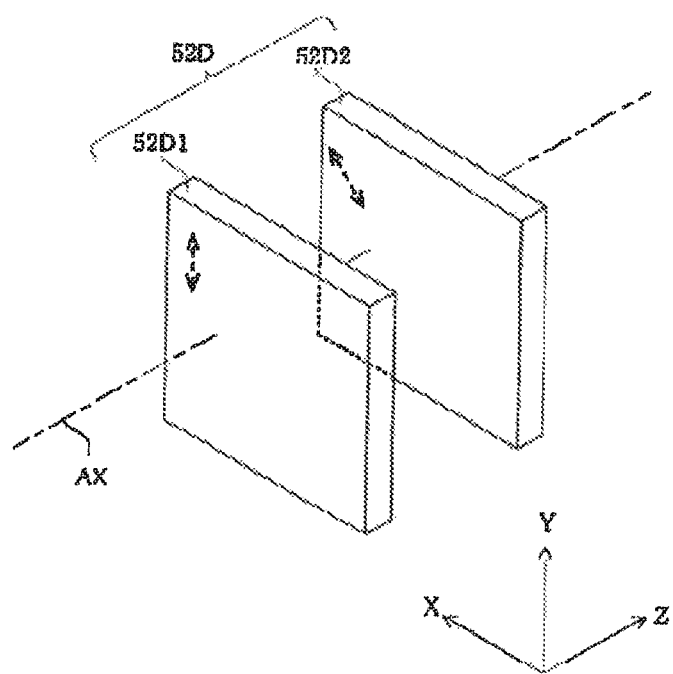
FIGS. 23A to 23C show an example of forming an optical element equivalent to an optical rotator by using a pair of wave plates.
Figure 23B:
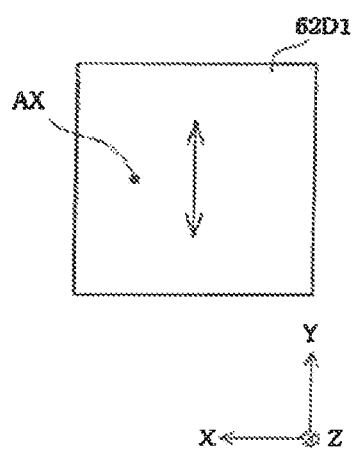
Figure 23C:
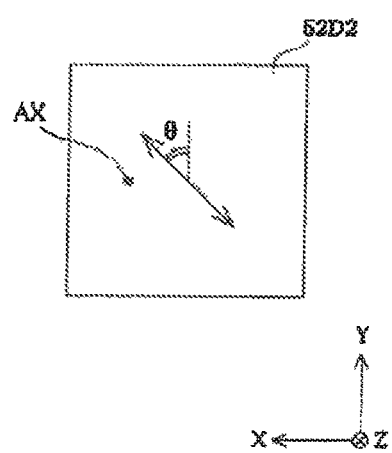

Further, as shown in FIGS. 23A to 23C, it is also possible to adopt a configuration of obtaining, for example, a polarization rotator 52D, instead of the optical rotation member 52, by combining a ½ wave plate 52D1 with an optic axis in a first direction (the Y direction here) within a plane (within the X-Y plane) orthogonal to the optical axis AX of the illumination optical system, and a ½ wave plate 52D2 with an optic axis in a second direction within a plane (within the X-Y plane) orthogonal to the optical axis AX of the illumination optical system. Here, FIG. 23B is an X-Y plane view of the ½ wave plate 52D1, while FIG. 23C is an X-Y plane view of the ½ wave plate 52D2. Just as shown in FIG. 23C, the second direction, i.e., the direction along the optic axis of the ½ wave plate 52D2, is a direction obtained by rotating the first direction by an angle θ.

Now, a Mueller matrix will be used to explain the effects of the ½ wave plate 52D1 and the ½ wave plate 52D2. The Mueller matrix is disclosed in, for example, the document "Edited by Michael Bass et al.: HANDBOOK OF OPTICS, Chapter 22: Polarimetry, pp. 22-8 to 22-14, by McGRAW-HILL, Inc., 1995, in the United States".

The following expression 1 denotes the Mueller matrix expressing the polarization effect of the ½ wave plate 52D1, while the following expression 2 denotes the Mueller matrix expressing the polarization effect of the ½ wave plate 52D2.

[Expressions I]

$$\begin{pmatrix} 1 & 0 & 0 & 0 \\ 0 & 1 & 0 & 0 \\ 0 & 0 & -1 & 0 \\ 0 & 0 & 0 & -1 \end{pmatrix} \quad (1)$$

$$\begin{pmatrix} 1 & 0 & 0 & 0 \\ 0 & \cos 4\theta & \sin 4\theta & 0 \\ 0 & \sin 4\theta & -\cos 4\theta & 0 \\ 0 & 0 & 0 & -1 \end{pmatrix} \quad (2)$$

Then, the following expression 3 denotes the Mueller matrix expressing the polarization effect of the optical element obtained by combining those ½ wave plates 52D1 and 52D2.

[Expression II]

$$\begin{pmatrix} 1 & 0 & 0 & 0 \\ 0 & 1 & 0 & 0 \\ 0 & 0 & -1 & 0 \\ 0 & 0 & 0 & -1 \end{pmatrix} \begin{pmatrix} 1 & 0 & 0 & 0 \\ 0 & \cos 4\theta & \sin 4\theta & 0 \\ 0 & \sin 4\theta & -\cos 4\theta & 0 \\ 0 & 0 & 0 & -1 \end{pmatrix} = \begin{pmatrix} 1 & 0 & 0 & 0 \\ 0 & \cos 4\theta & \sin 4\theta & 0 \\ 0 & -\sin 4\theta & \cos 4\theta & 0 \\ 0 & 0 & 0 & 1 \end{pmatrix} \quad (3)$$

The right-hand side of the expression 3 is the same as the Mueller matrix expressing the polarization effect of an optical rotator (azimuth rotator). That is, the optical element obtained by combining the ½ wave plates 52D1 and 52D2 is equivalent to an optical rotator (optical rotation member). Further, by setting 45 degrees (θ=45 degrees) for the direction of the optic axis of the ½ wave plate 52D2 relative to the direction of the optic axis of the ½ wave plate 52D1, the optical element becomes an optical rotator rotating the polarization direction of a linearly polarized incident light by 90 degrees and, by changing the setting angle θ, it is possible to rotate the polarization direction of the linearly polarized incident light by any angle. In the modification of FIGS. 23A to 23C, it is possible to combine the ½ wave plates 52D1 and 52D2 into a layered body and rotate the one body integrally, and it is also possible to separate the ½ wave plate 52D1 from the ½ wave plate 52D2 and rotate the two separated members relatively.

The modification of FIGS. 23A to 23C does not use an optical rotator whose optic axis is oriented along the light incident direction, but uses the wave plates whose optic axes are oriented within a plane almost orthogonal to the light incident direction. Thus, it is possible to secure a wide range of allowable incident angle within which a desired polarization modulation can be maintained. Therefore, even if there is an angular distribution in the light beam coming into the polarization unit 5 (polarization rotator 52D), it is still possible to exert a polarization rotation effect on all light beams in the angular distribution without causing change of the degree of orvalization (degree of elliptical polarization).

Consequently, it is easy to set each surface light source constituting the pupil intensity distribution to a desired polarization state.

Figure 24:
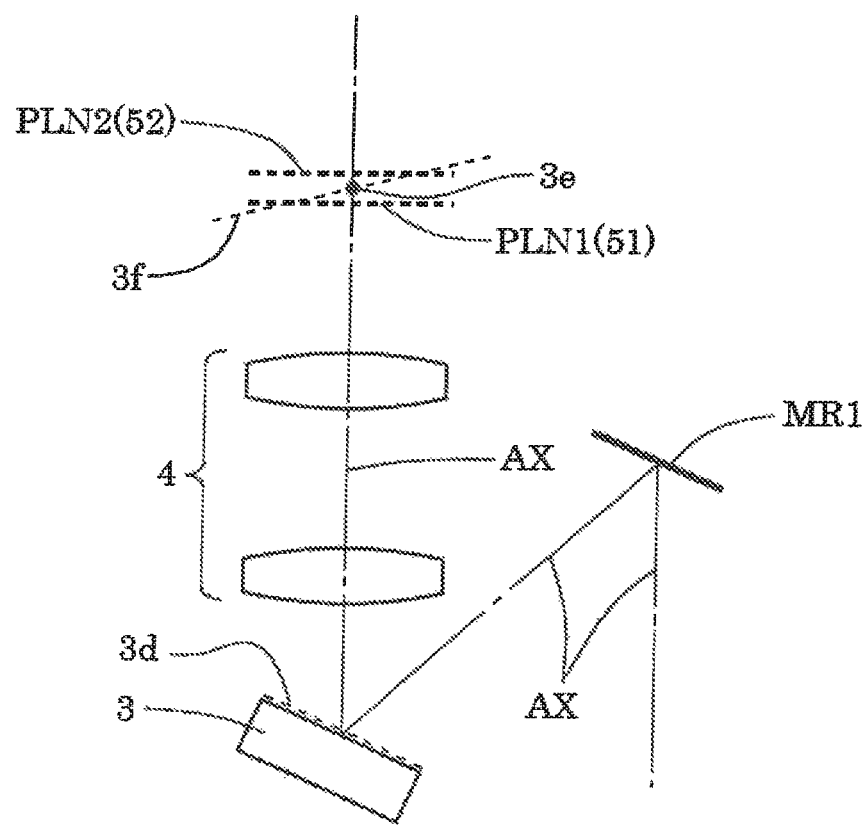
FIG. 24 shows a specific example of arrangement of the pair of optical rotation members constituting the polarization unit.

In the above embodiment, it is supposed to arrange the optical rotation members 51 and 52 adjacent to each other in a position optically conjugate with the arrangement plane of the spatial light modulator 3. In reality, however, it is not possible to arrange the pair of optical rotation members 51 and 52 in the same position. Therefore, in particular as shown in FIG. 24, it is possible to arrange the pair of optical rotation members 51 and 52 across a position 3e optically conjugate with an arrangement plane 3d of the spatial light modulator 3. The conjugate position 3e is defined as the point at which the optical axis AX of the relay optical system 4 intersects a plane 3f optically conjugate with the arrangement plane 3d.

Figure 25:
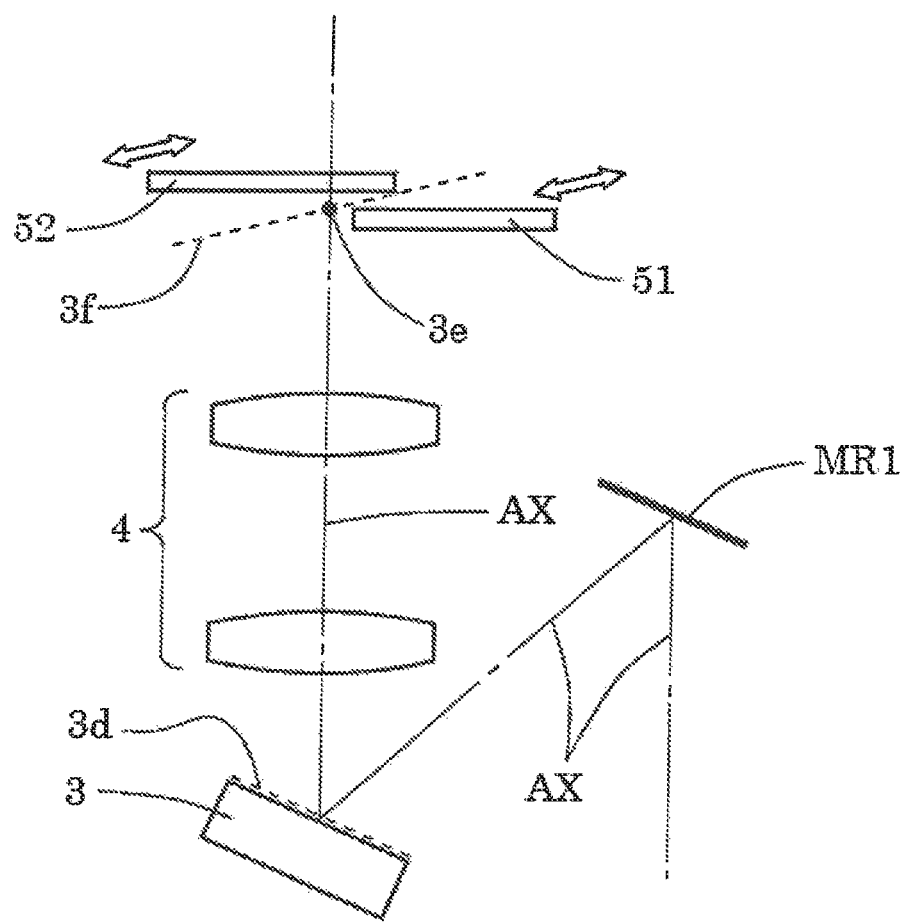
FIG. 25 shows an example of moving the pair of optical rotation members arranged parallel to a plane orthogonal to the optical axis, in a direction parallel to a plane conjugate with the arrangement plane of the spatial light modulator.

Similar to the arrangement plane 3d, the plane 3f optically conjugate with the arrangement plane 3d is inclined with respect to a plane orthogonal to the optical axis AX. The inclination of the plane 3f with respect to the plane orthogonal to the optical axis AX decreases as the absolute value of the image forming magnification of the relay optical system 4 increases. The optical rotation member 51 is arranged along a plane PLN1 orthogonal to the optical axis AX in a position just a little upstream from the position 3e, while the optical rotation member 52 is arranged along a plane PLN2 orthogonal to the optical axis AX in a position just a little downstream from the position 3e. On this occasion, it is possible to respectively move the pair of optical rotation members 51 and 52 along the plane PLN1 and the plane PLN2 or, as shown in FIG. 25 for example, to move the pair of optical rotation members 51 and 52 along a plane parallel to the plane 3f conjugate with the arrangement plane 3d of the spatial light modulator 3.

Figure 26:
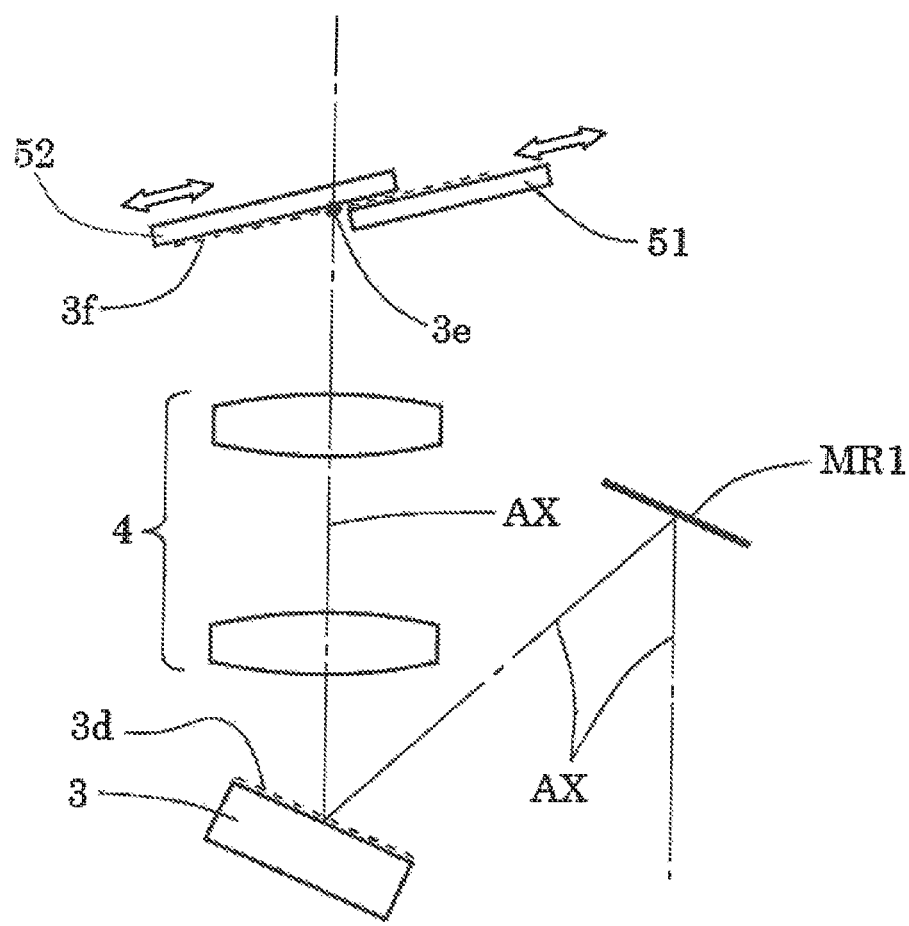
FIG. 26 shows an example of moving the pair of optical rotation members arranged parallel to the plane conjugate with the arrangement plane of the spatial light modulator, in a direction parallel to the conjugate plane.

Further, in the above embodiment, as shown in FIG. 26 for example, it is also possible to arrange the pair of optical rotation members 51 and 52 along a plane parallel to the plane 3f conjugate with the arrangement plane 3d of the spatial light modulator 3, and move the pair of optical rotation members 51 and 52 along the plane parallel to the conjugate plane 3f. On this occasion, the pair of optical rotation members 51 and 52 may be arranged adjacent to each other in a direction along the illumination optical path, and may be arranged across the conjugate plane 3f.

In the above embodiment, the pair of optical rotation members 51 and 52 are arranged adjacent to each other to constitute the polarization unit 5. However, without being limited to this, it is also possible to adopt a configuration in which a relay optical system is arranged between the optical rotation members 51 and 52 such that the optical rotation member 51 and the optical rotation member 52 are optically conjugate with each other.

In the above embodiment, the optical rotation members 51 and 52 are formed of crystal. However, without being limited to this, it is also possible to use other suitable optical materials having optical rotation property to form the optical rotation members.

In the above embodiment, the polarization unit 5 is constructed from the pair of optical rotation members (optical elements) 51 and 52 formed of an optical material having optical rotation property. However, without being limited to this, it is also possible to adopt various configurations for the outer shape, number, arrangement, optical property, etc. of the optical elements constituting the polarization unit. For example, it is possible to construct the polarization unit by using a wave plate changing the incident light into the light in a predetermined polarization state, or construct the polarization unit by using a polarizer selecting light in a predetermined polarization state from the incident light to emit the selected light. Further, if a polarizer is used to construct the polarization unit, then, for example, the light having a non-polarization state is made incident.

Figure 27:
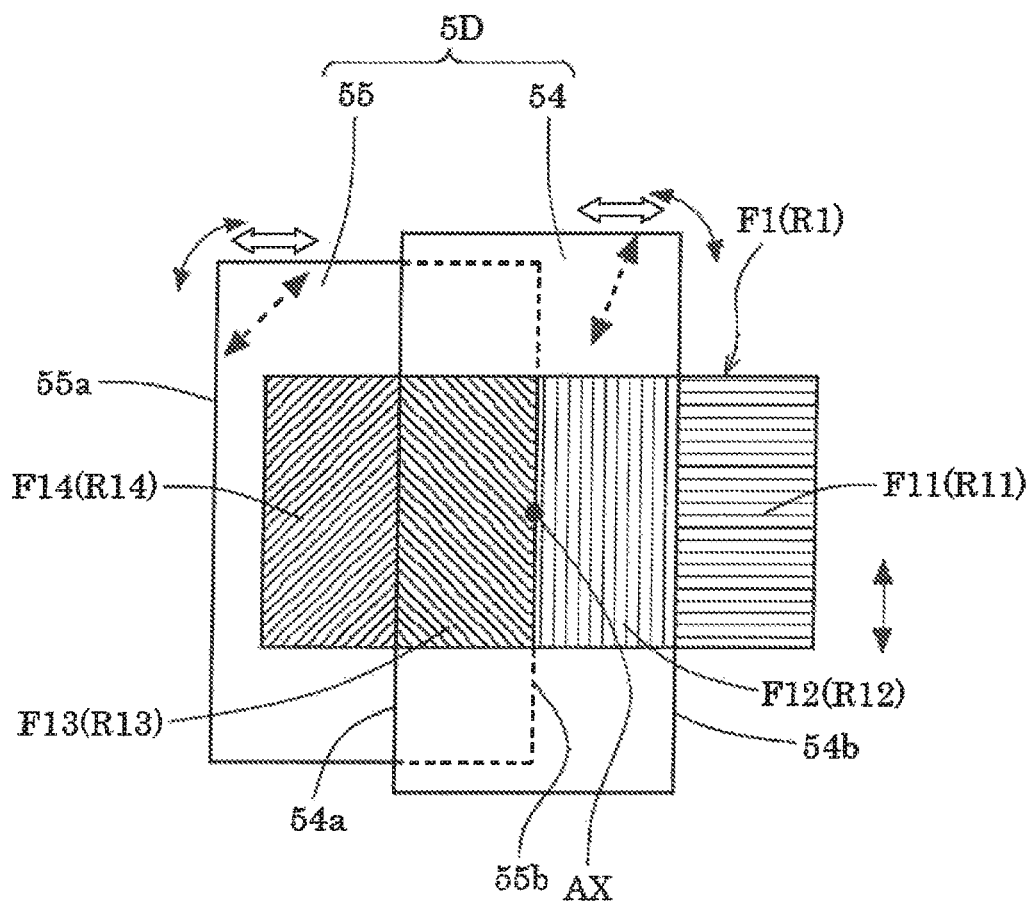
FIG. 27 shows a modification in which it is used a pair of wave plates to constitute a polarization unit.
Figure 28:
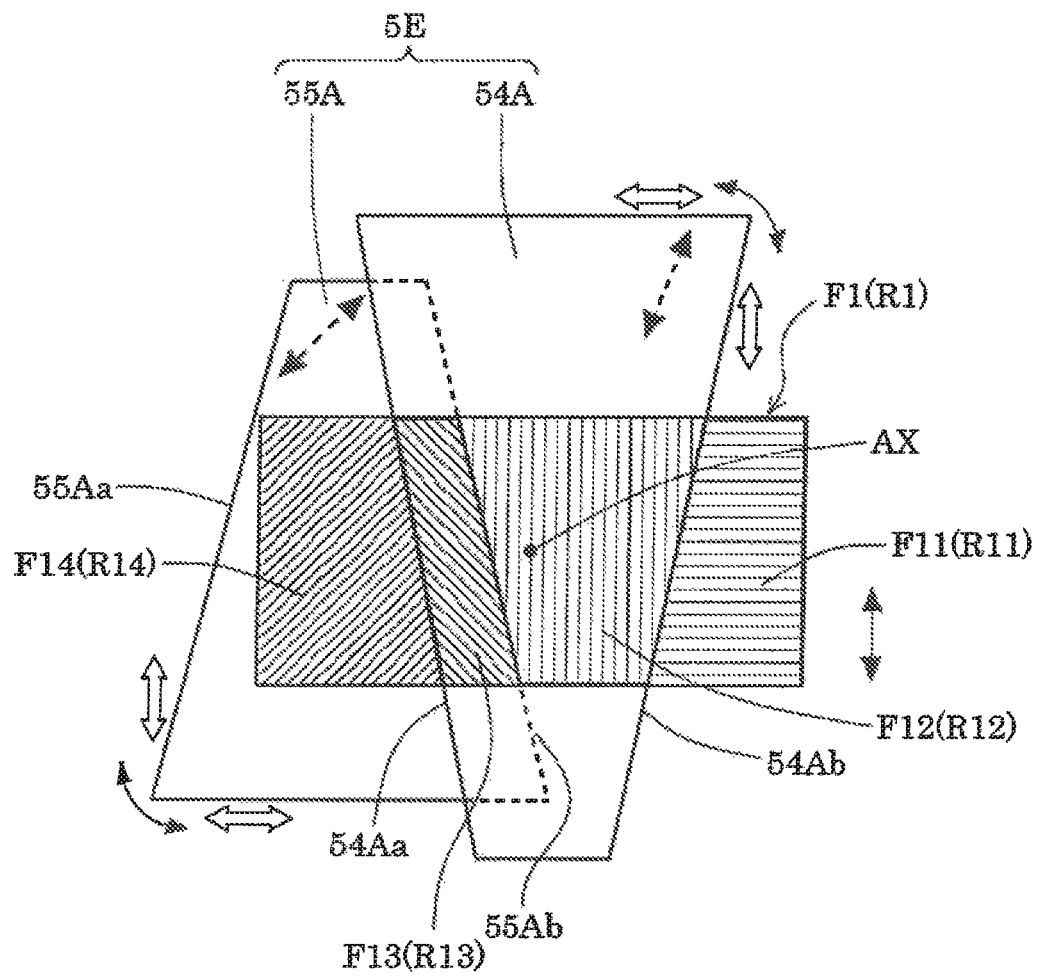
FIG. 28 shows another modification in which it is used a pair of wave plates to constitute a polarization unit.

Referring to FIGS. 27 and 28, an explanation will be given about another modification using a pair of wave plates to construct a polarization unit. Referring to FIG. 27, a polarization unit 5D includes a ½ wave plate 54 having the same outer shape as the optical rotation member 51 of the polarization unit 5 and being arranged in the same manner as the optical rotation member 51, and a ½ wave plate 55 having the same outer shape as the optical rotation member 52 and being arranged in the same manner as the optical rotation member 52. That is, the ½ wave plates 54 and 55 respectively have a pair of edges 54a and 54b and a pair of edges 55a and 55b extending in the Y direction.

The ½ wave plate 54 has an optic axis in a direction obtained by rotating the Y direction clockwise by +22.5 degrees in its standard state and, consequently, has the same polarization transformation property as the optical rotation member 51. The ½ wave plate 55 has an optic axis in a direction obtained by rotating the Y direction clockwise by +45 degrees in its standard state and, consequently, has the same polarization transformation property as the optical rotation member 52. The ½ wave plates 54 and 55 are movable in the X direction and in the Y direction and, consequently, movable two-dimensionally along a cross section of the incident light beam F1 (the X-Y plane). Further, the ½ wave plates 54 and 55 are rotatable along the cross section of the incident light beam F1 (the X-Y plane) and, consequently, able to adjust the directions of the optic axes.

The polarization unit 5D constructed by using the pair of ½ wave plates 54 and 55 fulfills the same function as the polarization unit 5 constructed from the pair of optical rotation members 51 and 52. Further, different from the polarization unit 5, the polarization unit 5D can adjust the polarization state of each surface light source constituting, for example, the eight pole-shaped pupil intensity distribution 21a by changing the directions of the optic axes of the ½ wave plates 54 and 55.

Referring to FIG. 28, a polarization unit 5E includes a ½ wave plate 54A having the same outer shape as the optical rotation member 51A of the polarization unit 5A and being arranged in the same manner as the optical rotation member 51A, and a ½ wave plate 55A having the same outer shape as the optical rotation member 52A and being arranged in the same manner as the optical rotation member 52A. That is, the ½ wave plates 54A and 55A respectively have a pair of edges 54Aa and 54Ab and a pair of edges 55Aa and 55Ab extending in a direction obliquely intersecting the Y direction along which the one pair of sides of the cross section of the incident light beam F1 extend.

The ½ wave plate 54A has an optic axis in a direction obtained by rotating the Y direction clockwise by +22.5 degrees in its standard state and, consequently, has the same polarization transformation property as the optical rotation member 51A. The ½ wave plate 55A has an optic axis in a direction obtained by rotating the Y direction clockwise by +45 degrees in its standard state and, consequently, has the same polarization transformation property as the optical rotation member 52A. The ½ wave plates 54A and 55A are movable in the X direction and in the Y direction and, consequently, movable two-dimensionally along the cross section of the incident light beam F1 (the X-Y plane). Further, the ½ wave plates 54A and 55A are rotatable along the cross section of the incident light beam F1 (the X-Y plane) and, consequently, able to adjust the directions of the optic axes.

The polarization unit 5E constructed by using the pair of ½ wave plates 54A and 55A fulfills the same function as the polarization unit 5A constructed from the pair of optical rotation members 51A and 52A. Further, different from the polarization unit 5A, the polarization unit 5E can adjust the polarization state of each surface light source constituting, for example, the eight pole-shaped pupil intensity distribution 21a by changing the directions of the optic axes of the ½ wave plates 54A and 55A.

In the above embodiment, the polarization unit 5 is arranged in a position conjugate with the arrangement plane of the spatial light modulator 3 for the plurality of mirror elements 3a in the optical path on the illumination objective surface side of the spatial light modulator 3. However, without being limited to this, it is also possible to arrange the polarization unit 5 in a position conjugate with the arrangement plane of the spatial light modulator 3 for the plurality of mirror elements 3a in the optical path on the light source side of the spatial light modulator 3.

Figure 29:
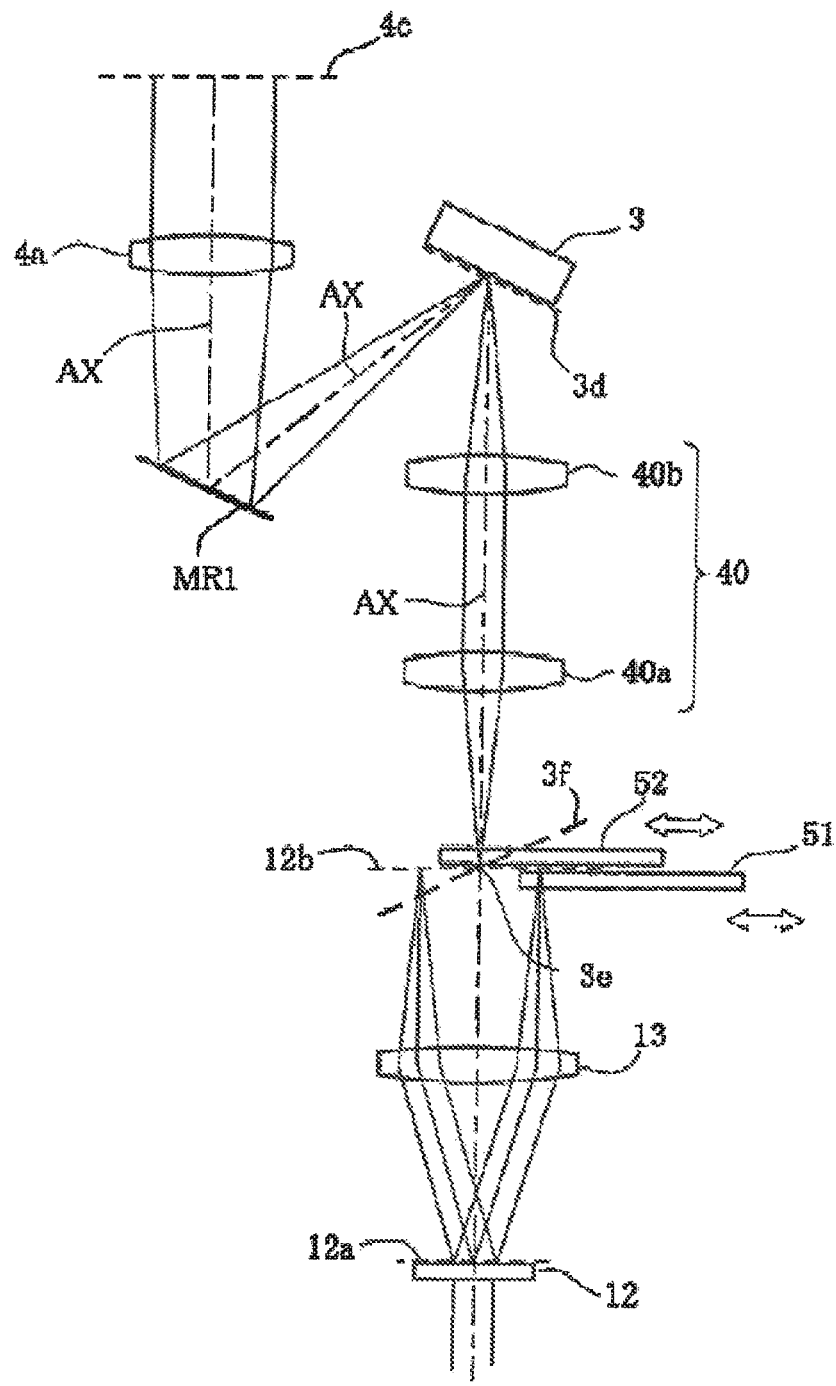
FIG. 29 shows a modification in which the polarization unit is arranged in a conjugate position in an optical path on the light source side of the spatial light modulator.

Referring to FIG. 29, an explanation will be given about still another modification arranging the polarization unit 5 in a position conjugate with the arrangement plane of the spatial light modulator 3 for the plurality of mirror elements 3a in the optical path on the light source side of the spatial light modulator 3. FIG. 29 shows an optical path from a light amount uniformization element (a light amount equalization element) 12 receiving the light from the light source 1, to the pupil plane 4c, of the relay optical system 4, which is an optical Fourier transform plane of the arrangement plane of the spatial light modulator 3. Regarding other configurations than the optical path shown in FIG. 29, reference can be made to FIG. 2. Further, the members having identical or similar functions to those of the members in the aforementioned embodiment and modifications are denoted by the reference numerals same as those of the members in the aforementioned embodiment and modifications.

In FIG. 29, the light from an unshown light source enters the light amount uniformization element 12 to undergo wavefront division. Each light beam resulted from the wavefront division by the light amount uniformization element 12 is emitted from the light amount uniformization element 12 at a predetermined divergence angle, and passes through a condenser optical system 13 having a front focal position on an arrangement plane of the light amount uniformization element 12, so as to illuminate a back focal plane 12b of the condenser optical system 13 in a superimposed (overlaid) manner. Then, an illumination field with a substantively uniform illuminance distribution is formed on the plane 12b and, an image of the illumination field is formed on the spatial light modulator 3 via a relay optical system 40.

That is, the relay optical system 40 makes the plane 12b and the spatial light modulator 3 optically conjugate with each other. Further, it is appropriate to say that the relay optical system 40 forms the position 3e conjugate with the arrangement plane 3d of the spatial light modulator 3 for the plurality of mirror elements 3a in the optical path on the light source side of the spatial light modulator 3. Here, the position 3e optically conjugate with the arrangement plane 3d of the spatial light modulator 3 is located on the plane 12b where the illumination field is formed by the light amount uniformization element 12 and the condenser optical system 13. Further, as the light amount uniformization element 12, it is possible to use, for example, a wavefront division element such as a refracting array element such as a fly's eye lens or the like, reflecting array element, diffracting array element, etc.

In the example of FIG. 29, it is possible to arrange the pair of optical rotation members 51 and 52 of the polarization unit 5 in the position 3e conjugate with the arrangement plane 3d of the spatial light modulator 3, to supply light beams in different polarization states to each of the mirror element groups of the plurality of mirror elements 3a of the spatial light modulator 3. Then, when setting each surface light source constituting the pupil intensity distribution via each of the plurality of mirror element groups of the spatial light modulator 3, because it is possible to secure a desired polarization state for each light beam to be supplied to the respective mirror element groups, it is possible to set a desired polarization state for each surface light source. In the example of FIG. 29, it is also possible to reduce the adverse influence of defocus at the edges of the polarization members of the polarization unit 5 (the optical rotation members 51 and 52). Further, it is also possible to combine the example of FIG. 29 with the configurations shown in the aforementioned embodiment and modifications.

Further, in the above embodiment and modifications, the polarization unit 5 is arranged in a position conjugate with the arrangement plane of the spatial light modulator 3 for the plurality of mirror elements 3a. However, it is also possible to use the polarization unit 5 in combination with a polarization unit 14 arranged in an optical Fourier transform plane of the arrangement plane of the spatial light modulator 3 for the plurality of mirror elements 3a to transform the linearly polarized incident light into a circumferential direction linearly polarized light or a radial direction linearly polarized light. This will be explained below with reference to FIGS. 30 to 32.

Figure 30:
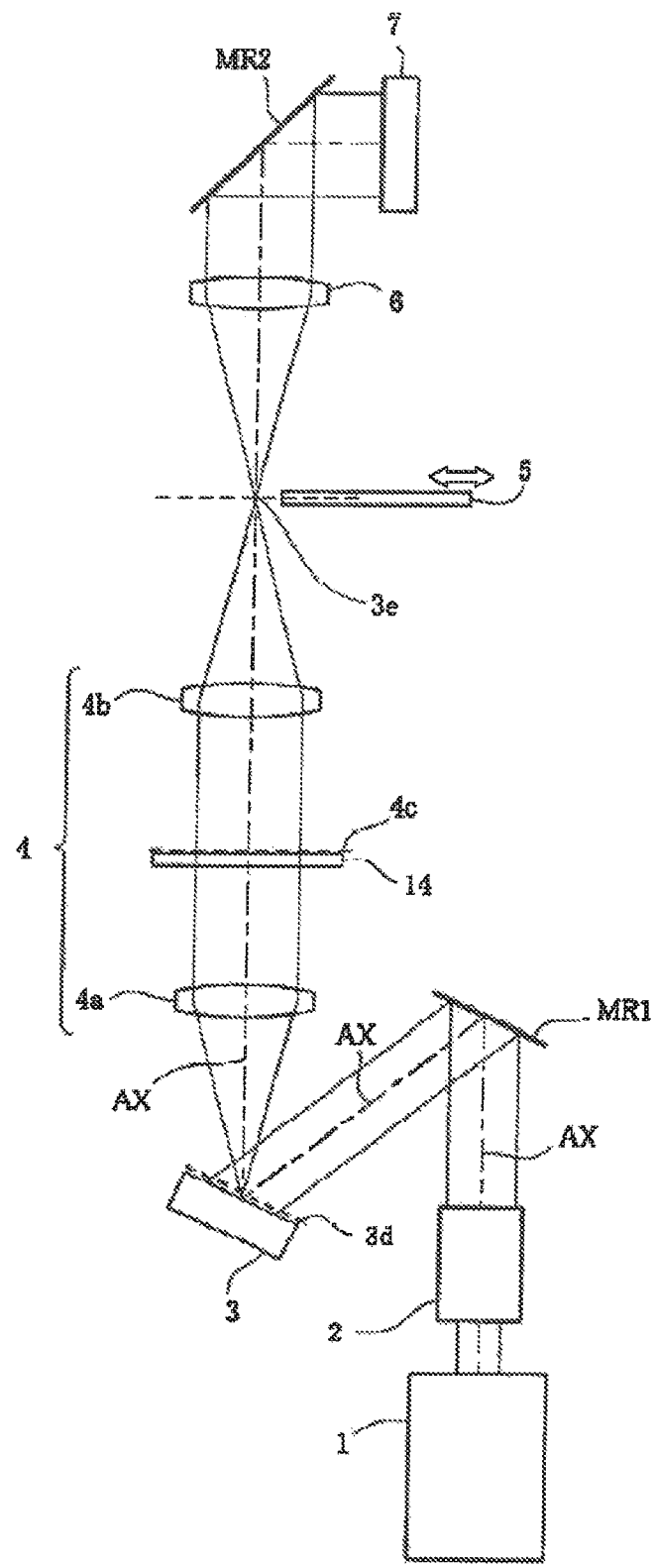
FIG. 30 shows a modification in which the polarization unit is arranged on the optical Fourier transformation plane of the arrangement plane of the spatial light modulator, to transform a linearly polarized incident light into a circumferential direction linearly polarized light or a radial direction linearly polarized light.

FIG. 30 shows an optical path from the light source 1 to the micro fly's eye lens 7. Regarding other configurations than the optical path shown in FIG. 30, reference can be made to FIG. 2. Further, the members having identical or similar functions to those of the members in the aforementioned embodiment and modifications are denoted by reference numerals same as those of the members in the aforementioned embodiment and modifications. In FIG. 30, the configuration is different from the example shown in FIG. 2 in that the polarization unit 14 is arranged in the pupil plane 4c of the relay optical system 4, i.e., an optical Fourier transform plane of the arrangement plane of the spatial light modulator 3, to transform the linearly polarized incident light into a circumferential direction linearly polarized light or a radial direction linearly polarized light.

Figure 31:
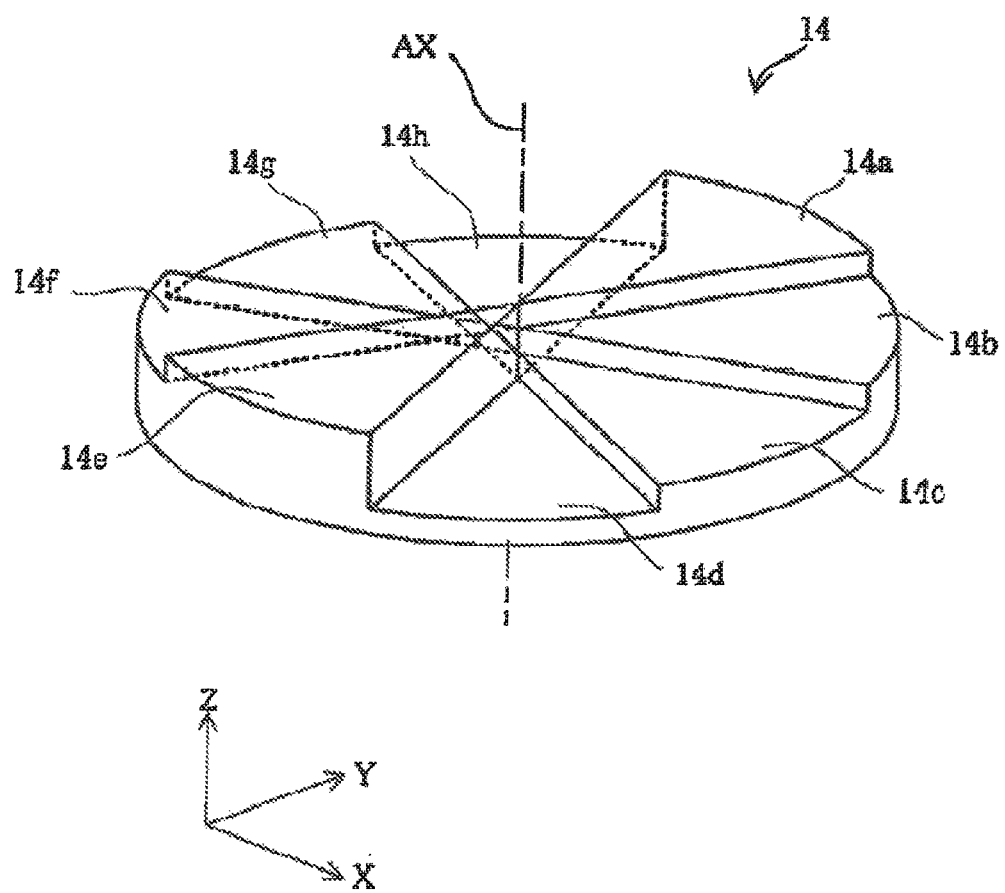
FIG. 31 schematically shows a configuration of the polarization unit in FIG. 30 which transforms the linearly polarized incident light into the circumferential direction linearly polarized light or the radial direction linearly polarized light.

As shown in FIG. 31, the polarization unit 14 has a circular (or annular) outer shape about the optical axis AX, and has eight division regions 14a to 14h obtained by dividing the circle into eight parts along its circumferential direction. Further, the polarization unit 14 is formed of a crystalline material, such as crystal, which is an optical material having optical rotation property. With the polarization unit 14 being positioned in the illumination optical path, the incident surface and emission surface of the polarization unit 14 are orthogonal to the optical axis AX, and its crystalline optic axis is substantially consistent with the direction along the optical axis AX (that is, substantially consistent with the Z direction which is the propagation direction of the incident light).

Here, a thickness of the division regions 14a and 14e in the optical axis AX direction is set such that, for example, if a linearly polarized light having the polarization direction in the Y direction comes into the polarization unit 14, then there is emitted a linearly polarized light having the polarization direction in a direction obtained by rotating, about the Z-axis, the Y direction by +90 degrees+180×n degrees (n is an integer), i.e., in X direction. Further, a thickness of the division regions 14b and 14f in the optical axis AX direction is set such that, for example, if a linearly polarized light having the polarization direction in the Y direction comes into the polarization unit 14, then there is emitted a linearly polarized light having the polarization direction in a direction obtained by rotating, about the Z-axis, the Y direction by +135 degrees+180×n degrees (n is an integer), i.e., in a direction obtained by rotating, about the Z-axis, the Y direction by −45 degrees.

Further, a thickness of the division regions 14c and 14g in the optical axis AX direction is set such that, for example, if a linearly polarized light with the polarization direction in the Y direction comes into the polarization unit 14, then there is emitted a linearly polarized light having the polarization direction in a direction obtained by rotating, about the Z-axis, the Y direction by +180 degrees+180×n degrees (n is an integer), i.e., in the Y direction. Then, a thickness of the division regions 14d and 14h in the optical axis AX direction is set such that, for example, if a linearly polarized light with the polarization direction in the Y direction comes into the polarization unit 14, then there is emitted a linearly polarized light having the polarization direction in a direction obtained by rotating, about the Z-axis, the Y direction by +45 degrees+180×n degrees (n is an integer), i.e., in a direction obtained by rotating, about the Z-axis, the Y direction by +45 degrees.

Returning to FIG. 30, if the light reaching the spatial light modulator 3 from the light source 1 is a linearly polarized light having the polarization direction in the Y direction, and the inclinations of the plurality of mirror elements 3a of the spatial light modulator 3 are set so as to form a eight pole-shaped light intensity distribution on the pupil plane 4c, then via the polarization unit 14, the light intensity distribution has a circumferential direction linear polarization state about the optical axis AX. Then, if the polarization unit 5 is not located in the optical path of the illumination optical system, as shown in FIG. 9A, the eight pole-shaped light intensity distribution in the circumferential direction linear polarization state is also formed on the illumination pupil plane just downstream from the micro fly's eye lens 7.

Here, consider a case that the polarization unit 5 is an optical rotation member which rotates the polarization direction of a linearly polarized incident light about the optical axis by +90 degrees+180×n degrees (n is an integer). If the polarization unit 5 is positioned in a region conjugate with the partial region where it is positioned the plurality of mirror elements 3a for forming the surface light sources P12a and P12b, and P13a and P13b in the eight pole-shaped light intensity distribution formed on the illumination pupil plane just downstream from the micro fly's eye lens 7, among the plurality of mirror elements 3a of the spatial light modulator 3, then as shown in FIG. 9B, it is possible to obtain such a polarization state that the surface light sources P11a and P11b, and P14a and P14b, which are the upper, lower, left and right poles, are the linearly polarized light having the polarization direction in the circumferential direction, while the surface light sources P12a and P12b, and P13a and P13b, which are the poles of 45 degree oblique directions, are the linearly polarized light having the polarization direction in the radial direction.

In this manner, it is possible to acquire a high degree of freedom in changing the polarization state by combining the polarization unit 14 forming the circumferential direction linearly polarized light on the illumination pupil plane, and the polarization unit 5 arranged in the position conjugate with the arrangement plane of the spatial light modulator 3 for the plurality of mirror elements 3a.

Figure 32:
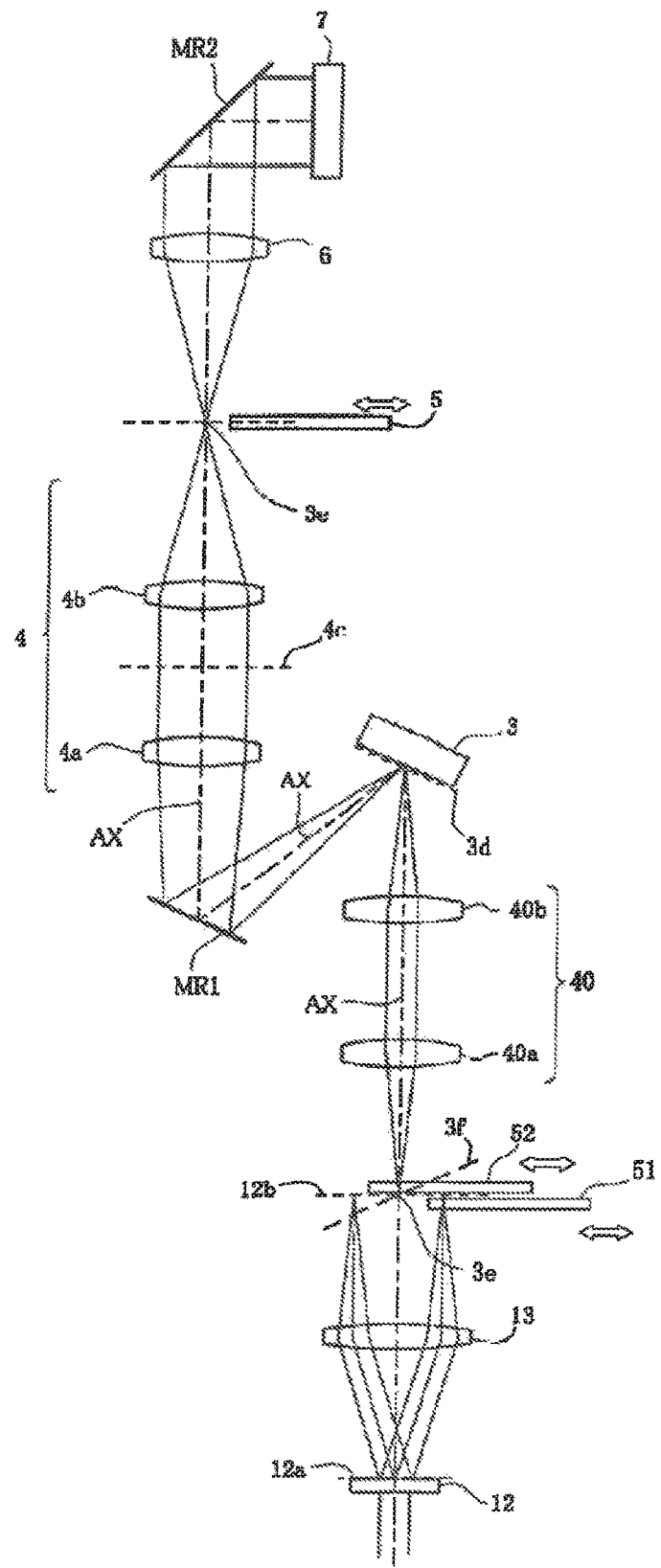
FIG. 32 shows a modification in which the polarization units is arranged both in a conjugate position in an optical path on the illumination objective plane side of the spatial light modulator, and in a conjugate position in an optical path on the light source side of the spatial light modulator.

Further, it is also possible to combine the modification shown in FIGS. 30 and 31, and any one of the embodiment and modifications described above. Further, as shown in FIG. 32, it is also possible to adopt a configuration of arranging the polarization unit both in the conjugate position in the optical path on the illumination objective surface side of the spatial light modulator 3, and in the conjugate position in the optical path on the light source side of the spatial light modulator 3, by combining the embodiment shown in FIG. 2 and the modification shown in FIG. 29.

In the embodiment described above, the spatial light modulator, in which the directions (angles, inclinations) of the plurality of reflecting surfaces arranged two-dimensionally can be individually controlled, is used as the spatial light modulator having the plurality of mirror elements arranged two-dimensionally and controlled individually. However, there is no limitation thereto. For example, it is also possible to use a spatial light modulator in which the heights (positions) of a plurality of reflecting surfaces arranged two-dimensionally can be individually controlled. As for the spatial light modulator as described above, it is possible to use, for example, spatial light modulators disclosed in U.S. Pat. No. 5,312,513 and FIG. 1d of U.S. Pat. No. 6,885,493. In the case of those spatial light modulators, the action or function, which is the same as or equivalent to that of the diffraction surface, can be given to the incident light by forming the two-dimensional height distribution. The spatial light modulator described above, which has the plurality of reflecting surfaces arranged two-dimensionally, may be modified in accordance with the disclosure of, for example, U.S. Pat. No. 6,891,655 and United States Patent Application Publication No. 2005/0095749.

In the embodiment described above, the spatial light modulator 3 is provided with the plurality of mirror elements 3a arranged two-dimensionally in the predetermined plane. However, there is no limitation thereto. It is also possible to use a transmission type spatial light modulator provided with a plurality of transmission optical elements arranged in a predetermined plane and controlled individually.

In the embodiment described above, a variable pattern forming apparatus, which forms a predetermined pattern on the basis of predetermined electronic data, can be used in place of the mask. As for the variable pattern forming apparatus, for example, it is possible to use a spatial light modulating element including a plurality of reflecting elements driven on the basis of predetermined electronic data. An exposure apparatus, which uses the spatial light modulating element, is disclosed, for example, in United States Patent Application Publication No. 2007/0296936. Other than the reflection type spatial light modulator of the non-light emission type as described above, it is also allowable to use a transmission type spatial light modulator, and it is also allowable to use an image display element of the self-light emission type.

In the aforementioned embodiment, the optical rotation members 51 and 52 rotate the polarization direction of a linearly polarized incident light by 45 degrees and 90 degrees, respectively. However, the rotation angle for the polarization direction is not limited to 45 degrees or 90 degrees.

The optical rotation member 51 may rotate the polarization direction of a linearly polarized incident light by any rotation angle of 45 degrees+180×n degrees (n is an integer)

such as 255 degrees, 405 degrees, etc. The optical rotation member 52 may rotate the polarization direction of a linearly polarized incident light by any rotation angle of 90 degrees+180×n degrees (n is an integer) such as 270 degrees, 450 degrees, etc. That is, the optical rotation member 51 may rotate the polarization direction of a linearly polarized incident light by any rotation angle of j degrees+180×n degrees (j is a real number and n is an integer), while the optical rotation member 52 may rotate the polarization direction of a linearly polarized incident light by any rotation angle of k degrees+180×n degrees (k is a real number and n is an integer).

Figure 33A:
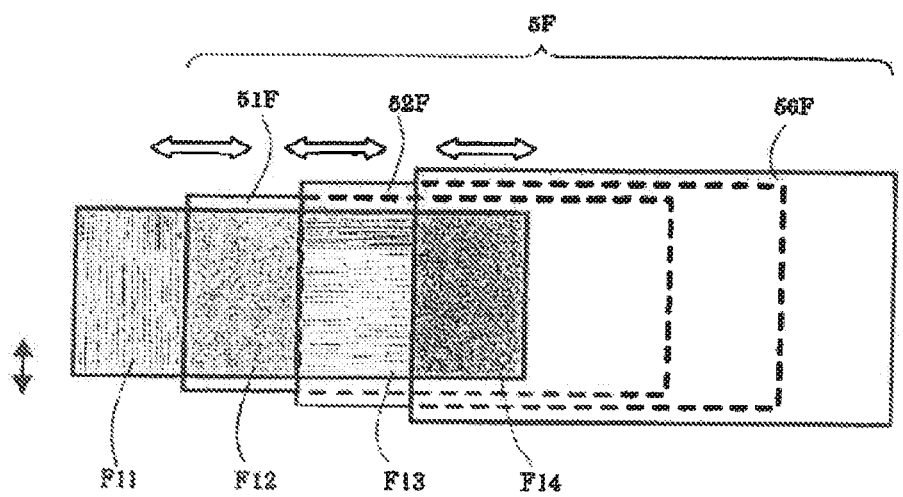
FIGS. 33A and 33B schematically show modifications in which polarization units are composed of three optical rotation members, respectively.
Figure 33B:
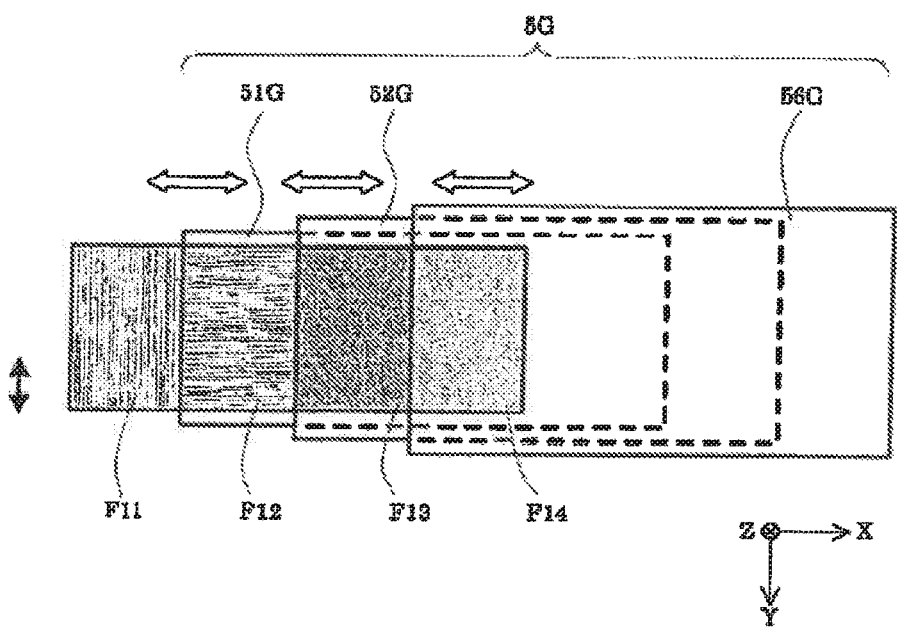

Further, as described above, any number of optical rotation members or phase members (typically wave plates) may be used as movable polarization rotation members constituting the polarization unit 5 and, as shown in FIGS. 33A and 33B for example, it is possible to construct polarization units 5F and 5G with three movable polarization rotation members, respectively.

In FIG. 33A, the polarization unit 5F is constructed from three polarization rotation members 51F, 52F and 56F movable in the X direction of the figure. Here, each of the polarization rotation members 51F, 52F and 56F rotates the polarization direction of a linearly polarized incident light by 135 degrees. Those polarization rotation members 51F, 52F and 56F may either be constructed of optical rotation members or wave plates, or be the aforementioned wave plates shown in FIGS. 23A to 23C. In FIG. 33A, if the linearly polarized light coming into the polarization unit 5F is a Y direction linearly polarized light, then the first partial light beam F11 does not pass through any of the polarization rotation members 51F, 52F and 56F, and remains the Y direction linearly polarized light as it is at a position just downstream from the polarization unit 5F. The second partial light beam F12 passes through the polarization rotation member 51F, and is a linearly polarized light of +135 degree oblique direction at a position just downstream from the polarization unit 5F. The third partial light beam F13 passes through the polarization rotation members 51F and 52F, and is a linearly polarized light of +270 degree oblique direction (a X direction linearly polarized light) at a position just downstream from the polarization unit 5F. The fourth partial light beam F14 passes through the polarization rotation members 51F, 52F and 56F, and is a linearly polarized light of +405 degree oblique direction at a position just downstream from the polarization unit 5F.

Further, in FIG. 33B, the polarization unit 5G is constructed from three polarization rotation members 51G, 52G and 56G movable in the X direction of the figure. Here, each of the polarization rotation members 51G and 56G rotates the polarization direction of a linearly polarized incident light by 90 degrees, while the polarization rotation member 52G rotates the polarization direction of a linearly polarized incident light by 135 degrees. Those polarization rotation members 51G. 52G and 56G may either be constructed of optical rotation members or wave plates, or be the aforementioned wave plates shown in FIGS. 23A to 23C. In FIG. 33B, if the linearly polarized light coming into the polarization unit 5G is a Y direction linearly polarized light, then the first partial light beam F11 does not pass through any of the polarization rotation members 51G, 52G and 56G, and remains the Y direction linearly polarized light as it is at a position just downstream from the polarization unit 5G. The second partial light beam F12 passes through the polarization rotation member 51G, and is a X direction linearly polarized light at a position just downstream from polarization unit 5G. The third partial light beam F13 passes through the polarization rotation members 51G and 52G, and is a linearly polarized light of +225 degree oblique direction at a position just downstream from the polarization unit 5G. The fourth partial light beam F14 passes through the polarization rotation members 51G, 52G and 56G, and is a linearly polarized light of +315 degree oblique direction at a position just downstream from the polarization unit 5G. Further, with the configuration of FIG. 33B, when using only the X direction linearly polarized light and the Y direction linearly polarized light to carry out illumination, it is possible to insert only the one polarization rotation member 510 into the illumination optical path.

Figure 34:
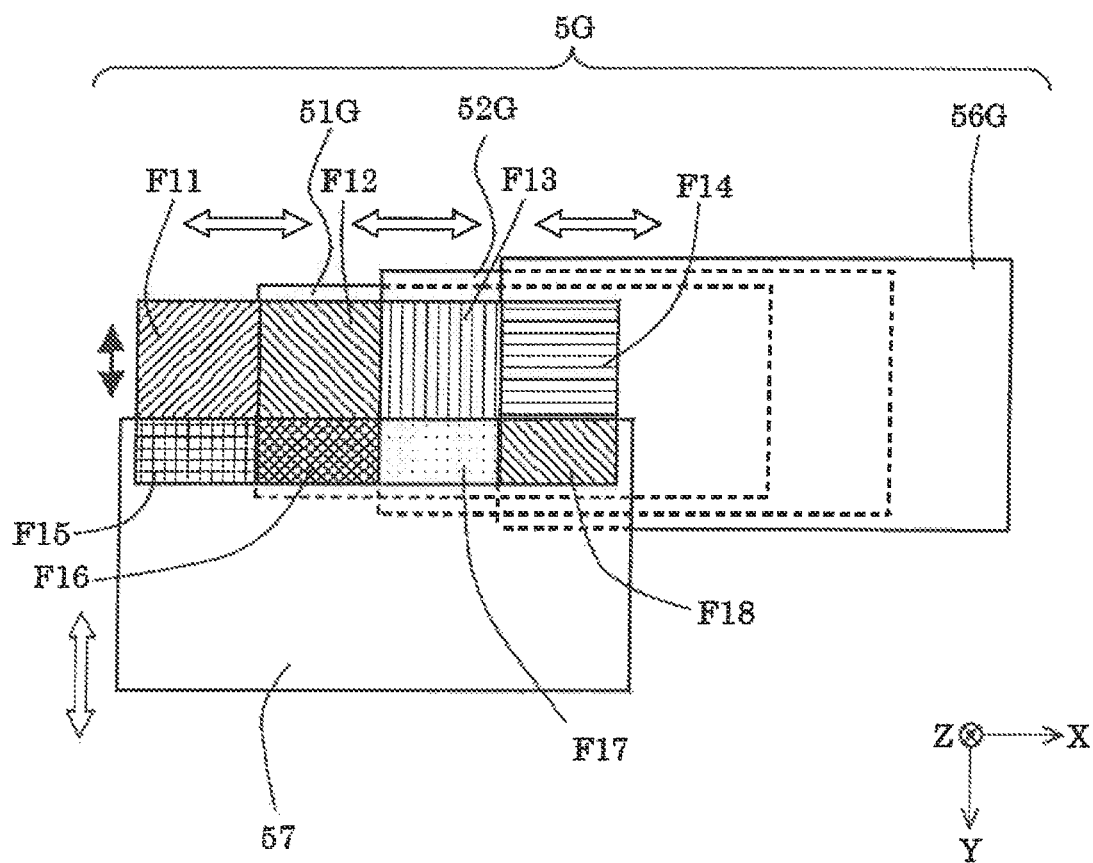
FIG. 34 schematically shows a modification in which the polarization unit is composed of four optical rotation members.

Further, as shown in FIG. 34, in addition to the configuration of FIG. 33B, it is also possible to provide a polarization rotation member 57 adapted to rotate the polarization direction of a linearly polarized incident light by 22.5 degrees+180×n degrees (n is an integer). Further, in FIG. 34, the members having the same functions as those of the members in the configuration of FIG. 33B are denoted by the reference numerals same as those of the members in FIG. 33B.

An explanation will be given about aspects, of FIG. 34, which are different from those of FIG. 33B. If the linearly polarized light coming into the polarization unit 5G is a Y direction linearly polarized light, then a fifth partial light beam F15 passes through the polarization rotation member 57, and is a linearly polarized light of +22.5 degree oblique direction at a position just downstream from the polarization unit 5G. A sixth partial light beam F16 passes through the polarization rotation members 51G and 57, and is a linearly polarized light of +112.5 degree oblique direction at a position just downstream from the polarization unit 50. A seventh partial light beam F17 passes through the polarization rotation members 51G, 52G and 57, and is a linearly polarized light of +247.5 degree oblique direction at a position just downstream from the polarization unit 5G. An eighth partial light beam F18 passes through the polarization rotation members 51G, 52G, 56G and 57, and is a linearly polarized light of +337.5 degree oblique direction at a position just downstream from the polarization unit 5G.

In the example of FIG. 34, the polarization rotation member 57 is movable in a direction (the Y direction) orthogonal to the moving direction (the X direction) of the polarization rotation members 51G, 52G and 56G and, by the moving of the polarization rotation member 57, it is possible to change the ratio of cross-sectional area between the first partial light beam F11 and the fifth partial light beam F15, the ratio of cross-sectional area between the second partial light beam F12 and the sixth partial light beam F16, the ratio of cross-sectional area between the third partial light beam F13 and the seventh partial light beam F17, and the ratio of cross-sectional area between the fourth partial light beam F14 and the eighth partial light beam F18. Further, the polarization rotation member 57 may also be moved in the X direction of the figure.

Figure 35:
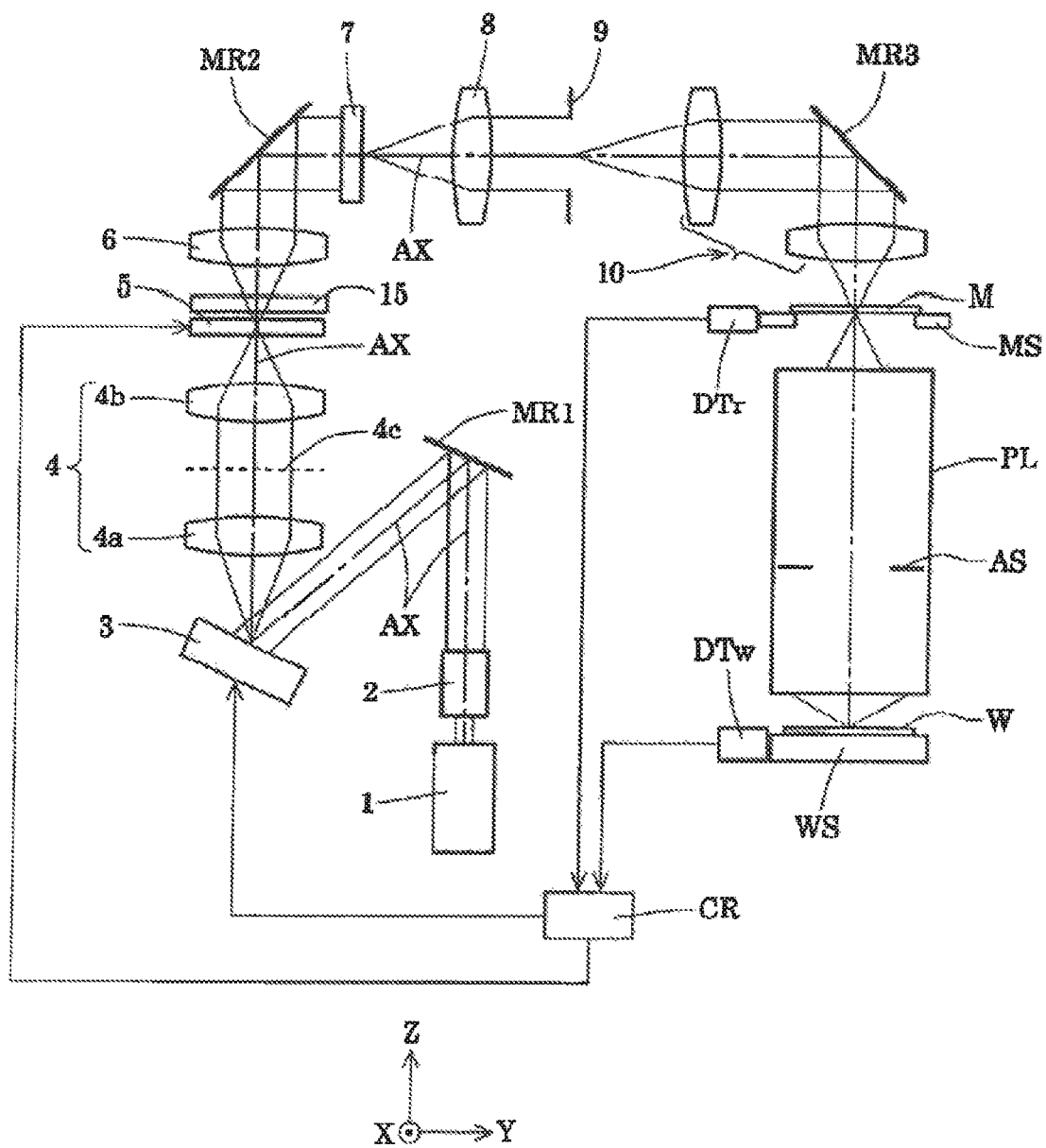
FIG. 35 schematically shows a modification in which it is provided a phase modulation member to reduce elliptical polarization of light of oblique polarization.

Further, in each of the abovementioned embodiment and modifications, it is also possible to arrange a phase modulation member for reducing the influence of the retardation caused due to the optical system arranged on the illumination objective surface side of the polarization unit in the illumination optical path on the illumination objective surface side of the polarization unit. FIG. 35 shows an example of arranging such a phase modulation member 15 in the illumination optical path on the illumination objective surface side of the polarization unit 5, wherein the members having the same functions as those of the members in the embodiment of FIG. 2 are denoted by the reference numerals same as those of the members in FIG. 2.

In FIG. 35, the phase modulation member 15 is a wave plate which extends across an entire cross section of the illumination optical path and has a uniform thickness, and whose optic axis is set along the Y direction (or the X direction). In other words, the optic axis of the wave plate constructing the phase modulation member 15 is set along a direction corresponding to the polarization direction of the p-polarized light or the polarization direction of the s-polarized light with respect to the reflecting surfaces of the flat reflecting mirrors MR2 and MR3 in the optical system on the illumination objective surface side of the polarization unit 5.

If the phase modulation member 15 is not provided, then due to the retardation (a phenomenon that phase difference occurs between a pair of linearly polarized light components whose polarization directions are orthogonal to each other) caused by a succeeding optical system (the optical system arranged between the polarization unit 5 and the reticle R or the wafer W, especially the flat reflecting mirrors MR2 and MR3) arranged in the optical path on the downstream side from the polarization unit 5, the linearly polarized light (obliquely polarized light), which has a polarization direction not along the plane (the Y-Z plane) including the optical axes upstream and downstream of the flat reflecting mirrors or not along the plane (the X-Z plane) being orthogonal to that plane (the Y-Z plane) and including the optical axis, is liable to become an elliptically polarized light.

In the example of FIG. 35, the light beam of the longitudinal polarization (the Y direction linearly polarized light) and the transverse polarization (the X direction linearly polarized light) from the polarization unit 5 is almost not subjected to the phase modulation by the phase modulation member 15, and the light beam from the phase modulation member 15 nearly maintains its polarization direction. On the other hand, the light beam of oblique polarization from the polarization unit 5 is subjected to the phase modulation by the phase modulation member 15, and becomes a light beam of elliptical polarization which almost sets off the elliptical polarization of the obliquely polarized light due to the abovementioned succeeding optical system. The polarization degree of this light beam having elliptical polarization depends on the thickness of the wave plate constructing the phase modulation member 15.

By this configuration, it is possible to reduce the influence of the retardation caused by the succeeding optical system arranged in the optical path on the downstream side from the polarization unit 5. The phase modulation member 15 of such a kind is not limited to be arranged at the position just downstream from the polarization unit 5, but can also be arranged in any position as long as in the illumination optical path on the illumination objective surface side of the polarization unit 5. Further, when using only the X direction linearly polarized light and the Y direction linearly polarized light to carry out the illumination, the phase modulation member may be withdrawn from the illumination optical path.

The exposure apparatus of the embodiment described above is produced by assembling the various subsystems including the respective constitutive elements as recited in claims of this application so that the predetermined mechanical accuracy, the electrical accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electrical accuracy for the various electrical systems. The steps of assembling the various subsystems into the exposure apparatus include, for example, the mechanical connection, the wiring connection of the electric circuits, and the piping connection of the air pressure circuits among the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies of the entire exposure apparatus. It is also appropriate that the exposure apparatus is produced in a clean room in which, for example, the temperature and the cleanness are managed.

Figure 36:
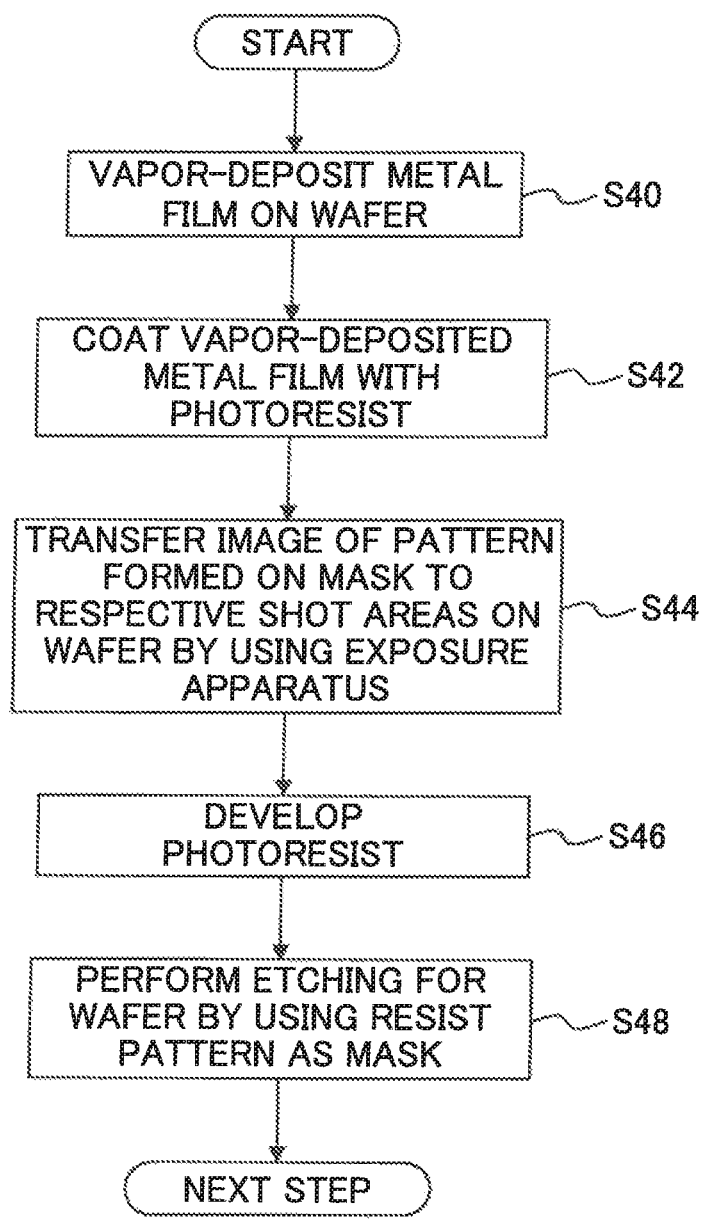
FIG. 36 is a flowchart showing steps of producing a semiconductor device.

Next, an explanation will be made about a method for producing the device by using the exposure apparatus according to the embodiment described above. FIG. 36 shows a flow chart illustrating steps of producing a semiconductor device. As shown in FIG. 36, in the steps of producing the semiconductor device, a metal film is vapor-deposited on the wafer W as the substrate for the semiconductor device (Step S40), and the vapor-deposited metal film is coated with a photoresist which is a photosensitive material (Step S42). Subsequently, a pattern formed on the mask (reticle) M is transferred to respective shot areas on the wafer W by using the projection exposure apparatus of the embodiment described above (Step S44: exposure step). The development of the wafer W for which the transfer is completed, i.e., the development of the photoresist to which the pattern has been transferred is performed (Step S46: development step).

After that, the processing such as the etching or the like is performed for the surface of the wafer W by using the resist pattern generated on the surface of the wafer W in Step S46 as a mask (Step S48: processing step). In this context, the resist pattern is the photoresist layer in which protrusions and recesses having the shapes corresponding to the pattern transferred by the projection exposure apparatus of the embodiment described above are generated, wherein the recesses penetrate through the photoresist layer. In Step S48, the processing is performed for the surface of the wafer W via the resist pattern. The processing, which is performed in Step S48, includes, for example, at least one of the etching of the surface of the wafer W and the film formation of the metal film or the like. In Step S44, the projection exposure apparatus of the embodiment described above performs the transfer of the pattern by using the wafer W coated with the photoresist as the photosensitive substrate, i.e., a plate P.

Figure 37:
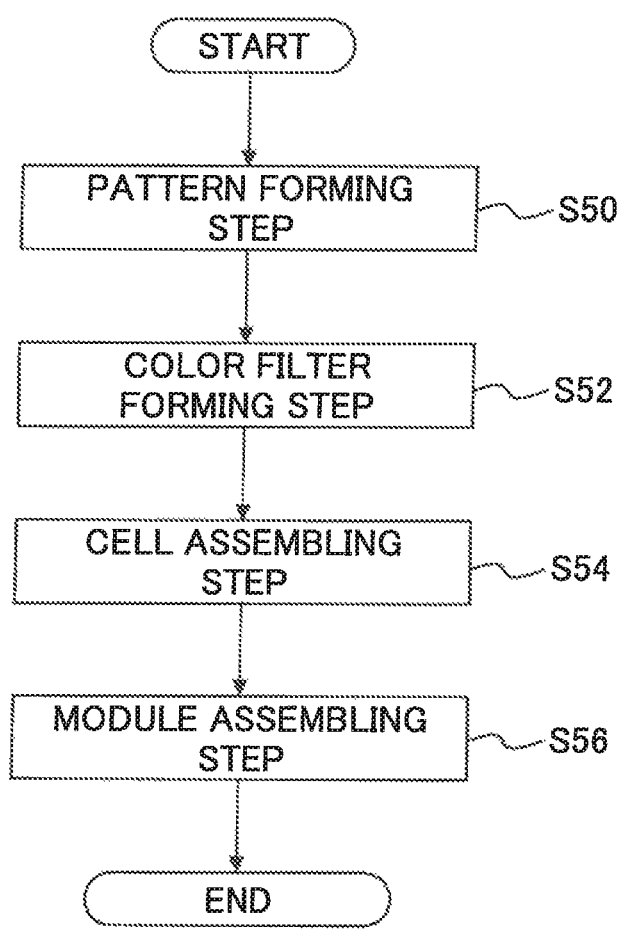

FIG. 37 shows a flow chart illustrating steps of producing a liquid crystal device such as a liquid crystal display element or the like. As shown in FIG. 37, in the steps of producing the liquid crystal device, a pattern forming step (Step S50), a color filter forming step (Step S52), a cell assembling step (Step S54), and a module assembling step (Step S56) are successively performed. In the pattern forming step of Step S50, a predetermined pattern such as a circuit pattern, an electrode pattern or the like is formed on a plate P which is a glass substrate coated with a photoresist by using the projection exposure apparatus of the embodiment described above. The pattern forming step includes an exposure step of transferring the pattern to the photoresist layer by using the projection exposure apparatus of the embodiment described above, a development step of performing the development of the plate P to which the pattern is transferred, i.e., the development of the photoresist layer on the glass substrate to generate the photoresist layer having a shape corresponding to the pattern, and a processing step of processing the surface of the glass substrate via the developed photoresist layer.

In the color filter forming step of Step S52, a color filter is formed, in which a large number of dot sets each composed of three dots corresponding to R (Red), G (Green), and B (Blue) are arranged in a matrix form, or a plurality of filter sets each composed of three stripes of R, G, and B are arranged in the horizontal scanning direction. In the cell assembling step of Step S54, a liquid crystal panel (liquid crystal cell) is assembled by using the glass substrate on which the predetermined pattern is formed in Step S50 and the color filter which is formed in Step S52. Specifically, for example, a liquid crystal panel is formed by injecting the liquid crystal into the space between the glass substrate and the color filter. In the module assembling step of Step S56, various parts including, for example, an electric circuit and a backlight, which are provided to allow the liquid crystal panel to perform the displaying operation, are attached to the liquid crystal panel which is assembled in Step S54.

The present teaching is not limited to the application to the exposure apparatus for producing the semiconductor device. The present teaching is also widely applicable, for example, to the exposure apparatus for producing the liquid crystal display device to be formed on the rectangular glass plate or the display apparatus such as the plasma display or the like as well as the exposure apparatus for producing various devices including, for example, the image pickup device (for example, CCD), the micromachine, the thin film magnetic head, and the DNA chip. Further, the present teaching is also applicable to the exposure step (exposure apparatus) to be used when the mask (for example, the photomask and the reticle) formed with the mask pattern for various devices is produced by using the photolithography step.

In the embodiment described above, the ArF excimer laser light (wavelength: 193 nm) and the KrF excimer laser light (wavelength: 248 nm) are used as the exposure light. However, there is no limitation thereto. The present teaching is also applicable to any other appropriate laser light source including, for example, the $F_2$ laser light source for supplying the laser beam having a wavelength of 157 nm, the pulse laser light source such as the $Ar_2$ laser (output wavelength: 126 nm), the $Kr_2$ laser (output wavelength: 146 nm) and the like, the g-ray (wavelength: 436 nm), harmonic generator for the YAG laser, and the ultra-high pressure mercury lamp for generating the emission line such as the i-ray (wavelength: 365 nm) or the like.

For example, as disclosed in U.S. Pat. No. 7,023,610, it is also appropriate to use the harmonic wave as the vacuum ultraviolet light, the harmonic wave being obtained by amplifying the single wavelength laser beam which is in the infrared region or the visible region and which is oscillated from the fiber laser or the DFB semiconductor laser with, for example, a fiber amplifier doped with erbium (or both of erbium and ytterbium) and performing the wavelength conversion to convert the amplified laser beam into the ultraviolet light by using the nonlinear optical crystal.

In the embodiment described above, it is also appropriate to apply a technique in which the inside of the optical path defined between the projection optical system and the photosensitive substrate is filled with a medium (typically a liquid) having a refractive index larger than 1.1, i.e., the so-called liquid immersion method. In this case, those adoptable as the technique for filling the inside of the optical path defined between the projection optical system and the photosensitive substrate with the liquid include, for example, a technique in which the optical path is locally filled with the liquid such as the technique disclosed in International Publication No. WO99/49504, a technique in which a stage which holds a substrate as an exposure objective is moved in a liquid bath such as the technique disclosed in Japanese Patent Application Laid-open No. 6-124873, and a technique in which a liquid pool having a predetermined depth is formed on a stage and a substrate is held therein such as the technique disclosed in Japanese Patent Application Laid-open No. 10-303114. Here, the teachings of the pamphlet of International Patent Publication No. WO99/49504, Japanese Patent Application Laid-open No. 6-124873 and Japanese Patent Application Laid-open No. 10-303114 are incorporated herein by reference.

In the embodiment described above, the projection optical system of the exposure apparatus is not limited to the reduction system, which may be any one of the 1× magnification system and the enlarging (magnifying) system. The projection optical system is not limited to the refractive system, which may be any one of the reflection system and the cata-dioptric system. The projected image may be any one of the inverted image and the erected image.

For example, as disclosed in International Publication No. 2001/035168, the present teaching is applicable to an exposure apparatus (lithography system) in which a line-and-space pattern is formed on a wafer W by forming interference fringes on the wafer W.

Further, for example, as disclosed in U.S. Pat. No. 6,611,316, the present teaching is applicable to an exposure apparatus in which two reticle patterns are combined (synthesized) on a wafer via a projection optical system, and one shot area on the wafer is subjected to the double exposure substantially simultaneously by means of one time of the scanning exposure.

In the embodiment described above, the object on which the pattern is to be formed (object as the exposure objective to be irradiated with the energy beam), is not limited to the wafer. The object may be any other object including, for example, glass plates, ceramic substrates, film members, and mask blanks.

In the embodiment described above, the present teaching is applied to the illumination optical system for illuminating the mask (or the wafer) in the exposure apparatus. However, there is no limitation thereto. The present teaching is also applicable to any general illumination optical system for illuminating any illumination objective surface other than the mask (or the wafer).

While the particular aspects of embodiment(s) of the ILLUMINATION OPTICAL SYSTEM, EXPOSURE APPARATUS, DEVICE PRODUCTION METHOD, AND LIGHT POLARIZATION UNIT described and illustrated in this patent application in the detail required to satisfy 35 U.S.C. § 112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present ILLUMINATION OPTICAL SYSTEM, EXPOSURE APPARATUS, DEVICE PRODUCTION METHOD, AND LIGHT POLARIZATION UNIT is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. § 112, sixth paragraph, unless the element is expressly recited using the phrase "means for" or, in the case of a method claim, the element is recited as a "step" instead of an "act."

It will be understood also by those skilled in the art that, in fulfillment of the patent statutes of the United States, Applicant(s) has disclosed at least one enabling and working embodiment of each invention recited in any respective claim appended to the Specification in the present application and perhaps in some cases only one. Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one and only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

Further, the present application may also set forth claims as follows:

1. An illumination optical system which illuminates an illumination objective surface with a light from a light source, the illumination optical system comprising:

a spatial light modulator which has a plurality of optical elements arranged within a predetermined plane and controlled individually, and which forms a light intensity distribution in an illumination pupil of the illumination optical system in a variable manner; and a polarization unit which is arranged in a conjugate position optically conjugate with the predetermined plane in an optical path of the illumination optical system, and which changes a polarization state of a part of an incident light beam, and then emits the incident light beam as an outgoing light beam.

2. The illumination optical system according to claim 1, wherein the polarization unit is arranged in the conjugate position in the optical path on the illumination objective surface side with respect to the spatial light modulator.

3. The illumination optical system according to claim 1 or 2, wherein the incident light beam includes a first partial light beam and a second partial light beam different from the first partial light beam; and the polarization unit has a first optical element which changes the polarization state of the second partial light beam in the incident light beam without exerting any effect on the first partial light beam in the incident light beam.

4. The illumination optical system according to claim 3, wherein the first optical element is arranged on a first plane along a cross section of the incident light beam, and configured to be movable along the first plane for changing the ratio between the cross-sectional area of the first partial light beam via the first plane and the cross-sectional area of the second partial light beam via the first plane.

5. The illumination optical system according to claim 3 or 4, wherein the first optical element has a pair of edges extending in a first direction parallel to one pair of sides of a rectangular cross section of the incident light beam, and is movable in a second direction orthogonal to the first direction.

6. The illumination optical system according to claim 3 or 4, wherein the first optical element has a first edge extending in a third direction obliquely intersecting one pair of sides of a rectangular cross section of the incident light beam, and a second edge extending in a fourth direction different from the third direction, and is movable two-dimensionally along the cross section of the incident light beam.

7. The illumination optical system according to claim 6, wherein the fourth direction in which the second edge of the first optical element extends is a direction obliquely intersecting the one pair of sides.

8. The illumination optical system according to any one of claims 3 to 7, wherein the polarization unit has a second optical element which changes a polarization state of a third partial light beam which is at least part of the second partial light beam via the first optical element, and a polarization state of a fourth partial light beam which is at least part of the first partial light beam coming into the second optical element without passing through the first optical element.

9. The illumination optical system according to claim 8, wherein the second optical element is arranged on a second plane along the cross section of the incident light beam, and configured to be movable along the second plane for changing a ratio between a cross-sectional area of the third partial light beam via the second plane and a cross-sectional area of the fourth partial light beam via the second plane.

10. The illumination optical system according to claim 8 or 9, wherein the second optical element has a pair of edges extending in a first direction parallel to one pair of sides of a rectangular cross section of the incident light beam, and is movable in a second direction orthogonal to the first direction.

11. The illumination optical system according to claim 8 or 9, wherein the second optical element has a third edge extending in a fifth direction obliquely intersecting one pair of sides of a rectangular cross section of the incident light beam, and a fourth edge extending in a sixth direction different from the fifth direction, and is movable two-dimensionally along the cross section of the incident light beam.

12. The illumination optical system according to claim 11, wherein the sixth direction in which the fourth edge of the second optical element extends is a direction obliquely intersecting the one pair of sides.

13. The illumination optical system according to any one of claims 3 to 12, wherein the first optical element has an optical rotation member formed of an optical material having optical rotation property.

14. The illumination optical system according to any one of claims 8 to 13, wherein at least one of the first optical element and the second optical element includes an optical rotation member formed of an optical material having optical rotation property.

15. The illumination optical system according to claim 13 or 14, wherein the optical rotation member comprises a first optical rotation member formed of a clockwise optical rotation material, and a second optical rotation member formed of a counterclockwise optical rotation material and arranged adjacent to the first optical rotation member.

16. The illumination optical system according to claim 14 or 15, wherein a phase difference imparting member which imparts the incident light beam with phase differences which are different based on an incident position of the incident light beam is arranged on an optical Fourier transform plane of the predetermined plane.

17. The illumination optical system according to any one of claims 3 to 16, wherein the first optical element includes a wave plate which changes the incident light beam into a light in a predetermined polarization state.

18. The illumination optical system according to any one of claims 8 to 17, wherein at least one of the first optical element and the second optical element includes a wave plate which changes the incident light beam into a light in a predetermined polarization state.

19. The illumination optical system according to claim 17 or 18, wherein the wave plate is rotatable along a cross section of the incident light beam.

20. The illumination optical system according to claim 18 or 19, wherein the wave plate comprises a first wave plate having an optic axis along a first direction within a plane along the cross section of the incident light beam, and a second wave plate having an optic axis along a second direction different from the first direction within the plane along the cross section of the incident light beam.

21. The illumination optical system according to any one of claims 8 to 20, wherein at least one of the first optical element and the second optical element includes a polarizer which selects a light in a predetermined polarization state from the incident light beam and then emits the selected light.

22. The illumination optical system according to any one of claims 8 to 21, wherein the first optical element and the second optical element are arranged adjacent to each other.

23. The illumination optical system according to any one of claims 1 to 22, further comprising a relay optical system arranged between the predetermined plane and a position conjugate with the predetermined plane.

24. The illumination optical system according to claim 23, wherein the first optical element and the second optical element are arranged across the position optically conjugate with the predetermined plane.

25. The illumination optical system according to claim 23 or 24, wherein the position optically conjugate with the predetermined plane is a position on an optical axis of the relay optical system.

26. The illumination optical system according to any one of claims 23 to 25, wherein the predetermined plane on which the plurality of optical elements of the spatial light modulator are arranged is inclined with respect to a plane orthogonal to an optical axis of the relay optical system; and the first optical element is configured to be movable in a direction along a plane optically conjugate with the predetermined plane with respect to the relay optical system.

27. The illumination optical system according to any one of claims 8 to 21, further comprising a second relay optical system which is arranged between the first optical element and the second optical element, and which sets the first optical element and the second optical element optically conjugate with each other.

28. The illumination optical system according to any one of claims 1 to 27, wherein the polarization unit has a depolarizing element insertable to and removable from the illumination optical path.

29. The illumination optical system according to claim 28, wherein the depolarizing element is insertable and removable at a position optically conjugate with the predetermined plane in the illumination optical path, or in the vicinity of the position optically conjugate with the predetermined plane.

30. The illumination optical system according to any one of claims 1 to 29, further comprising an optical integrator, wherein the polarization unit is arranged in an optical path between the spatial light modulator and the optical integrator.

31. The illumination optical system according to any one of claims 1 to 30, wherein the spatial light modulator includes a plurality of mirror elements arranged two-dimensionally within the predetermined plane, and a drive portion which controls and drives attitudes of the plurality of mirror elements individually.

32. The illumination optical system according to claim 31, wherein the drive portion changes orientations of the plurality of mirror elements continuously or discretely.

33. The illumination optical system according to claim 31 or 32, wherein in a case that a group of mirror elements positioned in a first region on the predetermined plane, among the plurality of mirror elements, is defined as a first mirror element group, and that a group of mirror elements positioned in a second region different from the first region on the predetermined plane, among the plurality of mirror elements, is defined as a second mirror element group, the drive portion controls and drives the first mirror element group such that a light via the first mirror element group is guided to a first pupil region on an optical Fourier transform plane of the predetermined plane, and controls and drives the second mirror element group such that a light via the second mirror element group is guided to a second pupil region on the optical Fourier transform plane of the predetermined plane.

34. The illumination optical system according to claim 33, wherein the first pupil region is different from the second pupil region.

35. The illumination optical system according to claim 33 or 34, wherein the first pupil region partially overlaps the second pupil region.

36. The illumination optical system according to any one of claims 33 to 35, wherein the polarization unit includes a first optical element which changes a polarization state of the second partial light beam via the second mirror element group without exerting any effect on the first partial light beam via the first mirror element group.

37. The illumination optical system according to any one of claims 1 to 36, wherein the polarization unit is arranged in the conjugate position in the optical path on the light source side with respect to the spatial light modulator.

38. The illumination optical system according to claim 37, further comprising an illuminance uniformization optical system which is arranged in the optical path on the light source side with respect to the conjugate position, and improves an illuminance uniformity within a plane including the conjugate position to be higher than an illuminance uniformity within a cross section of the incident light beam.

39. The illumination optical system according to claim 37, further comprising a wavefront division optical system arranged in the optical path on the light source side with respect to the conjugate position and which performs wavefront division of the incident light beam and superimposes the divided light beam on a plane including the conjugate position.

40. The illumination optical system according to any one of claims 1 to 39, wherein the illumination optical system is used in combination with a projection optical system which forms a plane optically conjugate with the illumination objective surface, the illumination pupil is defined at a position optically conjugate with an aperture stop of the projection optical system.

41. An exposure apparatus comprising the illumination optical system as defined in any one of claims 1 to 40 for illuminating a predetermined pattern, the exposure apparatus exposing a photosensitive substrate with the predetermined pattern.

42. The exposure apparatus according to claim 41, further comprising a projection optical system which forms an image of the predetermined pattern on the photosensitive substrate.

43. A device production method comprising the steps of:
    exposing the photosensitive substrate with the predetermined pattern by using the exposure apparatus as defined in claim 41 or 42;
    developing the photosensitive substrate to which the predetermined pattern is transferred and forming a mask layer having a shape corresponding to the predetermined pattern on a surface of the photosensitive substrate; and
    processing the surface of the photosensitive substrate via the mask layer.

44. A polarization unit which changes a polarization state of a part of an incident light beam having a rectangular cross section and then emits the incident light beam as an outgoing light beam, the polarization unit comprising:
    a first optical element which is arranged on a first plane along the cross section of the incident light beam and which changes a polarization state of a second partial light beam in the incident light beam, without exerting any effect on a first partial light beam in the incident light beam; and
    a second optical element which is arranged on a second plane along the cross section of the incident light beam and which changes a polarization state of a third partial light beam which is at least a part of the second partial light beam passed through the first optical element, and a polarization state of a fourth partial light beam which is at least a part of the first partial light beam which coming into the second optical element without passing through the first optical element,
    wherein the first optical element has a first edge extending in a third direction obliquely intersecting one pair of sides of the rectangular cross section of the incident light beam, and a second edge extending in a fourth direction different from the third direction.

45. The polarization unit according to claim 44, wherein at least one of the first optical element and the second optical element is configured to be movable along the first plane or the second plane for changing a ratio between a cross-sectional area of the first partial light beam, a cross-sectional area of the second partial light beam, a cross-sectional area of the third partial light beam, and a cross-sectional area of the fourth partial light beam.

46. The polarization unit according to claim 44 or 45, wherein the fourth direction in which the second edge of the first optical element extends is a direction obliquely intersecting the one pair of sides.

47. The polarization unit according to any one of claims 44 to 46, wherein the second optical element has a third edge extending in a fifth direction obliquely intersecting one pair of sides of the rectangular cross section of the incident light beam, and a fourth edge extending in a sixth direction different from the fifth direction; and the second optical element is movable two-dimensionally along the second plane.

48. The polarization unit according to any one of claims 44 to 47, wherein at least one of the first optical element and the second optical element includes an optical rotation member formed of an optical material having optical rotation property.

49. The polarization unit according to any one of claims 44 to 48, wherein at least one of the first optical element and the second optical element includes a wave plate which changes the incident light beam into a light having a predetermined polarization state.

50. The polarization unit according to claim 49, wherein the wave plate is rotatable along the cross section of the incident light beam.

51. The polarization unit according to any one of claims 44 to 50, wherein at least one of the first optical element and the second optical element has a polarizer which selects a light in a predetermined polarization state from the incident light beam and emits the selected light.

The invention claimed is:

1. An illumination optical system which illuminates an object with an illumination light, the illumination optical system comprising:
a fly's-eye lens having a back focal plane arranged on a pupil plane of the illumination optical system or in a vicinity of the pupil plane, the pupil plane being in a substantially optical Fourier transform relation with a predetermined plane on which the object is to be arranged;
a spatial light modulator which is arranged on an incident side of the fly's-eye lens and which includes a plurality of mirror elements; and
a polarization unit including a plurality of optical elements each of which is capable of being arranged in an optical path of the illumination light and each of which changes a polarization state of the illumination light, wherein
the spatial light modulator is capable of changing an intensity distribution, of the illumination light, on the pupil plane, and is capable of forming the intensity distribution, on the pupil plane, in which at least a part of the illumination light is distributed to an off-axis region deviated from an optical axis of the illumination optical system,
the plurality of optical elements of the polarization unit includes first and second optical elements configured to rotate a polarization direction of the illumination light by a first angle and a second angle respectively, the illumination light having the polarization state in which a linearly polarized light having a polarization direction in a predetermined one direction is a main component,
the first optical element includes a first optical rotation member formed of an optical rotation material having a clockwise optical activity and a second optical rotation member formed of an optical rotation material having a counterclockwise optical activity,
the first and second optical rotation members are arranged along the optical path of the illumination light, and
the polarization unit is arranged relative to the spatial light modulator so that the illumination light is transmitted through the polarization unit in the optical path on an incident side or an emission side with respect to the spatial light modulator.

2. The illumination optical system according to claim 1, wherein the first and second optical rotation members are arranged adjacent to each other along the optical path of the illumination light.

3. The illumination optical system according to claim 1, comprising a phase difference imparting member which imparts a phase difference to the illumination light coming into the polarization unit obliquely to the optical axis of the illumination optical system.

4. The illumination optical system according to claim 3, wherein the phase difference imparting member is arranged such that the phase difference imparting member and the first optical element have substantially optical Fourier transform relation.

5. The illumination optical system according to claim 1, wherein at least a part of the polarization unit is arranged on an incident side of the spatial light modulator.

6. The illumination optical system according to claim 1, wherein at least a part of the polarization unit is arranged in an optical path between the spatial light modulator and the fly's-eye lens.

7. The illumination optical system according to claim 1, wherein the polarization unit is arranged in the optical path such that the first optical element and the second optical element are partially overlapped with respect to a direction orthogonal to the optical axis, and
the spatial light modulator is driven such that a first light included in the illumination light is distributed to a first region in the off-axis region through both of the first and second optical elements, a second light included in the illumination light is distributed to a second region in the off-axis region through one of the first and second optical elements, the second light and the second region being different from the first light and the first region respectively.

8. The illumination optical system according to claim 7, wherein each of the first optical element and the second optical element is arranged at a conjugate position conjugate with the pupil plane or in the vicinity of the conjugate position.

9. The illumination optical system according to claim 8, wherein the first and second optical elements are arranged at positions different from each other with respect to a direction parallel to the optical axis.

10. The illumination optical system according to claim 9, wherein the first and second optical elements are arranged adjacent to each other.

11. The illumination optical system according to claim 7, wherein each of the first and second optical elements is arranged substantially conjugate with an arrangement plane on which a plurality of mirror elements of the spatial light modulator are arranged.

12. The illumination optical system according to claim 11, wherein the spatial light modulator is arranged such that the arrangement plane and the pupil plane have substantially optical Fourier transform relation.

13. The illumination optical system according to claim 7, wherein each of the first and second optical elements is made of an optical material having an optical activity, and is arranged such that optic axes of the first and second optical elements are substantially identical to the optical axis.

14. The illumination optical system according to claim 13, wherein the first and second optical elements have thicknesses, with respect to a direction parallel to the optical axis, different from each other.

15. The illumination optical system according to claim 7, wherein each of the first and second optical elements is a wave plate, and the first and second optical elements are arranged such that optic axes of the first and second optical elements are substantially orthogonal to the optical axis.

16. The illumination optical system according to claim 15, further comprising a uniformization element which is arranged on an incident side of the spatial light modulator and which realizes a substantially uniform intensity distribution of the illumination light on the spatial light modulator.

17. The illumination optical system according to claim 16, further comprising at least one mirror which is arranged between the fly's eye lens and the first and second optical elements of the polarization unit, wherein
at least a part of the illumination light distributed to the off-axis region includes a light which is imparted a polarization state different from the linear polarization having the polarizing direction in the circumferential direction by the at least one mirror, and
the polarization unit includes a phase modulation member which modulates a phase of at least a part of the illumination light such that the light on the pupil plane is a linearly polarized light of which polarization direction is the circumferential direction.

18. An exposure apparatus which exposes a substrate with an illumination light, the exposure apparatus comprising:
the illumination optical system as defined in claim 1 that illuminates a mask with the illumination light; and
a projection optical system which forms a pattern image of the mask onto the substrate,
wherein a pupil plane of the illumination optical system and a pupil plane of the projection optical system are arranged substantially conjugate with each other.

19. A device manufacture method comprising:
exposing a substrate by using the exposure apparatus as defined in claim 18; and
developing the exposed substrate.

20. The illumination optical system according to claim 1, wherein the first optical element is arranged on an incident side or an emission side of the second optical element, and the first optical rotation member is arranged adjacently on an incident side or an emission side of the second optical rotation member.

21. The illumination optical system according to claim 1, wherein the polarization unit is arranged relative to the spatial light modulator so that the illumination light is transmitted through the polarization unit only on a light source-side of the spatial light modulator or only on an illumination objective surface-side of the spatial light modulator.

* * * * *